United States Patent
Wang et al.

(10) Patent No.: US 11,574,929 B2
(45) Date of Patent: Feb. 7, 2023

(54) 3D FERROELECTRIC MEMORY

(71) Applicant: Taiwan Semiconductor Manufacturing Co., Ltd., Hsin-Chu (TW)

(72) Inventors: Sheng-Chen Wang, Hsinchu (TW); Feng-Cheng Yang, Hsinchu County (TW); Meng-Han Lin, Hsinchu (TW); Sai-Hooi Yeong, Zhubei (TW); Yu-Ming Lin, Hsinchu (TW); Han-Jong Chia, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/113,249

(22) Filed: Dec. 7, 2020

(65) Prior Publication Data

US 2021/0375932 A1    Dec. 2, 2021

Related U.S. Application Data

(60) Provisional application No. 63/031,019, filed on May 28, 2020.

(51) Int. Cl.
*H01L 27/11597* (2017.01)
*H01L 27/1159* (2017.01)
(Continued)

(52) U.S. Cl.
CPC .... *H01L 27/11597* (2013.01); *H01L 27/1159* (2013.01); *H01L 27/11578* (2013.01);
(Continued)

(58) Field of Classification Search
CPC ......... H01L 27/11578; H01L 27/11585; H01L 27/1159; H01L 27/11597; H01L 29/66787; H01L 29/6684; H01L 29/78648
See application file for complete search history.

(56) References Cited

U.S. PATENT DOCUMENTS 10,868,042 B1 * 12/2020 Zhang ............... H01L 27/11597
11,211,395 B2    12/2021 Lung
(Continued)

FOREIGN PATENT DOCUMENTS

| CN | 108401468 A | * | 8/2018 | ............ B82Y 10/00 |
| TW | 202029353 A | | 8/2020 | |
| WO | WO-2017091338 A1 | * | 6/2017 | ......... G11C 11/5628 |

OTHER PUBLICATIONS

U.S. Appl. No. 17/012,848, filed Sep. 4, 2020.

*Primary Examiner* — Matthew E Warren
(74) *Attorney, Agent, or Firm* — Eschweiler & Potashnik, LLC

(57) ABSTRACT

A 3D memory array has data storage structures provided at least in part by one or more vertical films that do not extend between vertically adjacent memory cells. The 3D memory array includes conductive strips and dielectric strips, alternately stacked over a substrate. The conductive strips may be laterally indented from the dielectric strips to form recesses. A data storage film may be disposed within these recesses. Any portion of the data storage film deposited outside the recesses may have been effectively removed, whereby the data storage film is essentially discontinuous from tier to tier within the 3D memory array. The data storage film within each tier may have upper and lower boundaries that are the same as those of a corresponding conductive strip. The data storage film may also be made discontinuous between horizontally adjacent memory cells.

20 Claims, 32 Drawing Sheets

(51) Int. Cl.
*H01L 27/11587* (2017.01)
*H01L 27/11578* (2017.01)
*H01L 29/66* (2006.01)
*H01L 29/786* (2006.01)

(52) U.S. Cl.
CPC .... *H01L 27/11587* (2013.01); *H01L 29/6684* (2013.01); *H01L 29/66787* (2013.01); *H01L 29/78648* (2013.01)

(56) References Cited

U.S. PATENT DOCUMENTS

| | | | |
|---|---|---|---|
| 2008/0265235 A1* | 10/2008 | Kamigaichi | H01L 27/249 |
| | | | 257/E47.001 |
| 2014/0264532 A1 | 9/2014 | Dennison et al. | |
| 2019/0058109 A1 | 2/2019 | Chen et al. | |
| 2019/0148393 A1 | 5/2019 | Lue | |
| 2020/0013799 A1* | 1/2020 | Hemer | H01L 21/0262 |
| 2020/0075631 A1 | 3/2020 | Dong et al. | |
| 2020/0343252 A1* | 10/2020 | Lai | H01L 27/11578 |
| 2021/0036019 A1* | 2/2021 | Sharangpani | H01L 27/11587 |
| 2021/0391355 A1 | 12/2021 | Lill et al. | |

\* cited by examiner

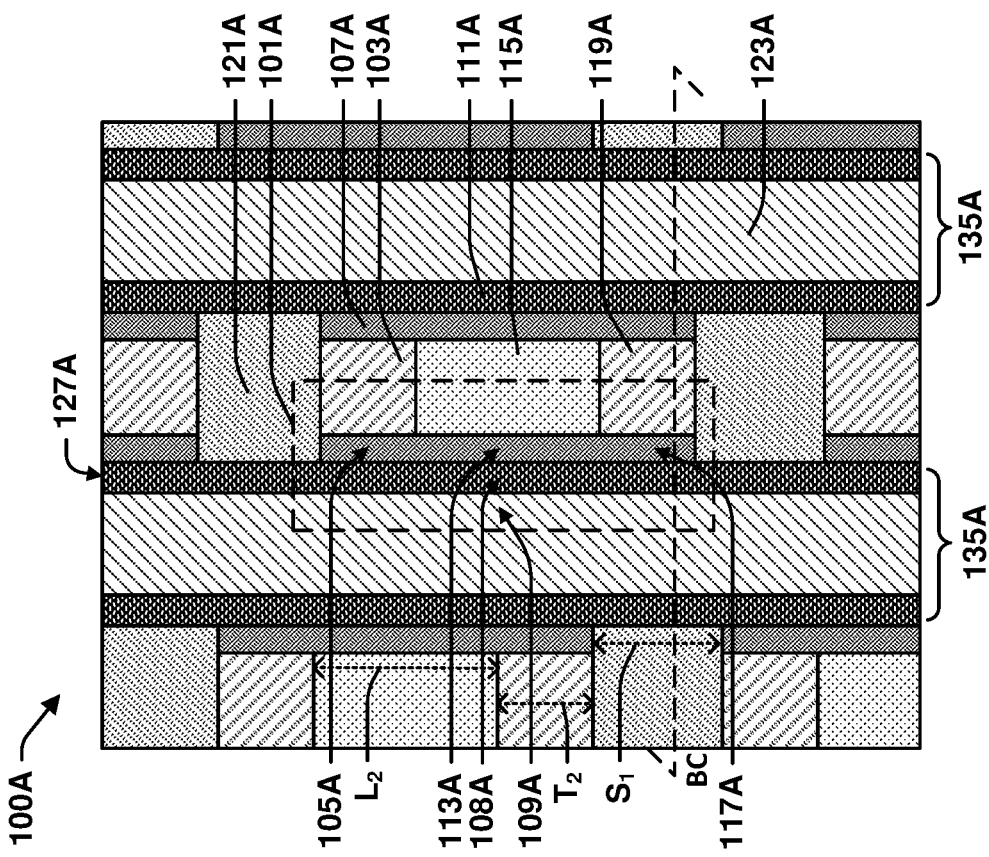
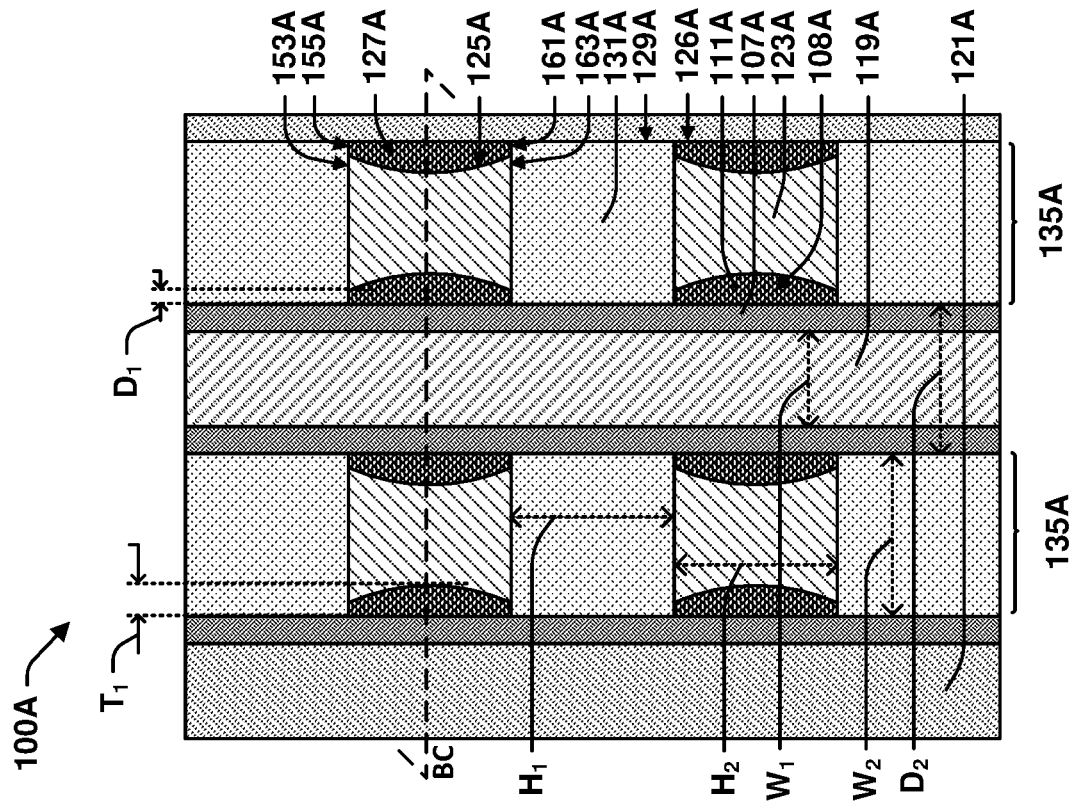
Fig. 1C
Fig. 1B

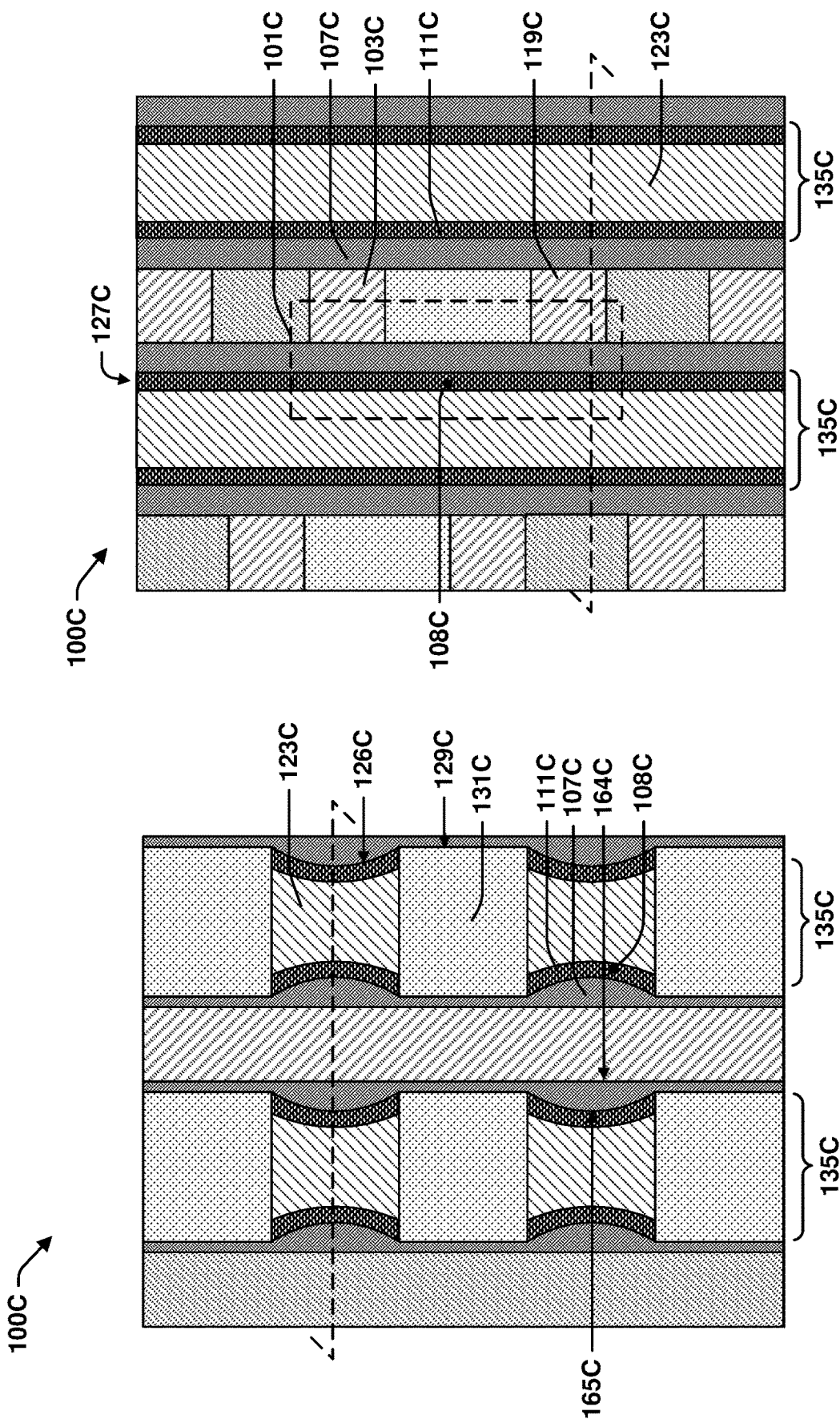

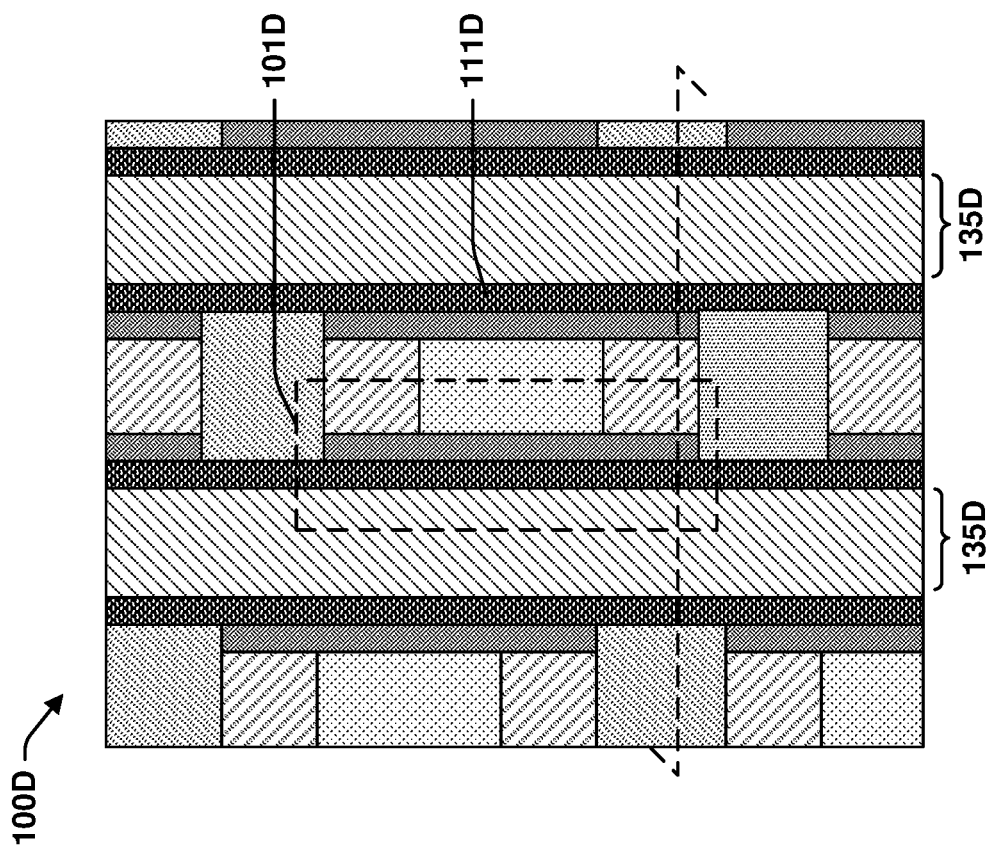
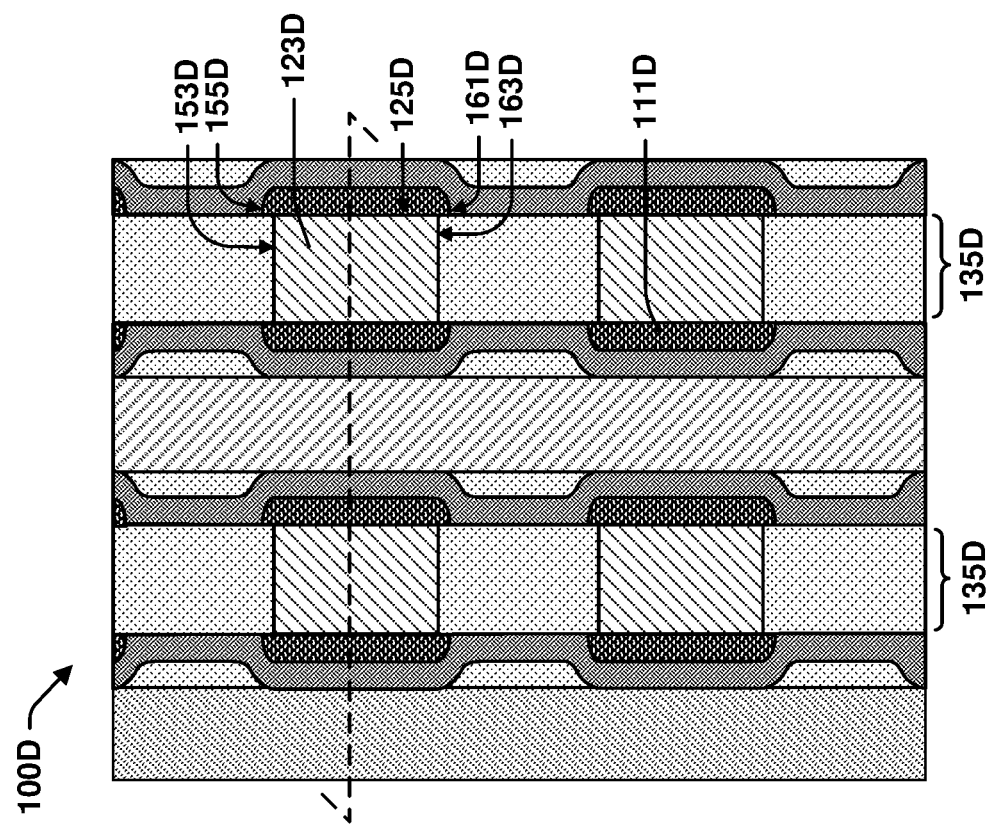
Fig. 7B
Fig. 7A

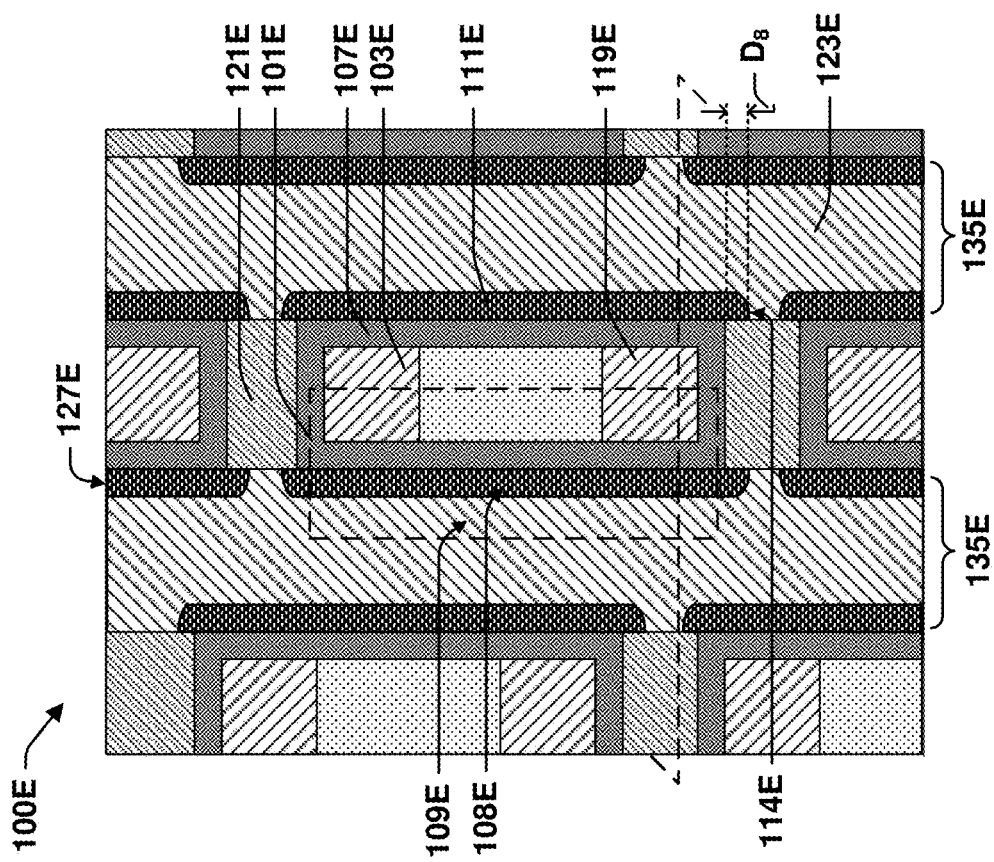
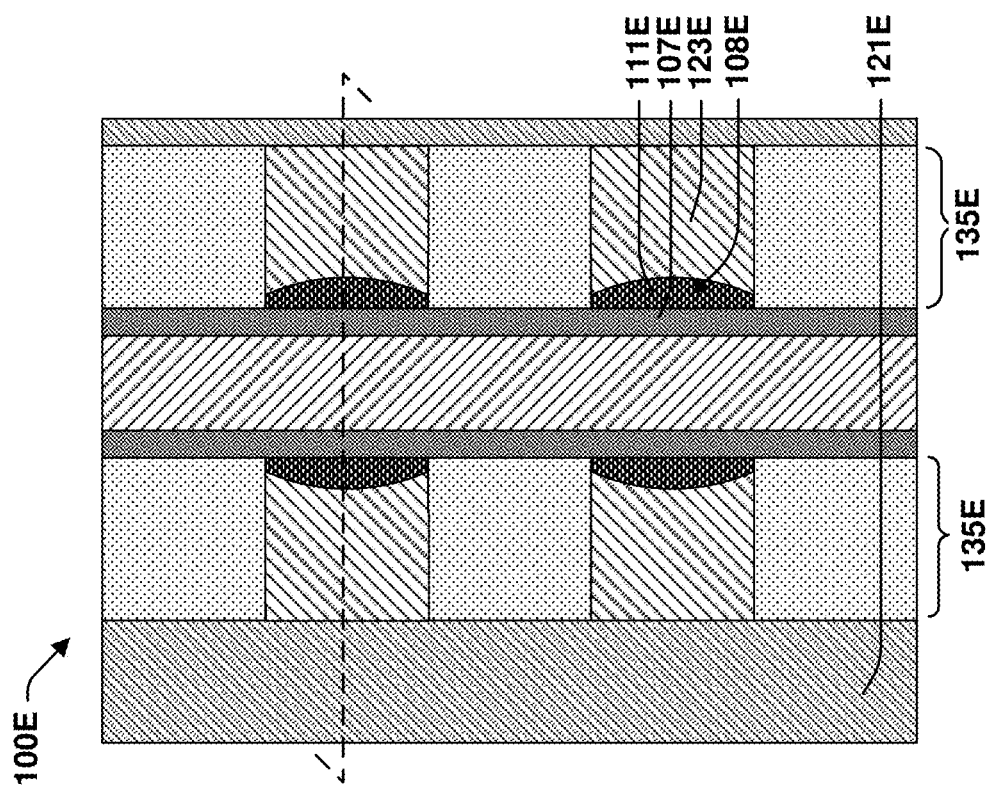
Fig. 8B
Fig. 8A

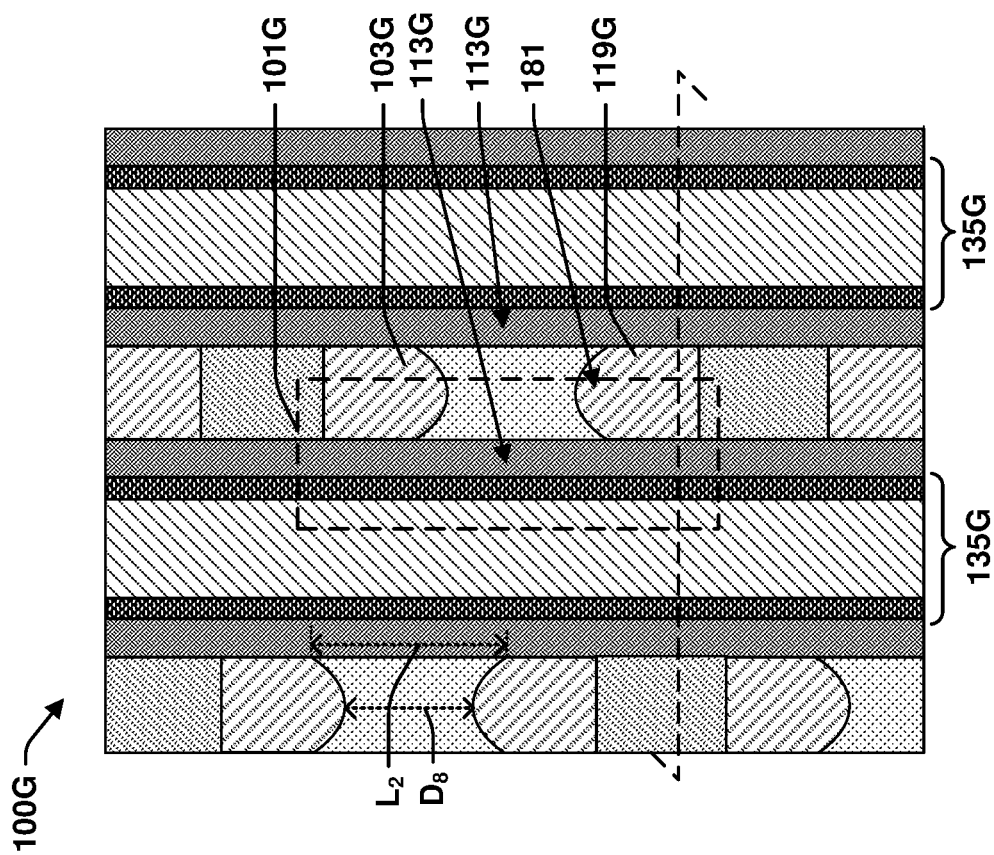
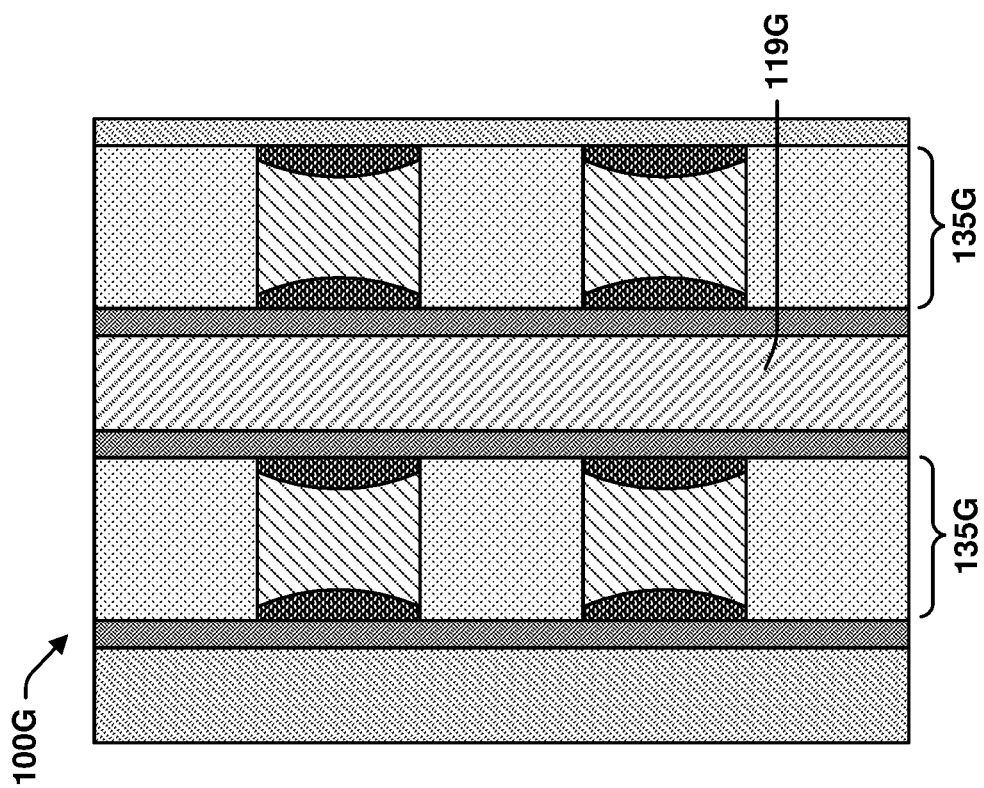

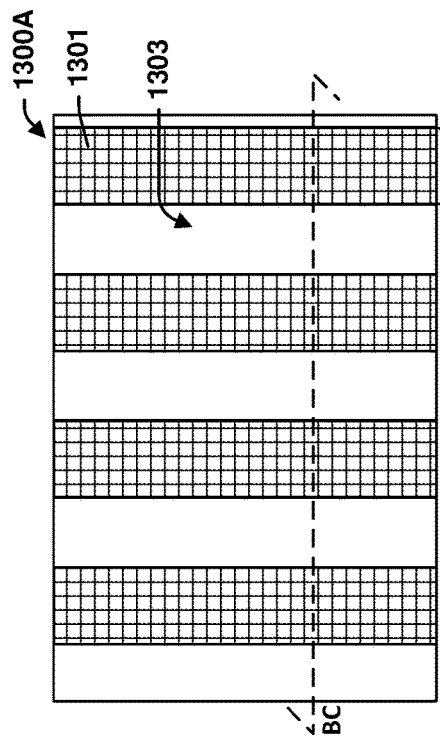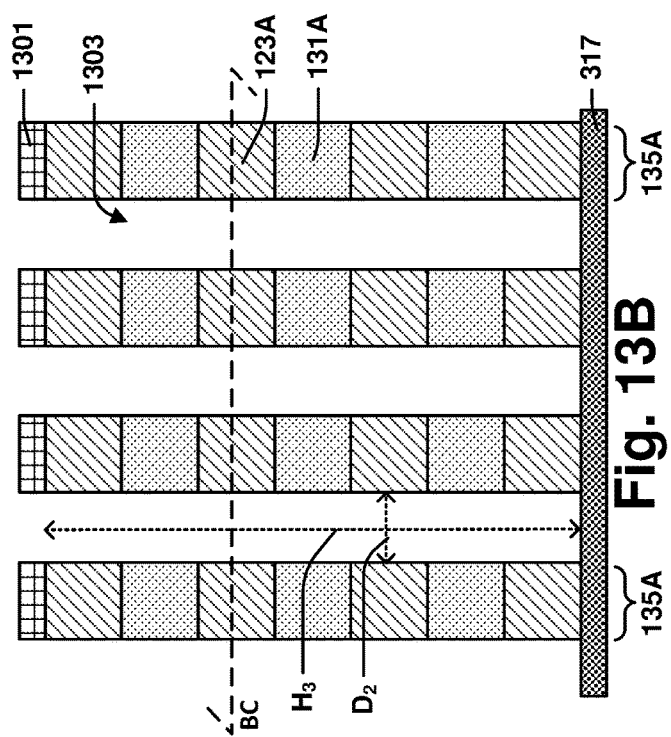

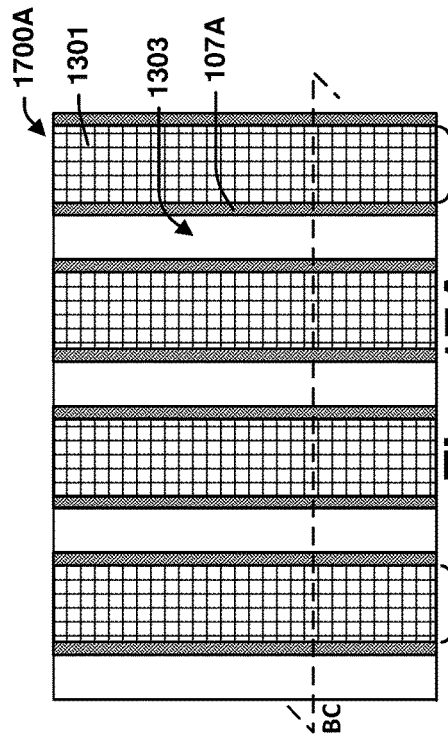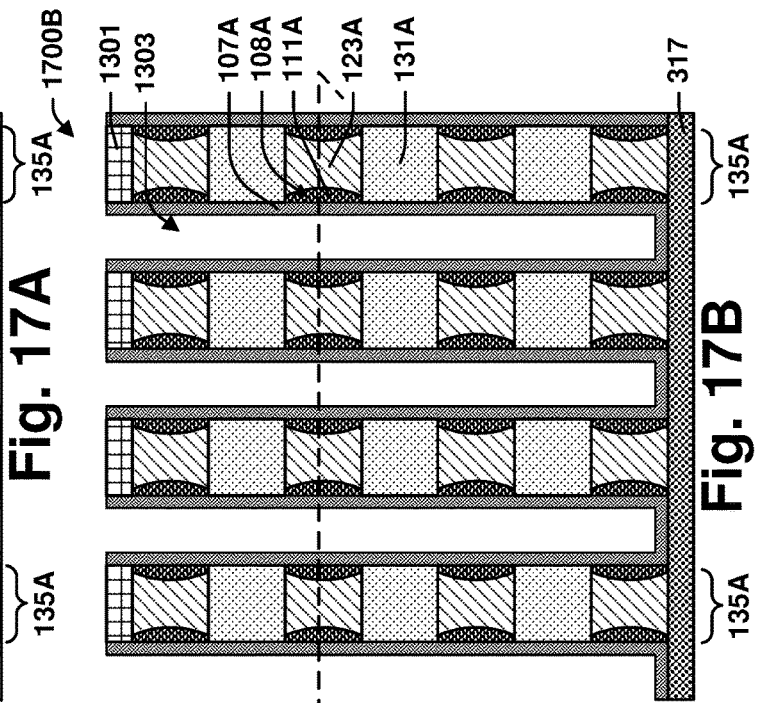
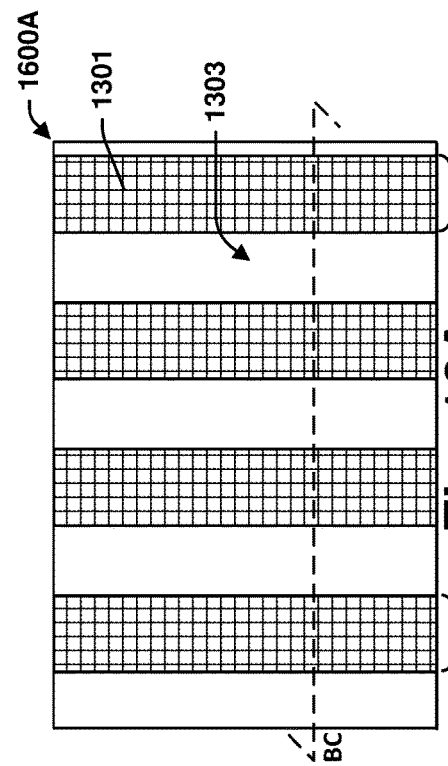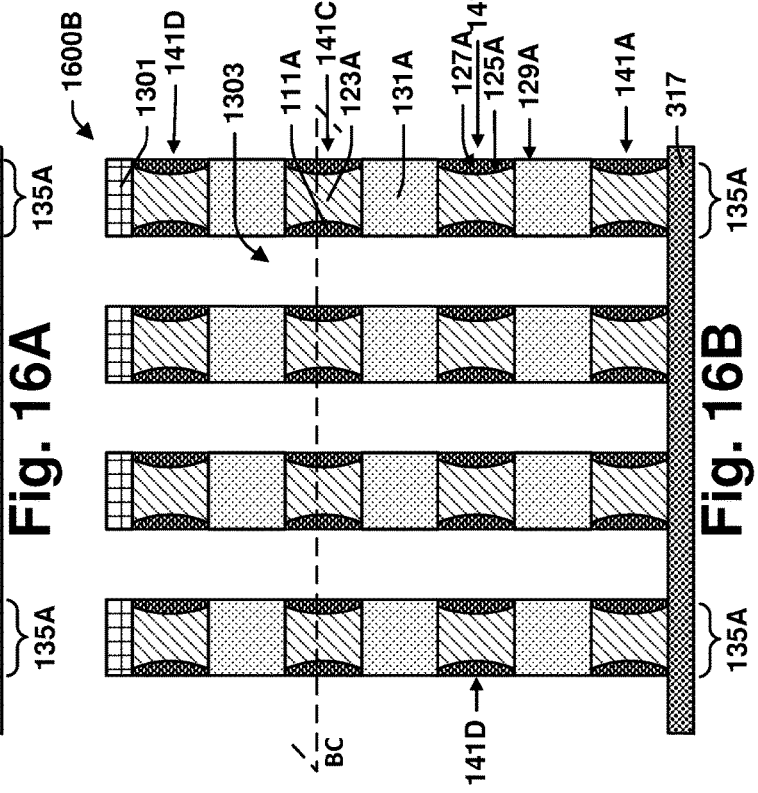

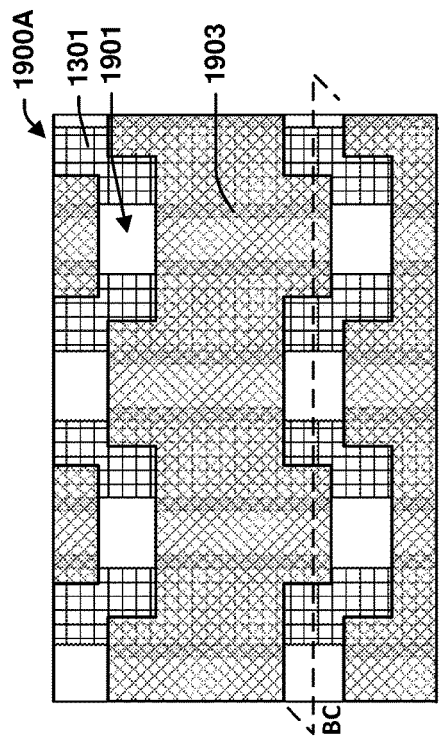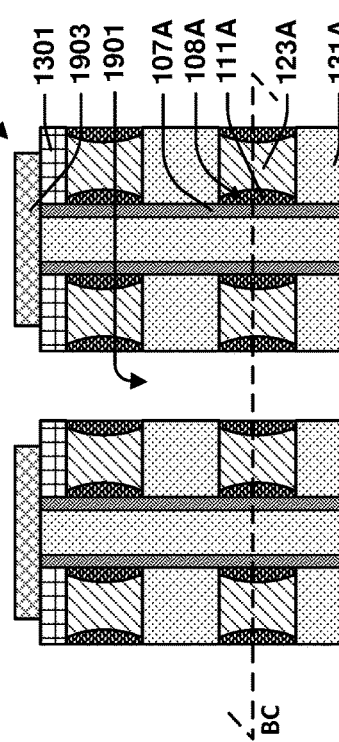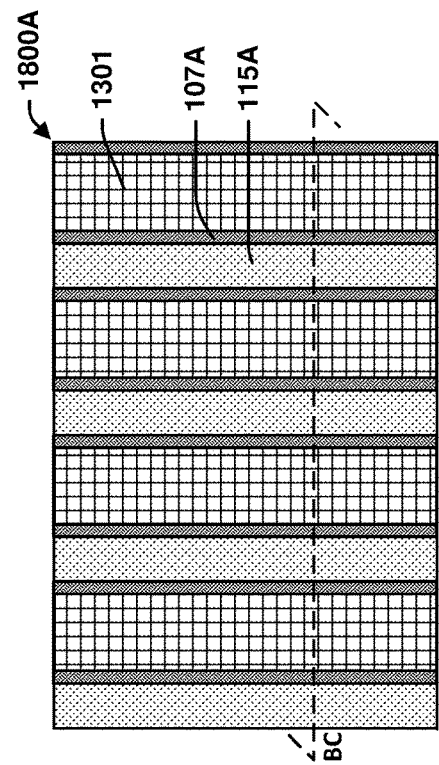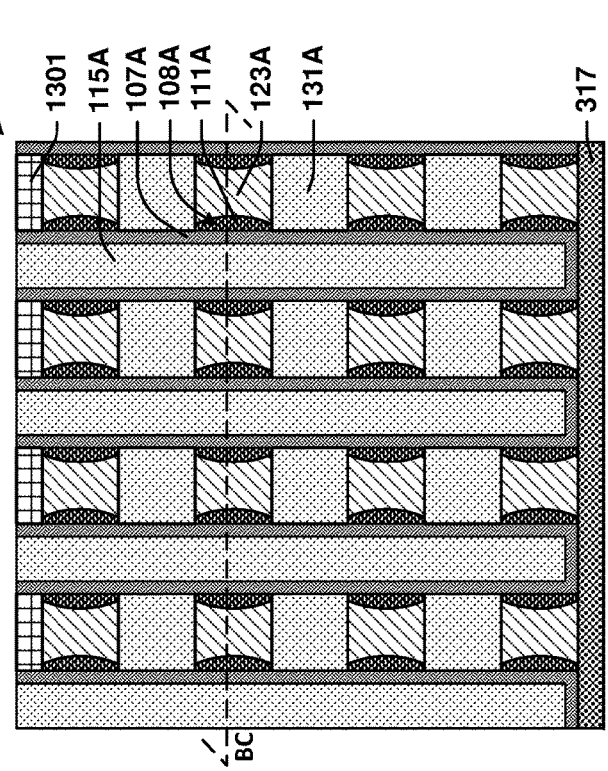

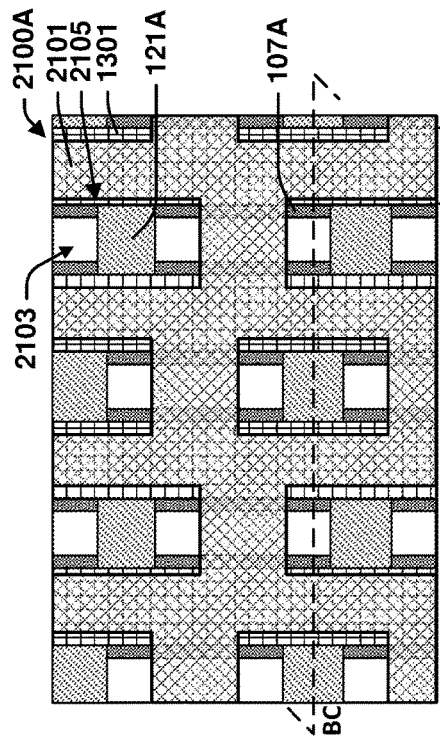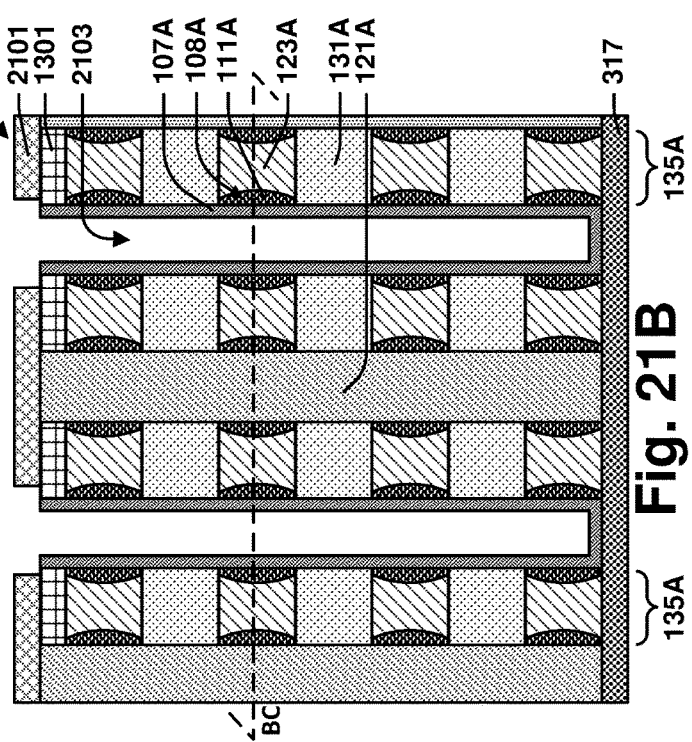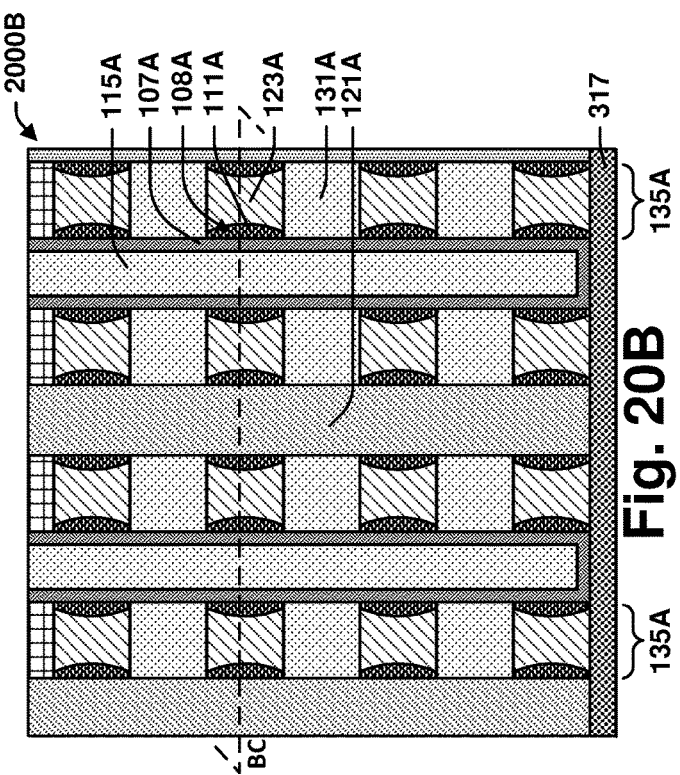

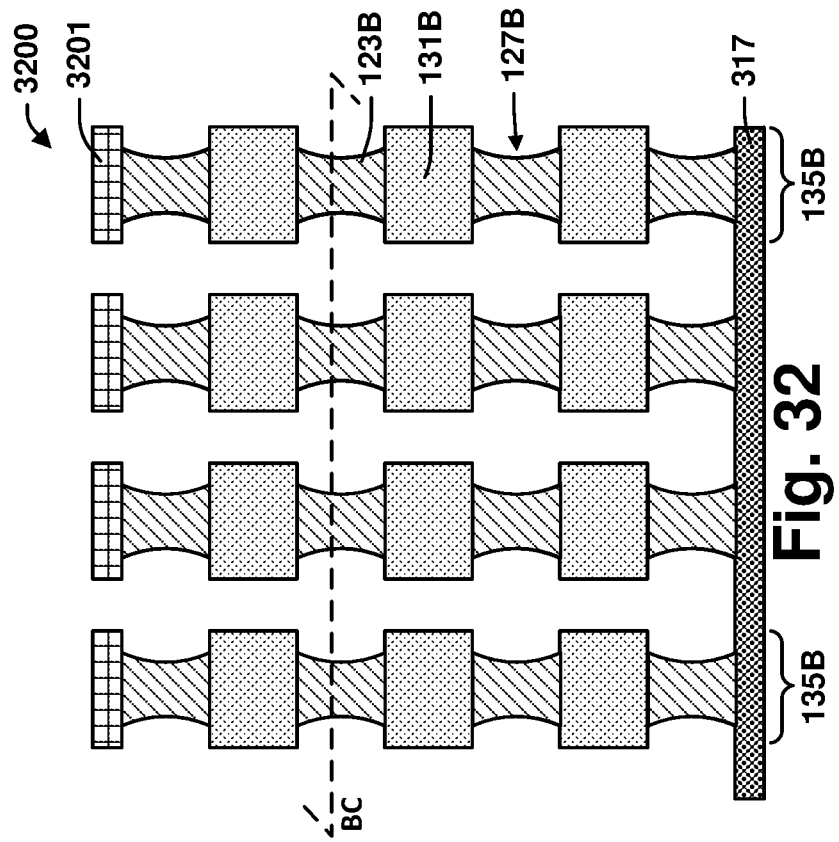
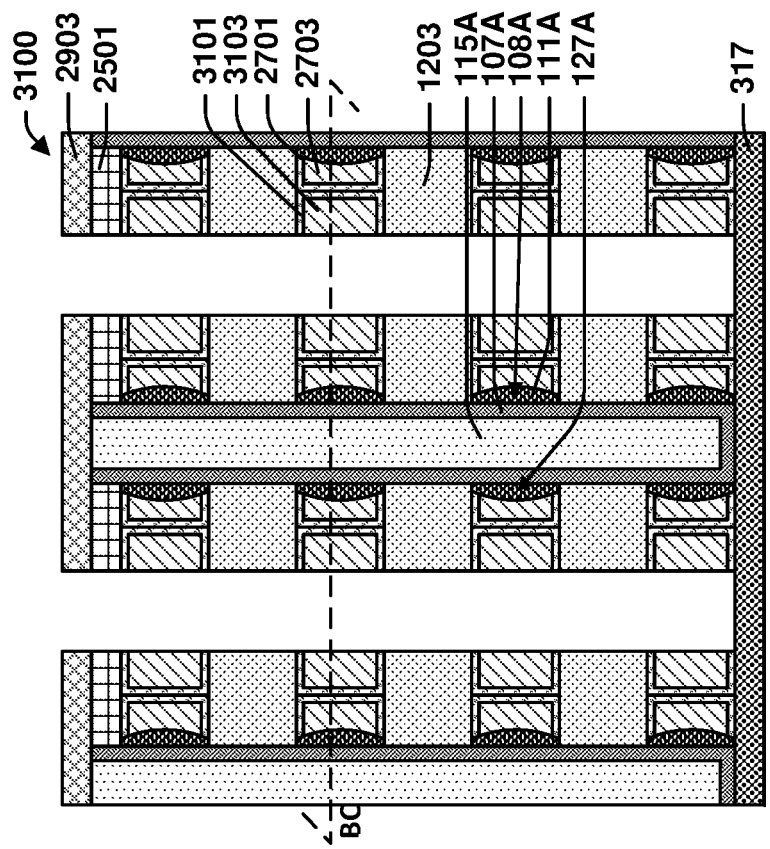

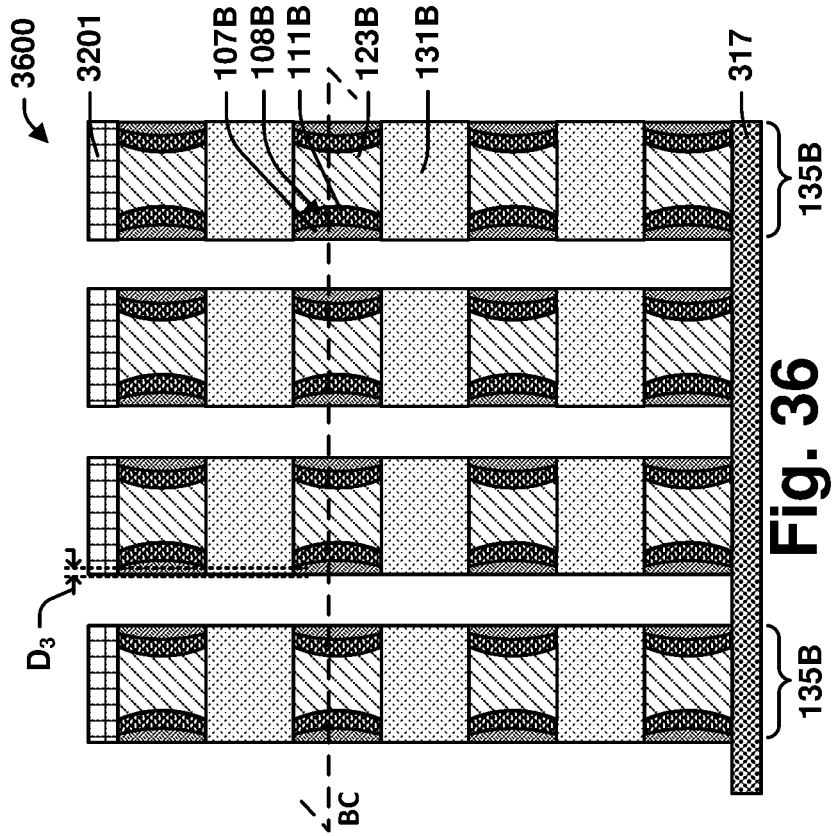
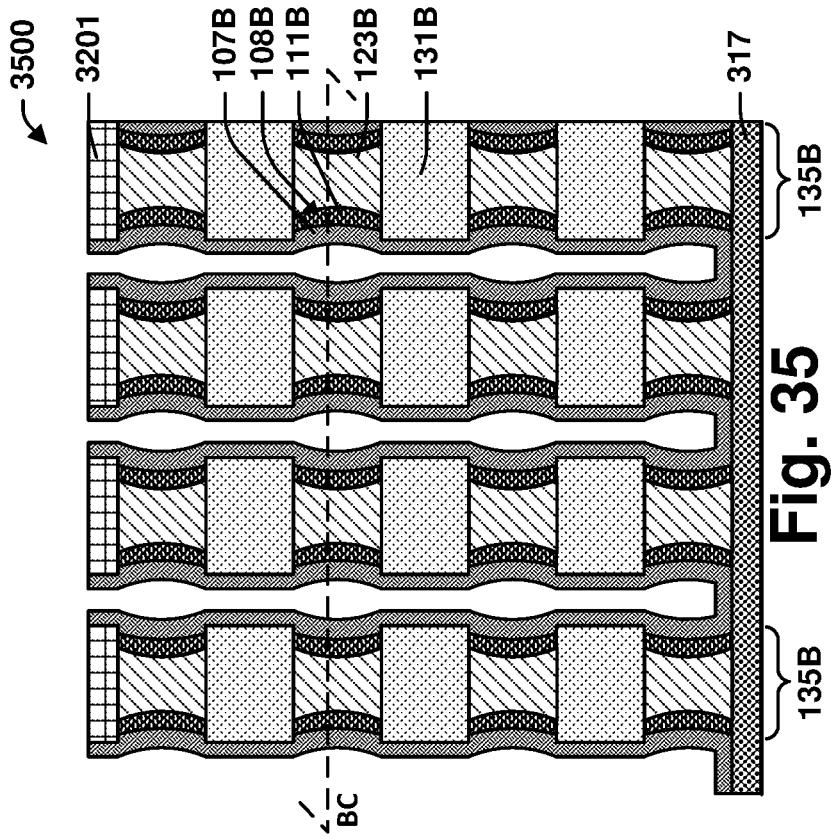

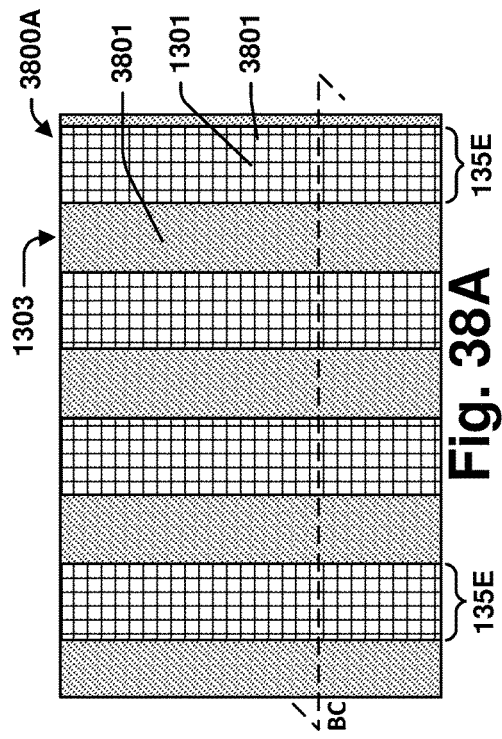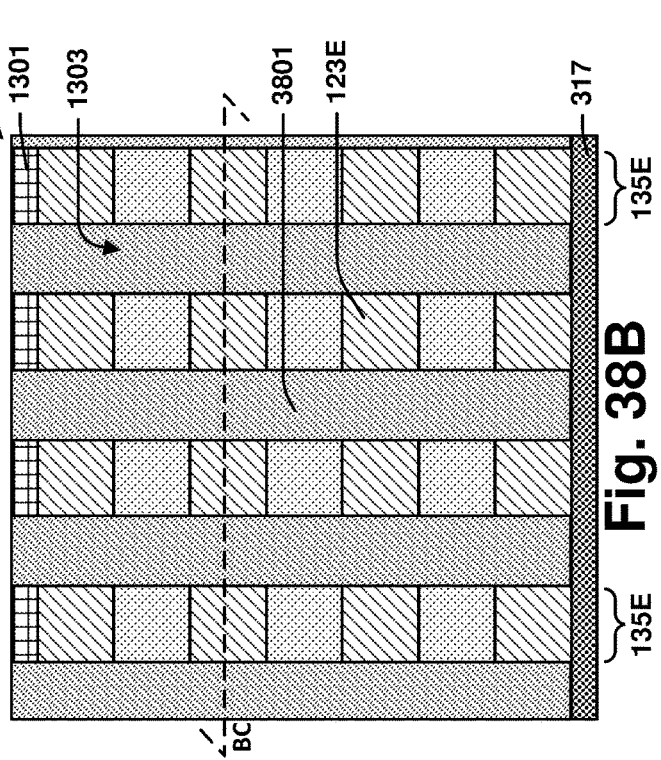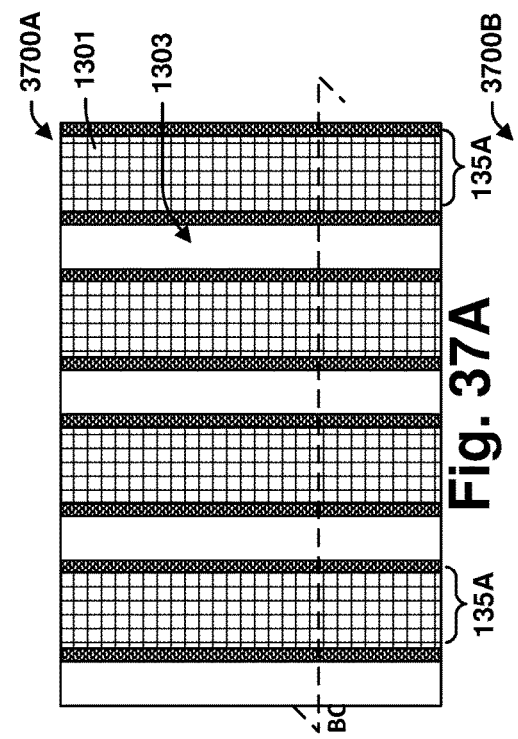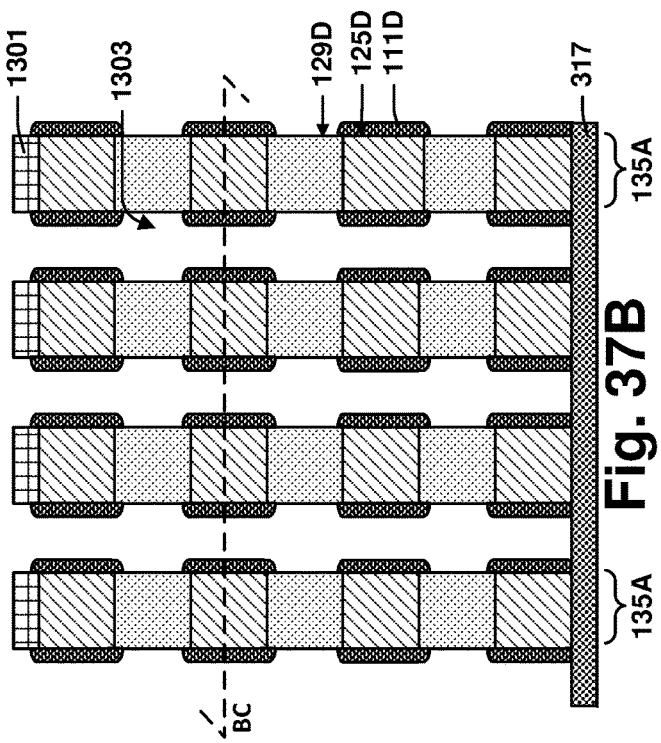

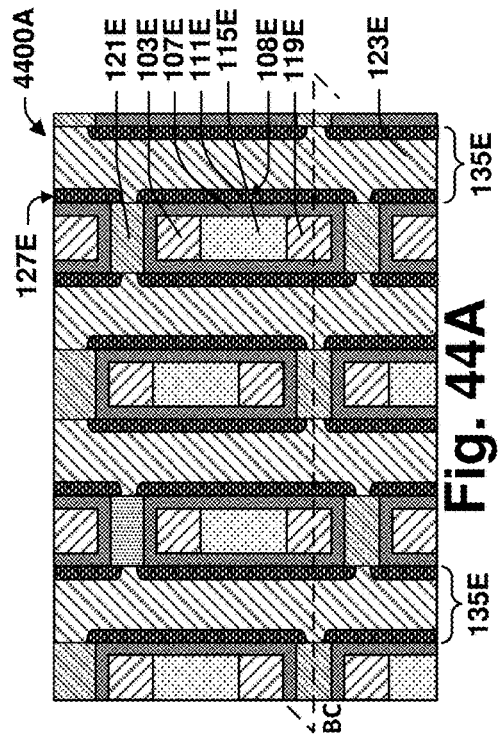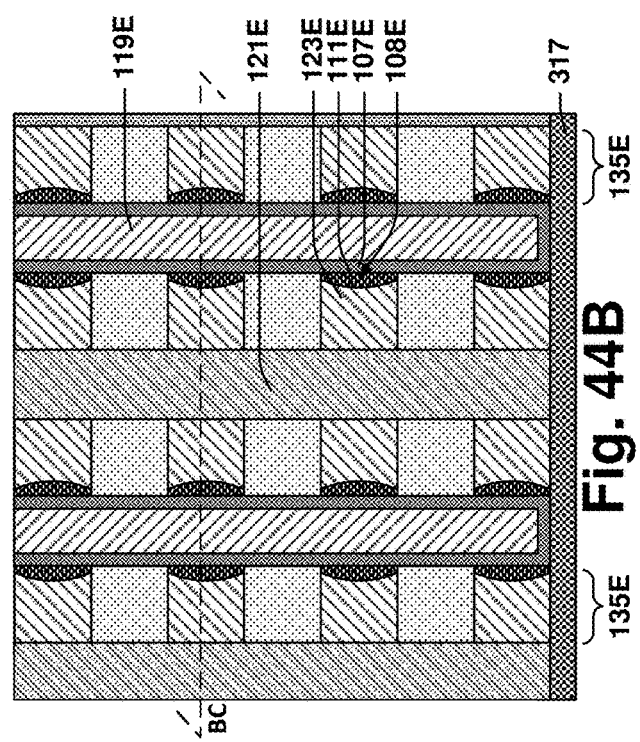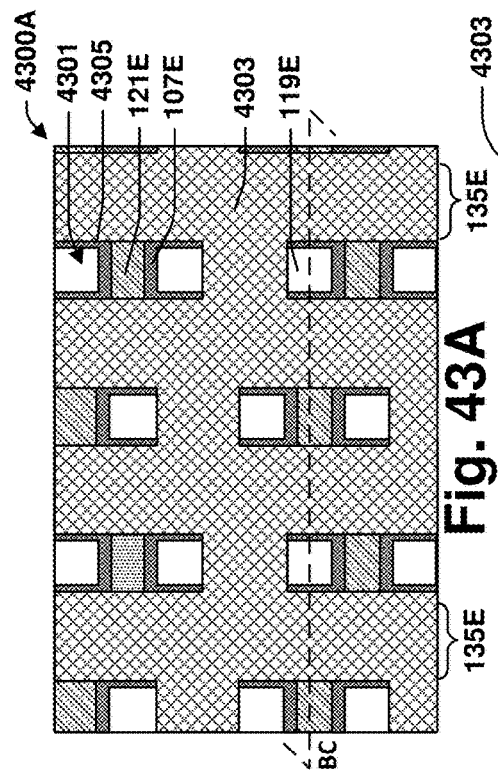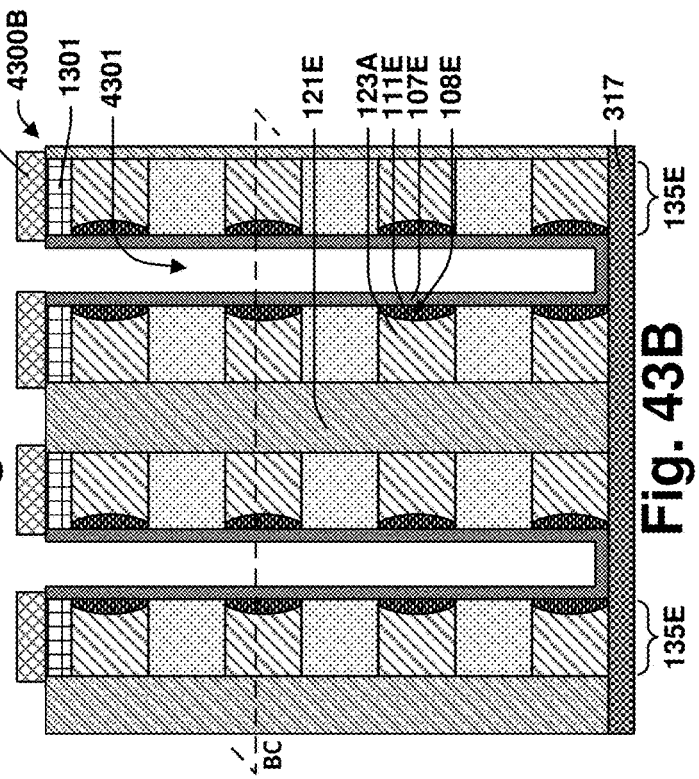

3D FERROELECTRIC MEMORY

REFERENCE TO RELATED APPLICATION

This application claims the benefit of U.S. Provisional Application No. 63/031,019, filed on May 28, 2020, the contents of which are incorporated herein by reference in their entirety.

BACKGROUND

Two-dimensional (2D) memory arrays are prevalent in electronic devices and may include, for example, NOR flash memory arrays, NAND flash memory arrays, dynamic random-access memory (DRAM) arrays, and so on. However, 2D memory arrays are reaching scaling limits and are hence reaching limits on memory density. Three-dimensional (3D) memory arrays are a promising candidate for increasing memory density and may include, for example, 3D NAND flash memory arrays, 3D NOR flash memory arrays, and so on.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1B illustrates a vertical cross-section of the 3D memory of FIG. 1A in the plane B.

FIG. 1C illustrates a horizontal cross-section of the 3D memory of FIG. 1A in the plane C.

FIGS. 6A-6B illustrate vertical and horizontal cross-sections of a third 3D memory array, which is a 3D memory array according to some other aspects of the present teachings.

FIGS. 7A-7B illustrate vertical and horizontal cross-sections of a fourth 3D memory array, which is a 3D memory array according to some other aspects of the present teachings.

FIGS. 8A-8B illustrate vertical and horizontal cross-sections of a fifth 3D memory array, which is a 3D memory array according to some other aspects of the present teachings.

FIGS. 10A-10B illustrate vertical and horizontal cross-sections of a seventh 3D memory array, which is a 3D memory array according to some other aspects of the present teachings.

FIGS. 12A and 12B through FIGS. 22A and 22B are a series of paired top view and cross-sectional view illustrations exemplifying a method according to the present teachings of forming a device comprising a 3D memory array with features of the first 3D memory array.

FIGS. 25 through 31 provide cross-sectional views illustrating an alternate method of forming dielectric strip/conductive strip stacks that have recesses according to some aspects of the present teachings.

FIGS. 32 through 36 provide a series of cross-sectional views illustrating a variation on the method of FIGS. 12A and 12B through FIGS. 22A and 22B, which variation may be used to form a memory array with features of the second or third 3D memory arrays.

FIGS. 37A-37B provide a top view illustration and a cross-sectional view illustration exemplifying a variation on the method of FIGS. 12A and 12B through FIGS. 22A and 22B, which variation may be used to form a memory array with features of the fourth or the sixth 3D memory array.

FIGS. 38A and 38B through FIGS. 44A and 44B provide paired top view and cross-sectional view illustrations exemplifying a variation on the method of FIGS. 12A and 12B through FIGS. 22A and 22B, which variation may be used to form a memory array with features of the fifth 3D memory array.

DETAILED DESCRIPTION

Figure 1A:
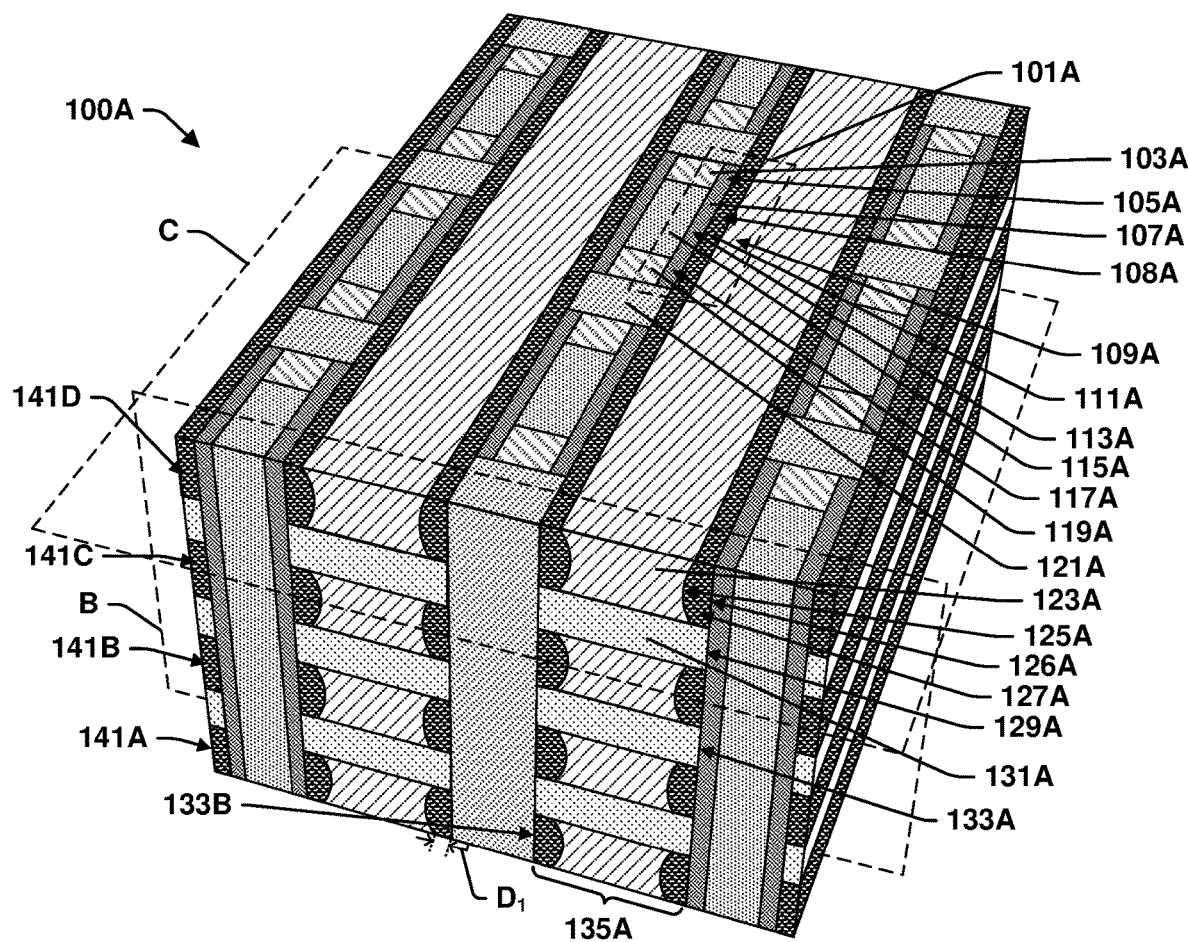
FIG. 1A illustrates a perspective view of a first 3D memory array, which is a 3D memory array according to some aspects of the present teachings.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In one type of three-dimensional (3D) memory array, vertical films provide data storage structures and channels. Vertical refers to an orientation of the film relative to a surface over which the 3D memory array is disposed. The surface may be that of a die cut from a semiconductor wafer. A thin film formed on the surface would be a horizontal film. A vertical film may be nearly perpendicular to a horizontal film. This orientation limits the options for patterning after deposition. Lithography may be applied to the film edge-wise, but that lithography provides one-dimensional patterning as opposed to two-dimensional patterning. One-dimensional patterning leaves the vertical data storage films continuous between vertically adjacent cells.

Because of this continuity, 3D memory having a structure that includes vertical data storage films has only been used for memory types in which the data storage films may be continuous across multiple cells in the array. One such memory type is ferroelectric memory. In ferroelectric memory, the data storage film contains electrical dipoles and a program or erase operation may be used to set an orientation of the electrical dipoles. The dipole orientation alters a gate voltage at which a corresponding channel becomes conductive. The dipoles in one area of the film may retain a first orientation to provide a first threshold voltage for a first memory cell while the dipoles in a second area of the film may retain a second orientation to provide a second threshold voltage for a second memory cell. The dipoles do not significantly diffuse across the film. Nevertheless, it has been found that for a 3D ferroelectric memory array the programming of one memory cell can disturb a threshold voltage for a vertically adjacent cell.

In accordance with the present teaching, the problem of the programming of one memory cell disturbing the programming state of a vertically adjacent memory cell in a 3D-memory array may be solved by eliminating all or part of a data storage film between the memory cells. Without wishing to be bound by theory, it is believed that dipoles in a ferroelectric film between the memory cells can be oriented by the fringe of an electric field used to program one or the other of the vertically adjacent memory cells. As the memory density increases, a concentration of oriented dipoles in the data storage film between the memory cells may become sufficient to noticeably affect a threshold voltage of one or the other memory cell. The issue of disturbance has not been observed for memory cells that are horizontally adjacent. Accordingly, in some of these teaching the data storage film of the 3D-memory array is continuous between horizontally adjacent memory cells. Structures for making the data storage film discontinuous between horizontally adjacent memory cells may introduce space into the array. Leaving the film continuous allows the memory density to be higher.

In one process of forming a 3D memory array, control gate layers and dielectric layers are alternately deposited to form a broad stack. Trenches are formed in the broad stack to form a row of narrow stacks, each stack including multiple tiers of conductive strips vertically separated by dielectric strips. One or more layers, including a data storage film, are deposited in the trenches between the narrow stacks to provide a data storage structure. A channel layer may be deposited over the data storage structure. The data storage film and the channel layer deposit on sides of the narrow stacks (sides of the trenches), whereby the data storage film and the channel layer are vertical. Vertically oriented conductive lines may be formed within the trenches adjacent the channel layer. In the resulting memory array, memory cells are arrayed vertically and horizontally on the sides of each of the narrow stacks.

Some aspects of the present teachings relate to a 3D memory array that may have data storage structures provided at least in part by one or more vertical films that do not extend between vertically adjacent memory cells. The memory array includes conductive strips and dielectric strips, alternately stacked over a substrate. The conductive strips are laterally indented from the dielectric strips. In other words, the conductive strips are recessed within the stacks relative to the dielectric strips to defined indent areas (also called recesses). A data storage film may be disposed within the indent areas. Any portion of the data storage film deposited outside the indent areas may have been effectively removed, whereby the data storage film is essentially discontinuous from tier to tier within the 3D memory array. The data storage film within each tier may have upper and lower boundaries that are in alignment with those of a conductive strip in that tier. The data storage film within each tier may have a lateral boundary in alignment with lateral boundaries of the dielectric strips above and below the data storage film.

In some embodiments, the data storage film is contained within the indent areas. In some embodiments, the data storage film fills out the indent areas. In some embodiments, the data storage structure and the channel layer together fill out the indent areas. In some embodiments, the channel layer is discontinuous from tier-to-tier. In some embodiments, the channel layer and the data storage film are both contained within the indent areas. In some embodiments, the channel layer is partially within the indent areas, partially outside the indent areas, and extends vertically through multiple cells of the 3-D memory array.

Some aspects of the present teachings relate to a method of forming a memory device. The method begins by depositing gate layers and dielectric layers to form a primary stack. The gate layers may be a gate electrode material or a dummy material. Trenches are formed in the primary stack to form a row of narrow stacks each comprising alternating conductive strips and dielectric strips. The conductive strips are then indented relative to the dielectric strips by a selective etch process. Indenting the conductive strips creates recesses in the narrow stacks. If the conductive strips are initially formed with a dummy material, the dummy material may be replaced with a gate electrode material before the selective etch process. A data storage film is deposited so that a first portion of the data storage film deposits within the recesses. In some embodiments, the data storage film is deposited by atomic layer deposition (ALD). A second portion of the data storage film may deposit outside the recesses including on the dielectric strips between the conductive strips. In some embodiments, the second portion of the data storage film is removed by an anisotropic etch process such as plasma etching. The etching may leave only the first portion of the data storage film, which is that portion that is within the recesses. In some embodiments, an isotropic etch process is used to leave the data storage film indented within the recesses.

The method may continue with deposition of any additional layers that complete the formation of a data storage structure and then a channel layer. In some embodiments, the recesses are filled by the data storage structure. In some embodiments, a portion of the channel layer deposits in the recesses. In some embodiments, a second channel layer is deposited after the first channel layer. The second channel layer may combine with the first channel layer to provide a desired channel thickness. Before depositing the second channel layer, the anisotropic etch process or a second anisotropic etch process may be carried out to remove a portion of the first channel layer that is outside the recesses. This approach may leave the channel layer with a substantially planar surface.

In some embodiments, plugs of intercell dielectric are formed periodically along the lengths of the trenches prior to forming the recesses. The plugs horizontally separate desired memory cell locations. The dielectric may be deposited to fill the trenches, the dielectric outside the trenches may be removed by a planarization process such as CMP, a mask may be formed, and the dielectric etched patterned to define the dielectric plugs. These plugs may interrupt the recesses, make the recesses horizontally divided and preventing the data storage film from extending between horizontally adjacent cells. The method may be used to provide data storage films that are discontinuous from cell to cell throughout a 3D memory cell array. Making the data storage structures discontinuous from cell-to-cell throughout the 3D memory array increases the variety of data storage structures that may be employed. The cell-to-cell isolation allows the data storage film to be, for example, a conductive floating gate or the like.

Alternatively, the dielectric plugs may be formed after the recesses are formed, after the data storage film is deposited, or after the channel layer is deposited. In all of these cases the trenches are eventually filled with an intracell dielectric. Openings may be etched in the intracell dielectric and filled with conductive material to form vertical conductive lines such as source lines and bit lines for the memory cells in the 3D array.

Some aspects of the present teachings relate to a memory device having a 3D array of memory cells disposed between two adjacent metal interconnect layers. The metal interconnect layers are vertically distributed in a metal interconnect structure that may be disposed over a semiconductor substrate. Each of the memory cells has a source side, a drain side, a channel extending between the source side and the drain side, a control gate, and a data storage structure between the control gate and the channel. An array of stacks within the 3D array each include multiple tiers of conductive strips separated by dielectric strips. The conductive strips extend in a horizontal direction to connect a plurality of the control gates. Bit lines extend vertically through the 3D array, each of the bit lines coupling with a plurality of the drain sides. Source lines also extend vertically through the 3D array, each of the source lines coupling with a plurality of the source sides.

The memory cells in the 3D array are distributed in a pattern that vertical repeats, whereby the 3D array includes vertically adjacent memory cells. The data storage structures of the vertically adjacent memory cells are discontinuous. In some embodiments, the data storage structures have been made discontinuous by forming the data storage structures in recesses in the sides of the stacks. The recesses are formed over the conductive strips. In some embodiments, the data storage structures are grown selectively on the sides of the conductive strips or are otherwise made vertically discontinuous. In some embodiments, the data storage structures in the 3-D array are continuous between cells that are horizontally adjacent. In some other embodiments, the data storage structures in the 3-D array are discontinuous along the horizontal direction as well as any other direction. Dielectric plugs may fill spaces that are periodically distributed in trenches between the stacks.

FIG. 1A illustrates a perspective view of a first 3D memory array 100A of memory cells 101A according to some aspects of the present teachings. FIG. 1B illustrates a cross-section of the first 3D memory array 100A along a plane B of FIG. 1A. FIG. 1C illustrates a cross-section along a plane C of FIG. 1A. The line BC in FIGS. 1B and 1C is at the intersection of plane B and plane C. The plane B is vertical. The plane C is horizontal.

A row of stacks 135A is disposed within the first 3D memory array 100A. Each of the stacks 135A has conductive strips 123A in a plurality of tiers 141A-D separated by dielectric strips 131A. This example shows four tiers 141A-D, but the stacks 135A may have a greater or lesser number of tiers. The dielectric strips 131A have dielectric sidewalls 129A. The conductive strips 123A have gate sidewalls 125A that are indented relative to the dielectric sidewalls 129A to create recesses 127A in the stacks 135A. The recesses 127A, also called indent areas, are regions adjacent to the conductive strips 123A and inward from the dielectric sidewalls 129A in a cross section extending along a vertical direction, which is a stacking direction of the stacks 135A. The gate sidewalls 125A are concave and indented relative to the dielectric sidewalls 129A by a distance $D_1$. Source/drain structures, which include source lines 103A and bit lines 119A, are oriented vertically and disposed between the stacks 135A.

Data storage films 111A are disposed within and fill out the recesses 127A. The data storage films 111A have an upper boundary 155A in alignment with an upper boundary 153A of an adjacent conductive strip 123A. The alignment is a vertical alignment that results from the upper boundary 155A and the upper boundary 153A being horizontal and at the same height. Likewise, the data storage films 111A have a lower boundary 161A in alignment with a lower boundary 163A of the adjacent conductive strip 123A. Within the tiers 141A-141C, the upper boundary 153A and the upper boundary 155A abut an overlying dielectric strip 131A. Within the tiers 141B-141D, the lower boundary 161A and the lower boundary 163A abut an underlying dielectric strip 131A. Sidewalls 126A of the data storage films 111A are in alignment with dielectric sidewalls 129A of vertically adjacent dielectric strips 131A. The sidewalls 126A and the sidewalls 129A may both be substantially vertical and the alignment may be a horizontal alignment.

The memory cells 101A may be formed on each of two opposite sides 133A-B of a stack 135A including a first side 133A and a second side 133B. The memory cells 101A are arrayed horizontally and vertically on the first side 133A and on the second side 133B. The horizontal positioning of the memory cells 101A may vary from side-to-side to provide staggering between memory cells 101A on the first side 133A and memory cells 101A on the second side 133B, but the arrangement of the memory cells 101A is repeated from tier to tier.

Each of the memory cells 101A includes a control gate 109A, a data storage structure 108A, a channel 113A, a source side 105A, and a drain side 117A. The control gates 109A are provided by the conductive strips 123A. A single conductive strip 123A may provide control gates 109A for a plurality of memory cells 101A including memory cells 101A that are horizontally adjacent along a length of a conductive strip 123A and memory cells 101A that are on opposite sides 133A and 133B of the conductive strip 123A. The channel 113A, the source side 105A, and the drain side 117A are all provided by a channel layer 107A. The source side 105A is a portion of the channel layer 107A adjacent a source line 103A. The drain side 117A is a portion of the channel layer 107A adjacent a bit line 119A. The channel 113A is a portion of the channel layer 107A between the source side 105A and the drain side 117A.

The channel layer 107A extends vertically through the tiers 141A-141D to provide channels 113A, source sides 105A, and drain sides 117A for multiple memory cells 101A. In some embodiments, the channel layer 107A is continuous across a length and a height of a stack 135A. Portions of the channel layer 107A may provide the channels 113A, the source sides 105A, and the drain sides 117A for all the horizontally and vertically distributed memory cells 101A on either the first side 133A or the second side 133B of a stack 135A.

Figure 2:
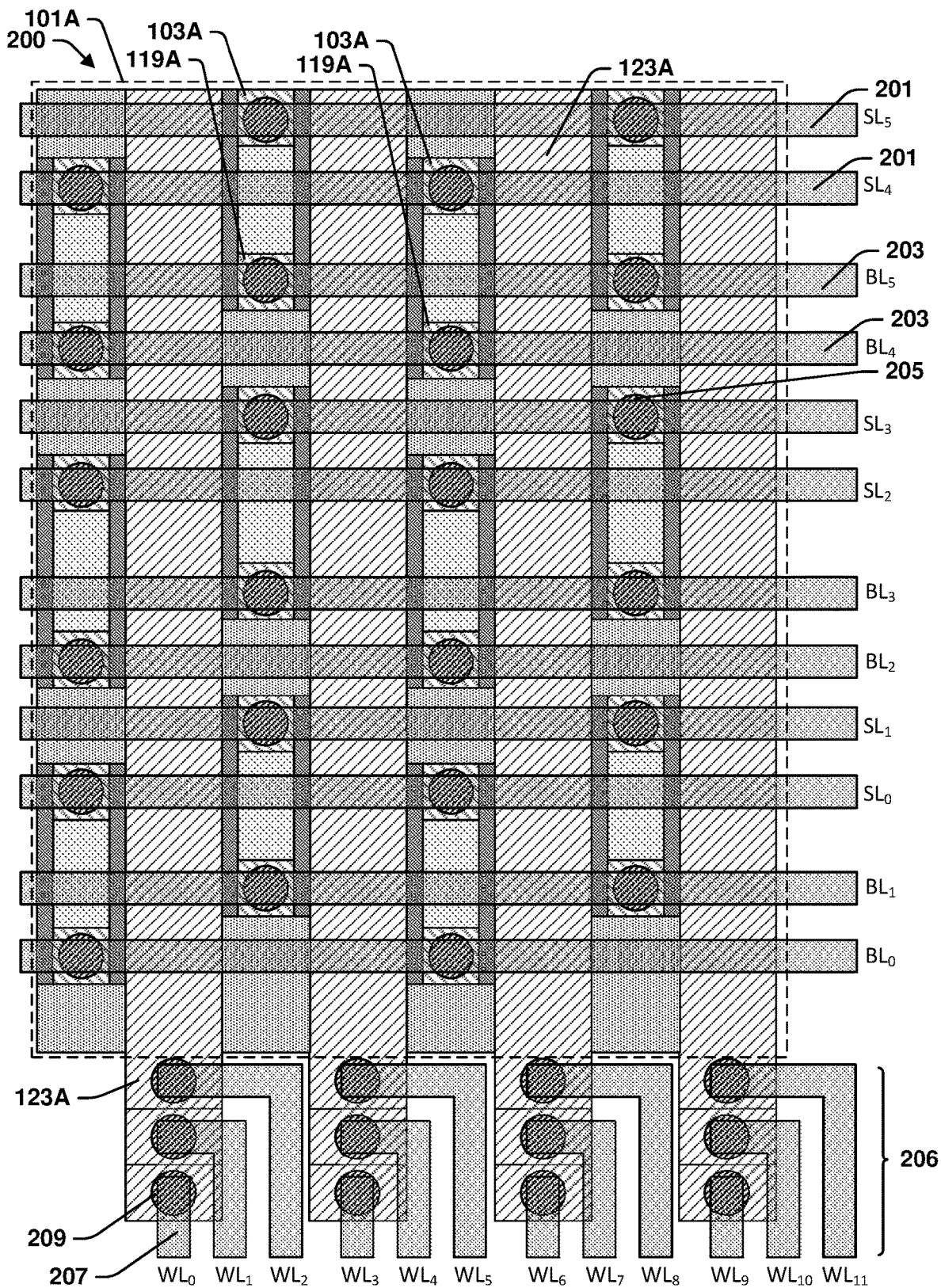
FIG. 2 is a top view illustrating an integrated circuit with the 3D memory array of FIG. 1A.
Figure 3:
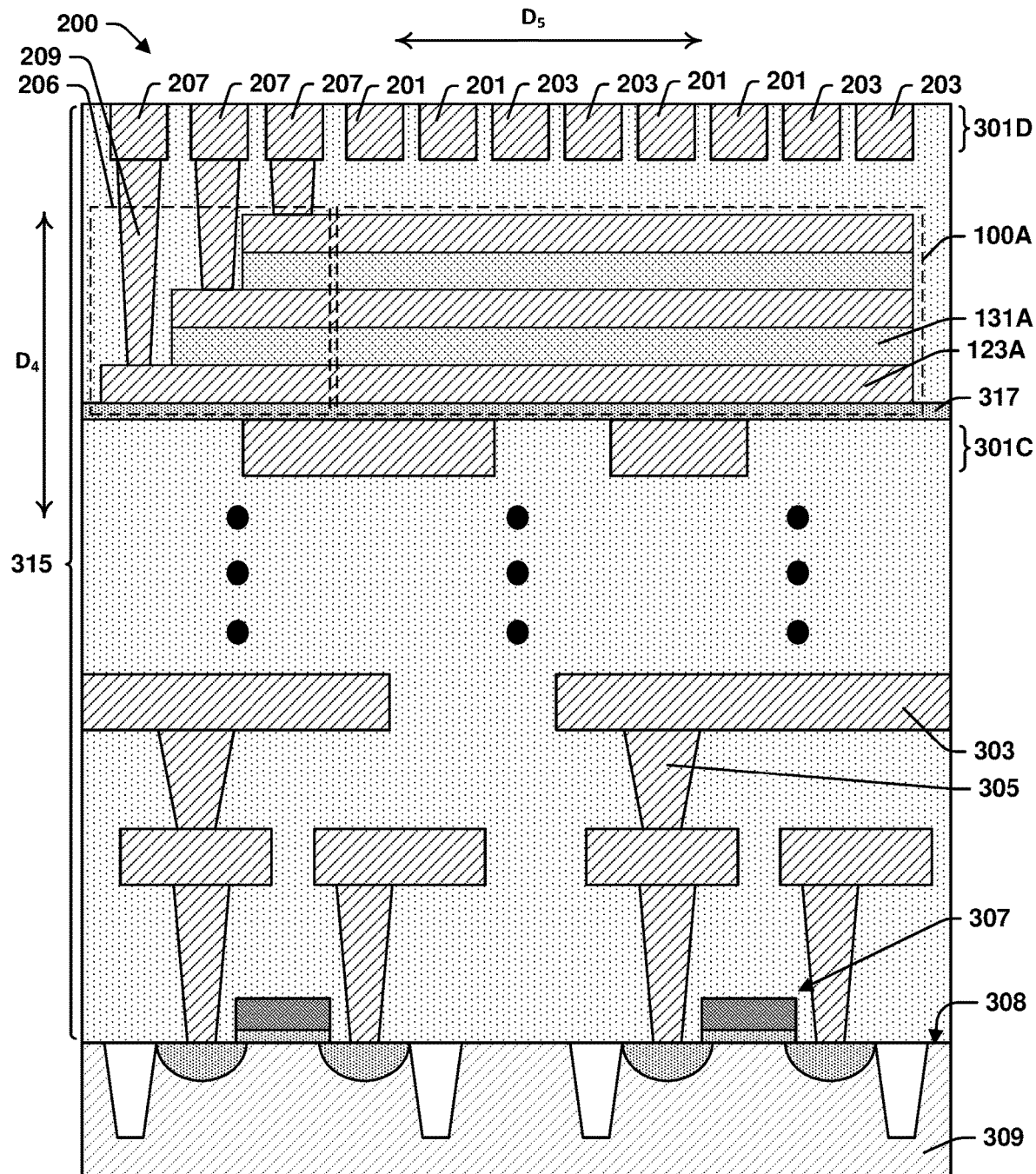
FIG. 3 illustrates a cross-section of an integrated circuit that include the 3D memory array of FIG. 1A.

FIG. 2 illustrates a top view of the first 3D memory array 100A in an integrated circuit 200. FIG. 3 illustrates a partial cross-sectional view of the integrated circuit 200. As shown in these figures, the conductive strips 123A may extend beyond one end of the first 3D memory array 100A to progressively varying lengths forming a staircase pattern 206 that allows each of the conductive strips 123A to be coupled to a distinct word line wire 207 in an overlying metal interconnect layer 301D through vias 209. Source line wires 201 and bit line wires 203 may also be formed in the metal interconnect layer 301D. The source line wires 201 and the bit line wires 203 may extend crosswise with respect to the conductive strips 123A and the stacks 135A. Each of the source line wires 201 may be coupled to a plurality of the source lines 103A through vias 205. Each of the bit line wires 203 may be coupled to a plurality of the bit lines 119A.

Figure 4:
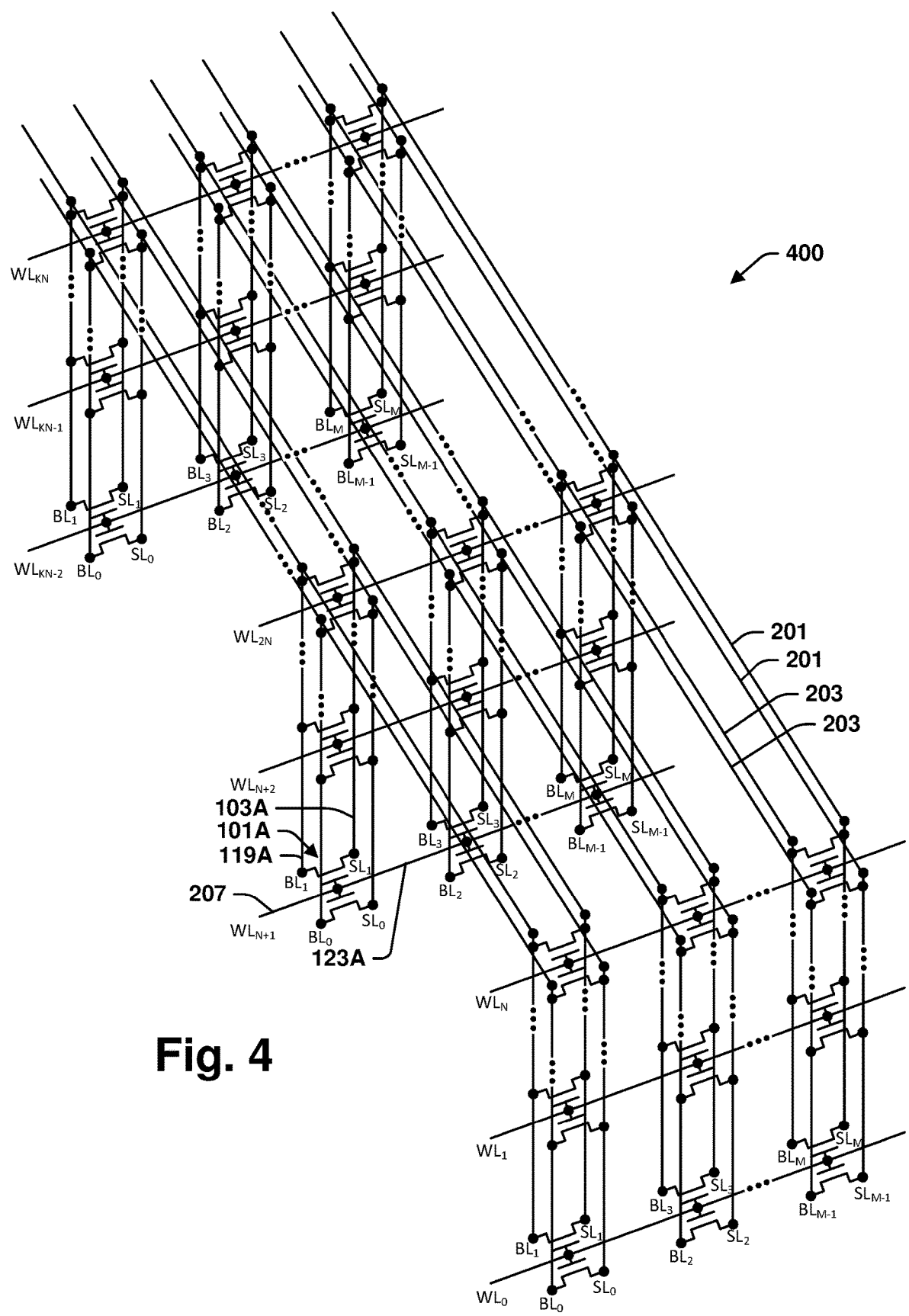
FIG. 4 provides an equivalent circuit diagram for the 3D memory array of FIG. 1A.

FIG. 4 provides an equivalent circuit diagram 400 for the first 3D memory array 100A. As illustrated by the equivalent circuit diagram 400, each of the memory cells 101A may operate as a transistor. There are M memory cells arranged along each of the conductive strips 123A. There are K stacks 135A each having N tiers 141A-141D giving a total of K*N conductive strips 123A. Each of the memory cells 101A may be individually addressed by selecting a corresponding word line wire 207, bit line wire 203, and source line wire 201. The numbers of conductive strips 123A connected to each word line wire 207, the number of source lines 103A connected to each source line wire 201, and the number of bit lines 119A connected to each bit line wire 203 may be varied while preserving this feature.

Transistors have a threshold gate voltage at which a source to drain connection switches from open to closed. In a memory cell, that threshold may be varied through write and erase operations to provide two or more distinct threshold voltages. For example, the data storage structure may include a data storage film 111A that retains a polarization of electrical dipoles. An orientation of these dipoles may be varied to modulate a threshold voltage on the control gate 109A at which an electric field renders the channel 113A conductive. A first orientation of those electrical dipoles provides a first threshold voltage that may represent a logical "1" and a second orientation provides a second threshold voltage that may represent a logical "0".

In the first 3D memory array 100A, a write operation for one of the memory cells 101A may include setting a corresponding word line wire 207 to a programming voltage $V_{th}$ while a corresponding bit line wire 203 and a corresponding source line wire 201 are coupled to ground. The bit line wires 203 and the source line wires 201 of non-selected cells may be left floating or set to a voltage such as ½ $V_{dd}$. $V_{th}$ may be the highest possible threshold voltage for the memory cells 101A. For an erase operation, the corresponding word line wire 207 may be set to $-V_{th}$ while grounding the corresponding bit line wire 203 and the corresponding source line wire 201 and holding the other bit line wires 203 and source line wires 201 at $-½ V_{dd}$. A read operation may include setting the word line wire 207 to a voltage intermediate between the first threshold voltage and the second threshold voltage, for example ½ $V_{th}$, setting the source line wire 201 to $V_{dd}$, setting the bit line wire 203 to ground, and determining whether a resulting current is above or below a threshold.

FIGS. 2-4 show one way in which the memory cells 101A in the first 3D memory array 100A may be coupled within an integrated circuit 200 to enable read, write, and erase operations. Any other suitable coupling may be used including alternate couplings that cause variations in the numbers of source lines 103A, bit lines 119A, and conductive strips 123A that are connected to each source line wire 201, bit line wire 203, and word line wire 207 respectively. FIGS. 2-3 show all the connections being made through vias 209 and vias 205 that connect to source line wires 201, bit line wires 203, and word line wires 207 disposed in the metal interconnect layer 301D above the first 3D memory array 100A, but some or all of these connections may be made to wires in a metal interconnect layer 301C below the first 3D memory array 100A. Using both the metal interconnect layer 301C and the metal interconnect layer 301D to make these connections may enable reductions in parasitic resistances and capacitances.

As shown in FIG. 3, the first 3D memory array 100A may be disposed between the metal interconnect layer 301C and the metal interconnect layer 301D within a metal interconnect structure 315 over a substrate 309. The metal interconnect layer 301C and the metal interconnect layer 301D may be the $3^{rd}$ and $4^{th}$ metal interconnect layers, the $4^{th}$ and $5^{th}$ metal interconnect layers, or any other adjacent pair of metal interconnect layers in the metal interconnect structure 315. The substrate 309 may be a semiconductor substrate and may support field effect transistors (FETs) 307 and other devices used to operate the first 3D memory array 100A. These devices may be connected to the first 3D memory array 100A through wires 303 and vias 305 within the metal interconnect structure 315.

The substrate 309 may be a die cut from a wafer, such as a silicon wafer or the like. The substrate 309 may be a semiconductor substrate, such as a bulk semiconductor, a semiconductor-on-insulator (SOI) substrate, or the like. Other substrates, such as a multilayered or gradient substrate may also be used. In some embodiments, the semiconductor material of the substrate 309 is or includes silicon, germanium, silicon carbide, gallium arsenide, gallium phosphide, indium phosphide, indium arsenide, and/or indium antimonide, silicon germanium, gallium arsenide phosphide, aluminum indium arsenide, aluminum gallium arsenide, gallium indium arsenide, gallium indium phosphide, gallium indium arsenide phosphide, combinations thereof, or the like. The substrate 309 may be or include a dielectric material. For example, the substrate 309 may be a dielectric substrate or may include a dielectric layer on a semiconductor substrate. The dielectric material may be an oxide such as silicon oxide, a nitride such as silicon nitride, a carbide such as silicon carbide, combinations thereof such as silicon oxynitride, silicon oxycarbide, silicon carbonitride, the like, or any other suitable dielectric.

With reference to FIG. 3, the substrate 309 has a major surface 308. A direction $D_4$ is perpendicular to the major surface 308. The direction $D_4$ is the one referred to herein as the vertical direction and is also as a stacking direction for the stacks 135A. A direction $D_5$ is perpendicular to the direction $D_4$, is parallel to the major surface 308, is a direction along which the conductive strips 123A extend, and is referred to herein as a horizontal direction.

In the examples of this disclosure, the memory cells are of a type that has the structure of a transistor, although the concepts of the present disclosure are useful for 3D memory arrays with any type of memory cell. In some embodiments, the memory cells 101A are ferroelectric memory cells and the data storage film 111A is or comprises a ferroelectric material that contains electrical dipoles and retains polarization of those dipoles. Examples of ferroelectric materials that may be suitable include hafnium zirconium oxide (HfZrO), hafnium aluminum oxide (HfAlO), hafnium lanthanum oxide (HfLaO), hafnium cerium oxide (HfCeO), hafnium oxide (HfO), hafnium silicon oxide (HfSiO), hafnium gadolinium oxide (HFGdO), or the like. In some embodiments, the ferroelectric material is a doped hafnium oxide. In some embodiments, the doped hafnium oxide is in the orthorhombic phase. In some embodiments, the dopant is present in an atomic percentage of 50% or less.

In some embodiments, a thickness $T_1$ of the data storage film 111A is in a range from about 5 nanometers to about 20 nanometers. In some embodiments, the thickness $T_1$ is from about 5 to about 10 nanometers. In some embodiments, the thickness $T_1$ is from about 10 to about 15 nanometers. If the data storage film 111A is a ferroelectric material and the thickness is too small (e.g., less than about 5 nanometer), polarization may not be well retained and reliability may be low. If the thickness is too large (e.g., greater than about 20 nanometers), program and erase voltages may be large and adversely affect power efficiency.

If the memory cells 101A are ferroelectric memory cells, the data storage structure 108A may include a data storage film 111A that is continuous across a plurality of the memory cells 101A. In a ferroelectric memory, the data storage film 111A may store information locally without being electrically isolated from the data storage films of adjacent cells. The data storage structure 108A may further include a gate dielectric layer (not shown) between the data storage film 111A and the channel 113A. The gate dielectric layer may be deposited as a separate layer or may be allowed to form spontaneously by a reaction such as a reaction between the data storage film 111A and the channel layer 107A. The gate dielectric layer may be of any suitable material. For example, the gate dielectric layer may be or include silicon oxide (e.g., $SiO_2$), aluminum oxide (e.g., $Al_2O_3$), silicon oxynitride (e.g., SiON), silicon nitride (e.g., $Si_3N_4$), lanthanum oxide (e.g., $La_2O_3$), strontium titanium oxide (e.g., $SrTiO_3$), undoped hafnium oxide (e.g., $HfO_2$), a combination thereof, or the like. In some embodiments, the gate dielectric layer is or includes a high k dielectric, which is a material having a dielectric constant greater than about 3.9. In various embodiments, the gate dielectric layer has a dielectric constant of about 3.9-15, about 3.9-10, or about 10-15.

In some embodiments, a thickness of the gate dielectric layer is less than about 2.5 nanometers. In some embodiments, the thickness is from about 1.5 to about 2.5 nanometers. In some embodiments, the thickness is from about 1.5 to about 1.8 nanometers. In some embodiments, the thickness is from about 1.7 to about 2.5 nanometers. If the thickness is too small (e.g., about 1 nanometer or less), data retention may be low. If the thickness is too great (e.g., greater than about 2.5 nanometers), the program and erase voltages may be too large or the memory window (i.e., a difference between the high and low threshold voltages) may be too small. High program and erase voltages reduce power efficiency. A small memory window reduces reliability.

The channel layer 107A may be or include a semiconductor. In some embodiments, the channel layer 107A is or includes an oxide semiconductor. Oxide semiconductors that may be suitable for the channel layer 107A include, without limitation, zinc oxide (ZnO), indium tungsten oxide (InWO), indium gallium zinc oxide (InGaZnO), indium zinc oxide (InZnO), indium gallium zinc tin oxide (InGaZnSnO or IGZTO), indium tin oxide (InSnO or ITO), combinations thereof, or the like. In some embodiments, the channel layer 107A is or includes polysilicon, amorphous silicon, or the like. In some embodiments, the channel layer has a thickness from about 2 nm to about 30 nm. In some embodiments, the channel layer has a thickness from about 2 nm to about 10 nm. In some embodiments, the channel layer has a thickness from about 5 nm to about 20 nm.

In some embodiments, the memory cells 101A are floating gate memory cells and the data storage structure 108A is a charge storage structure. In these embodiments, programming involves storing or removing a charge from a data storage film 111A between two dielectric layers. Each of the two dielectric layers may be an oxide such as silicon oxide, a nitride such as silicon nitride, a carbide such as silicon carbide, combinations thereof such as silicon oxynitride, silicon oxycarbide, silicon carbonitride, or the like. The data storage film 111A may also be a dielectric of one of these types or some other type. For example, the data storage structure 108A may be an ONO structure in which a the data storage structure 108A is a nitride layer and is sandwiched between two oxide layers.

The conductive strips 123A are conductive structures formed by one or more layers of conductive materials. Suitable conductive materials for the conductive strips 123A may include doped polysilicon, conductive carbon-based materials such as graphene and microcrystalline graphite, and metals. In some embodiments, the conductive material includes a metal. Forming the conductive strips 123A of metal may provide a compact design with low parasitic resistance. Some examples of metals that may be used are tungsten (W), copper (Cu), ruthenium (Ru), molybdenum (Mo), cobalt (Co), aluminum (Al), nickel (Ni), silver (Ag), gold (Au) the like, and alloys thereof. In some embodiments, the conductive strips 123A further include a diffusion barrier layer, a glue layer, or other such layer bordering abutting dielectric strips 131A. Some examples of materials that may be used for a diffusion barrier layer or a glue layer are titanium nitride (TiN), tantalum nitride (TaN), molybdenum nitride (MoN), zirconium nitride (ZrN), hafnium nitride (HfN), and the like. In some embodiments, a portion of the diffusion barrier or glue layer extends vertically through a central area of the conductive strip 123A. This vertical portion may indicate the conductive strip was formed using a replacement gate process that is described more fully below. The vertical portion may have approximately twice a thickness of a portion of the diffusion barrier or glue layer that abuts the dielectric strip 131A. In some embodiments, the conductive material is carbon-based. Forming the conductive strips of carbon-based conductors facilitates etching to form the stacks 135A and etching to form the recesses 127A.

The source lines 103A and the bit lines 119A may also be formed of any suitable conductive material. The examples given from the conductive strips 123A are also applicable to the source lines 103A and the bit lines 119A. As with the conductive strips 123A, the source lines 103A and the bit lines 119A may also include a glue layer or a diffusion barrier layer.

An intracell dielectric 115A provides fill and insulation between the source lines 103A and the bit lines 119A corresponding to individual memory cells 101A. Intercell dielectric plugs 121A provides fill and insulation between the source lines 103A and the bit lines 119A of horizontally adjacent memory cells 101A. The intracell dielectric 115A, the intercell dielectric plugs 121A, and the dielectric strips 131A may each be any suitable dielectric. Suitable dielectrics for these structures may be, for example, oxides such as silicon oxide, nitrides such as silicon nitride, carbides such as silicon carbide, combinations thereof such as silicon oxynitride, silicon oxycarbide, silicon carbonitride, or the like. Distinct dielectrics may be selected for the intracell dielectric 115A and the intercell dielectric plugs 121A in order to provide etch selectivity that facilitates manufacturing.

In some embodiments, a height $H_1$ of the dielectric strips 131A and a height $H_2$ of the gate strips 123A are each in a range from about 15 nm to about 90 nm. In some embodiments, the height $H_1$ is in a range from about 15 nm to about 45 nm. In some embodiments, the height $H_1$ is in a range from about 45 nm to about 90 nm. In some embodiments, the height $H_2$ is in the range from about 15 nm to about 30 nm. In some embodiments, the height $H_2$ is in the range from about 30 nm to about 60 nm. In some embodiments, the height $H_1$ is greater than the height $H_2$. In some embodiments, the height $H_2$ is greater than the height $H_1$. In some embodiments, the height $H_1$ is within a factor of three of the height $H_2$. In some embodiments, the height $H_1$ is within a factor of two of the height $H_2$.

A width $W_2$ of the dielectric strips 131A is also a width of the stacks 135A. In some embodiments, the width $W_2$ is in a range from about 20 nm to about 200 nm. In some embodiments, the width $W_2$ is in a range from about 30 nm to about 160 nm. The conductive strips 123A may be narrower. At their narrowest a width of the conductive strips 123A is the width $W_2$ less the thickness $T_1$ of the data storage film 111A. At their widest a width of the conductive strips 123A is the width $W_2$ less the distance $D_1$ by which the gate sidewalls 125A are set back relative to the dielectric sidewalls 129A. In some embodiments, the distance $D_1$ is in a range from about 2 nm to about 20 nm. In some embodiments, the distance $D_1$ is in a range from about 2 nm to 12 nm. In some embodiments, the distance $D_1$ is in a range from about 2 nm to about 6 nm. The conductive strips 123A are narrower than the width of the stacks 135A.

The source lines 103A and the bit lines 119A may be of similar sizes to one another. In some embodiments, a width $W_1$ and a length $T_2$ of the source lines 103A and the bit lines 119A are each in a range from about 20 nm to about 100 nm. In some embodiments, the width $W_1$ and the length $T_2$ are each in a range from about 30 nm to about 80 nm. In some embodiments, cross-sectional areas of the source lines 103A and the bit lines 119A in the horizontal plane are in a range from about 500 nm$^2$ to about 10,000 nm$^2$. In some embodiments, the areas are in a range from about 900 nm$^2$ to about 6,000 nm$^2$.

In some embodiments, a width $D_2$ between adjacent stacks 135A is approximately the width $W_1$ of the source lines 103A and the bit lines 119A plus twice the thickness of the channel layer 107A. In some embodiments the width $D_2$ is from about 30 nm to about 200 nm. In some embodiments the width $D_2$ is from about 40 nm to about 140 nm.

In some embodiments, a length $L_2$ of the channels 113A is in a range from about 30 nm to about 200 nm. In some embodiments, the length $L_2$ is in a range from about 60 nm to about 150 nm. In some embodiments, a spacing $S_1$ between adjacent memory cells 101A within a tier 141A-D is in a range from about 30 nm to about 200 nm. In some embodiments, the spacing $S_1$ is in a range from about 30 nm to about 100 nm. In some embodiments, the spacing $S_1$ is in a range from about 60 nm to about 200 nm. In some embodiments, the spacing $S_1$ between horizontally adjacent memory cells 101A in a given tier 141A-D is greater the height $H_1$, which is the spacing between vertically adjacent memory cells 101A.

Figure 5B:
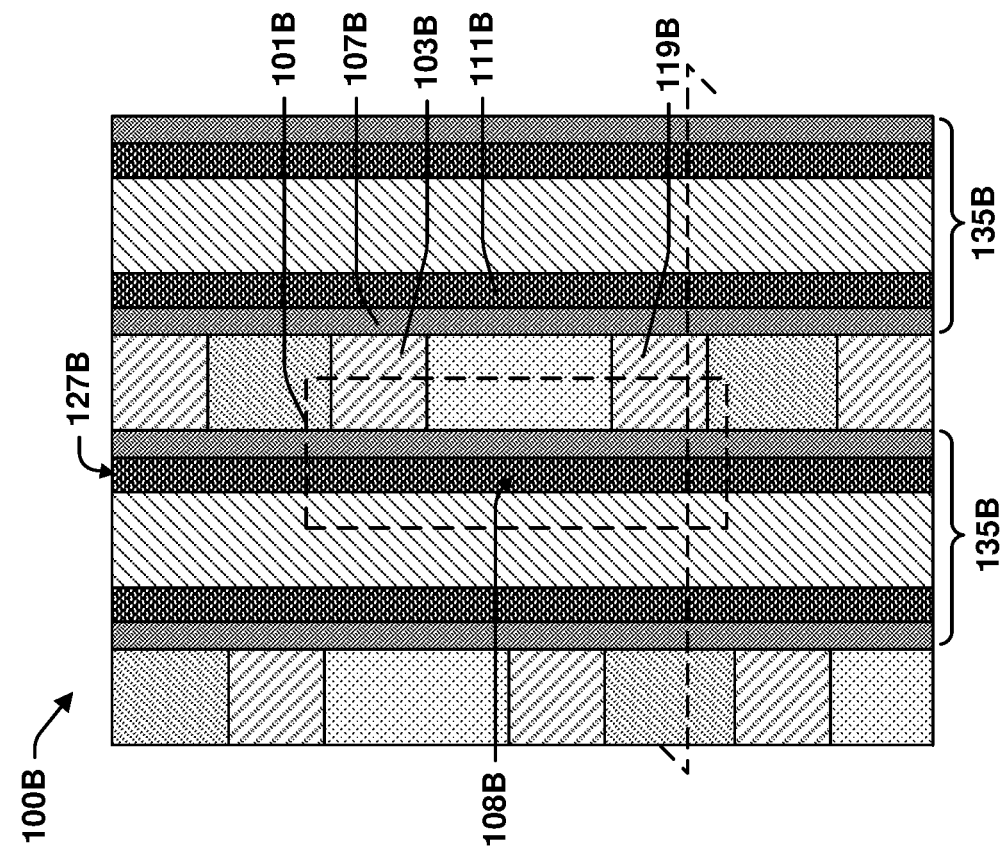
FIGS. 5A-5B illustrate vertical and horizontal cross-sections of a second 3D memory array, which is a 3D memory array according to some other aspects of the present teachings.
Figure 5A:
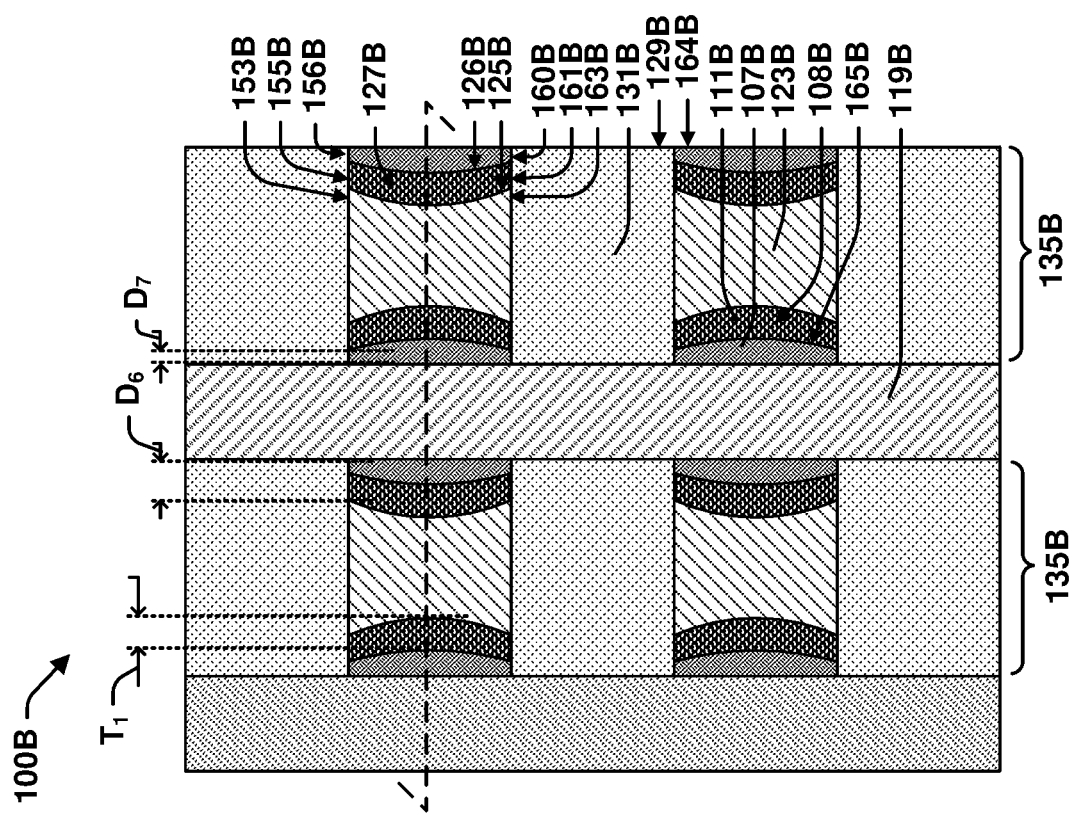

FIGS. 5A and 5B illustrate cross-sections of a second 3D memory array 100B. The second 3D memory array 100B has memory cells 101B and is generally similar to the first 3D memory array 100A and has corresponding features except that the 3D memory array 100B has a channel layer 107B that is disposed within recesses 127B of stacks 135B. A thickness of the data storage films 111B may be more uniform across the gate sidewalls 125A as compared to the data storage films 111A of the first 3D memory array 100A. Placing the channel layer 107B within the recesses 127B may also be useful in preventing the channel layer 107B from being etched while forming openings for the source lines 103A and the bit lines 119A.

To make room for the channel layer 107B to be disposed in the recesses 127B, the dielectric strips 131B are made wider than the dielectric strips 131A and the recesses 127B are made deeper than the recesses 127A. The distance between adjacent stacks 135B may be made smaller to keep the second 3D memory array 100B the same size as an equivalent first 3D memory array 100A. The sidewalls 126B of the data storage films 111B are set back from the dielectric sidewalls 129B by the distance $D_7$, which is a thickness of the channel layer 107B. The gate sidewalls 125B are set back from the dielectric sidewalls 129B by a distance $D_6$. $D_6$ is greater by the distance $D_7$ than the distance $D_1$. The distance $D_1$ is the distance the gate sidewalls 125A are set back from the dielectric sidewalls 129A.

The data storage structures 108B include the data storage films 111B and may include additional layers as well, such as dielectric layers. The data storage structures 108B together with the channel layers 107B fill the recesses 127B. The channel layers 107B may be entirely contained within the recesses 127B. The channel layers 107B have a horizontal upper boundary 156B in alignment with an upper boundary 155B of the data storage films 111B and with an upper boundary 153B of the conductive strips 123B. The channel layers 107B have a horizontal lower boundary 160B in alignment with a lower boundary 161B of the data storage films 111B and with a lower boundary 163B of the conductive strips 123B. Within the tiers 141A-141C, the upper boundary 153B, the upper boundary 155B, and the upper boundary 156B each abut an overlying dielectric strip 131B. Within the tiers 141B-141D, the lower boundary 160B, the lower boundary 161B, and the lower boundary 163A each abut an underlying dielectric strip 131B. The channel layers 107B have sidewalls 164B that are in alignment with dielectric sidewalls 129B of adjacent dielectric strips 131B. The dielectric sidewalls 129B are flat and vertical and face outward from the stacks 135A. The channel layers 107B also have convex inward-facing sidewalls 165B.

FIGS. 6A and 6B illustrate cross-sections of a third 3D memory array 100C. The third 3D memory array 100C has memory cells 101C and is generally similar to the first 3D memory array 100A except that the 3D memory array 100C has channel layers 107C that are partially disposed within recesses 127C of stacks 135C and partially outside the recesses 127C. The recesses 127C are formed in stacks 135C and are filled by the data storage structures 108C together with a portion of the channel layer 107C. In some embodiments, sidewalls 126C of the data storage structures 108C are recessed relative to dielectric sidewalls 129C. In some embodiments the sidewalls 126C are not recessed and meet the dielectric sidewalls 129C.

The dielectric strips 131C may be the same width as the dielectric strips 131A, the same width as the dielectric strips 131B, or in between. The recesses 127C may be sufficiently deep to keep the third 3D memory array 100C the same size as a first 3D memory array 100A with equally sized source lines, bit lines, and conductive strips. The data storage films 111C may be more uniform in thickness than the data storage films 111A. Having a portion of the channel layer 107C outside the recesses 127C may facilitate providing a desired thickness to the channel layer 107C. The channel layer 107C may include two distinct layers, one that is within the recesses 127C and another that is outside the recesses 127C. In some embodiments, the channel layer 107C has a vertical sidewall 164C that faces the source lines 103C and the bit lines 119C and a convex sidewall 165C that faces the conductive strips 123C. In some embodiments, the channel layer 107C has a shape that is substantially conformal to the sidewalls 126C and the dielectric sidewalls 129C.

FIGS. 7A and 7B illustrate cross-sections of a fourth 3D memory array 100D according to some other aspects of the present teachings. The fourth 3D memory array 100D has memory cells 101D and many elements that are similar to the first 3D memory array 100A but has a data storage film 111D that is selectively formed on the conductive strips 123D. The data storage films 111A-111C of the 3D memory arrays 100A-100C are formed in recesses 127A-127C because this structure allows the data storage films 111A-111C to be made discontinuous between adjacent tiers 141A-141D using an etch process. Selective deposition makes the data storage films 111D discontinuous between adjacent tiers 141A-141D without etching. Accordingly, the stacks 135D need not have recesses to house the data storage films 111D. The stacks 135D may be narrower that the stacks 135A by a thickness of the data storage films 111D while keeping other dimensions similar to those in the first 3D memory array 100A. Because they are formed by selective deposition or growth process, each data storage film 111D may have an upper boundary 155D that extends above an upper boundary 153D of a corresponding conductive strip 123D by approximately a thickness of the data storage films 111D. Likewise, each data storage film 111D may have a lower boundary 161D that extends below a lower boundary 163D of the conductive strip 123D by approximately a thickness of the data storage films 111D.

FIGS. 8A and 8B illustrate cross-sections of a fifth 3D memory array 100E according to some other aspects of the present teachings. The fifth 3D memory array 100E is generally similar to the first 3D memory array 100A and has corresponding features except for the differences noted below. In the fifth 3D memory array 100E, the recesses 127E do not extend the lengths of the stacks 135E. The recesses 127E do not extend past the intercell dielectric plugs 121E. The recesses 127E have ends 114E (termini) adjacent the intercell dielectric plugs 121E. The recesses 127E extend between the intercell dielectric plugs 121E and the conductive strips 123E by no more than a distance $D_8$, which is approximately the same as a depth of the recesses 127E. The intercell dielectric plugs 121E may have been formed prior to an etch process that created the recesses 127E.

There is one recess 127E for each of the memory cells 101E and the data storage films 111E are contained within the recesses 127E. As a consequence, the data storage films 111E are discontinuous between horizontally adjacent memory cells 101E, between vertically adjacent memory cells 101E, and between any pair of memory cells in the fifth 3D memory array 100E. Because the data storage films 111E are discontinuous, there are more options for the data storage structures 108E as compared to the data storage structures 108A. For example, the data storage structures 108E may be floating gates with conductive data storage films 111E on which charge may be stored to vary a threshold voltage for the control gate 109E. The data storage structure 108E may include insulating films between the data storage film 111E and each of the channel layer 107E and the control gate 109E.

Figure 9B:
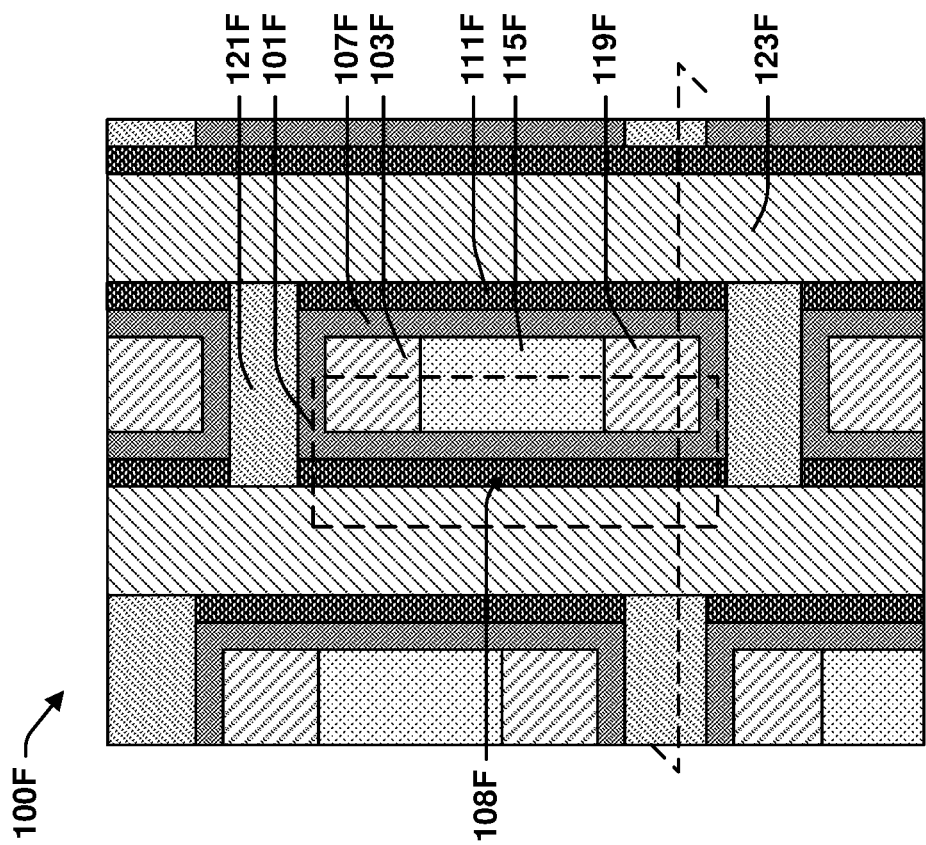
FIGS. 9A-9B illustrate vertical and horizontal cross-sections of a sixth 3D memory array, which is a 3D memory array according to some other aspects of the present teachings.
Figure 9A:
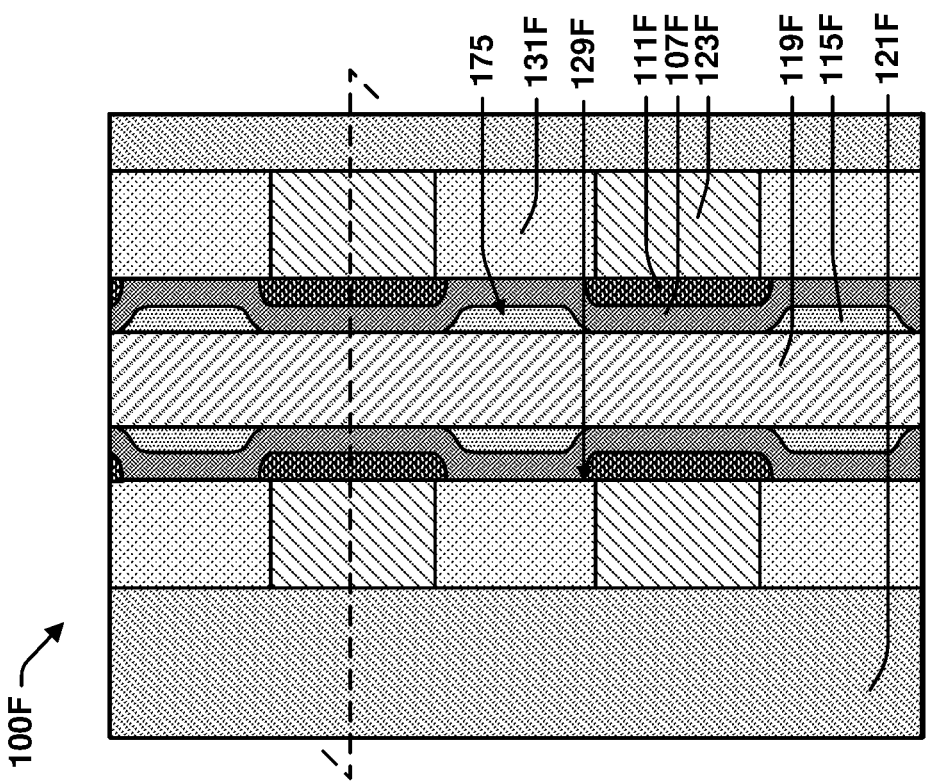

FIGS. 9A and 9B illustrate cross-sections of a sixth 3D memory array 100F according to some other aspects of the present teachings. The sixth 3D memory array 100F combines features of the fourth 3D memory array 100D and the fifth 3D memory array 100E to provide data storage films 111F that are discontinuous with respect to both horizontally and vertically adjacent memory cells 101F. The memory cells 101F include data storage films 108F that are discontinuous between vertically adjacent films by virtue of being selectively grown from the conductive strips 123F but not from the dielectric strips 131F. The data storage films 111F may have a mushroom shape that results from the selective growth. The data storage films 111F of horizontally adjacent memory cells 101F may be separated by intercell dielectric plugs 121F. The intercell dielectric plugs 121F may have been formed prior to the data storage films 111F and may have prevented the data storage films 111F from growing in the areas occupied by the intercell dielectric plugs 121F. A channel layer 107F may conform to boundaries of the data storage films 111F, the dielectric sidewalls 129F, and sides of the intercell dielectric plugs 121F. The intracell dielectric 115F may fill indentations 175 in channel layer 107F to provide vertical sidewalls for source lines 103F and bit lines 119F.

FIGS. 10A and 10B illustrate cross-sections of a seventh 3D memory array 100G according to some other aspects of the present teachings. The seventh 3D memory array 100G is generally similar to the first 3D memory array 100A and has corresponding features except for the shapes of the source lines 103G and the bit lines 119G. Pairs of source lines 103G and bit lines 119G corresponding to a memory cell 101G have bulges 181 facing one another whereby a distance $D_8$ between them is less than the channel length $L_2$. The bulges 181 may have a convex shape and may follow an elliptical arc between channels 113G corresponding to memory cells 101G on facing sides of adjacent stacks 135G. The bulges 181 add to the cross-sectional area of the source lines 103G and bit lines 119G without reducing the channel length $L_2$. Accordingly, the shapes of source lines 103G and bit lines 119G may be used to reduce parasitic resistance or to make the seventh 3D memory array 100G more compact than the memory array 100A.

Figure 11B:
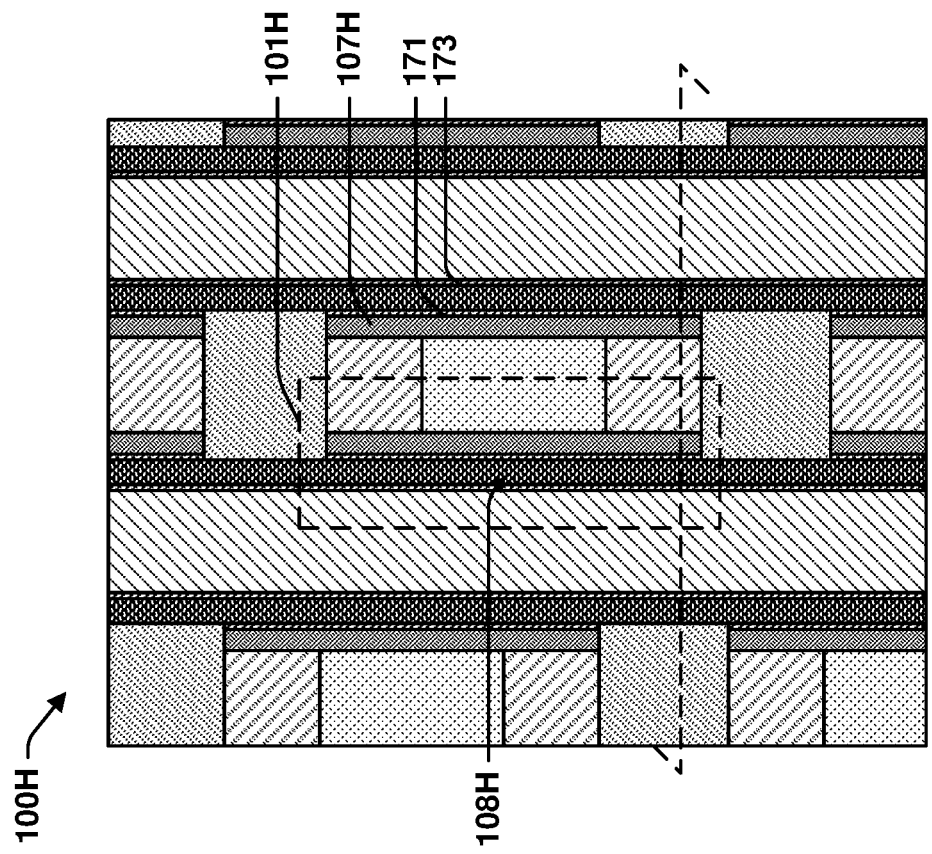
FIGS. 11A-11B illustrate vertical and horizontal cross-sections of an eighth 3D memory array, which is a 3D memory array according to some other aspects of the present teachings.
Figure 11A:
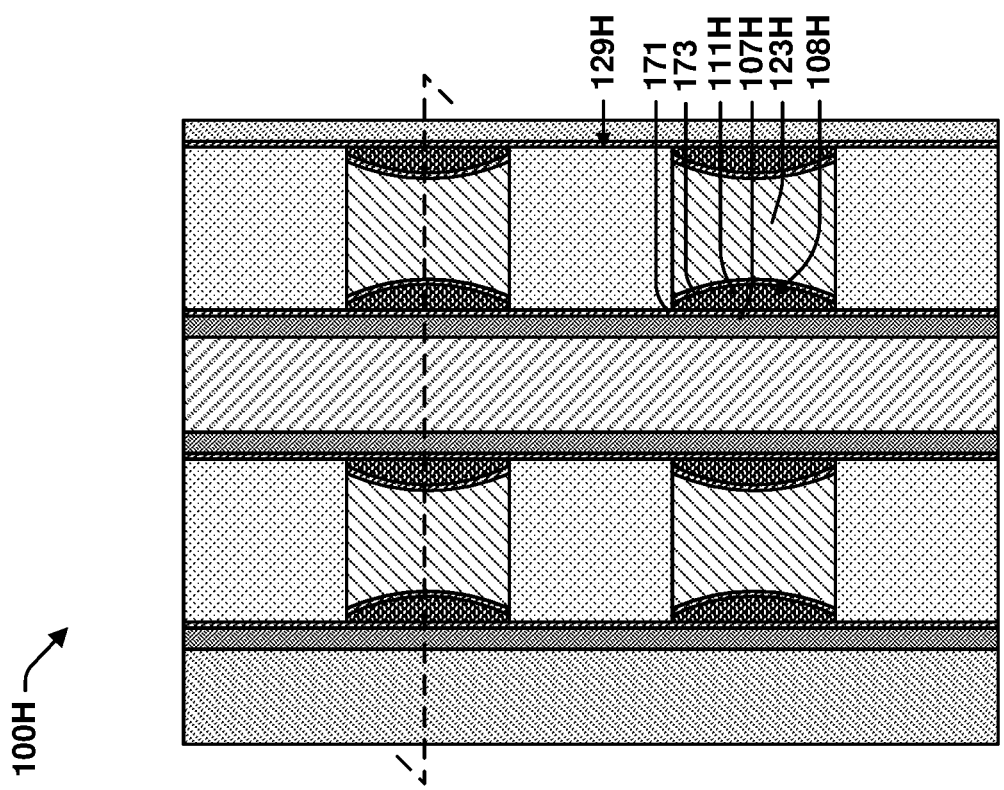

FIGS. 11A and 11B illustrate cross-sections of an eighth 3D memory array 100H according to some other aspects of the present teachings. The eighth 3D memory array 100H has memory cells 101H and has features corresponding to the first 3D memory array 100A. The eighth 3D memory array 100H has a dielectric layer 173 disposed between the data storage film 111H and the conductive strip 123H and another dielectric layer 171 disposed between the data storage film 111H and the channel layer 107H. The data storage structure 108H may be, for example, an ONO data storage structure. In some embodiments, the dielectric layer 171 is disposed on the dielectric sidewalls 129H as well as over the data storage films 111H.

FIGS. 12A and 12B through FIGS. 22A and 22B are a series of paired top view and cross-sectional view illustrations exemplifying a method according to the present teachings of forming a device comprising a 3D memory array with features of the first 3D memory array 100A. While FIGS. 12A and 12B through FIGS. 22A and 22B are described with reference to various embodiments of a method, it will be appreciated that the structures shown in FIGS. 12A and 12B through FIGS. 22A and 22B are not limited to the method but rather may stand alone separate from the method. While FIGS. 12A and 12B through FIGS. 22A and 22B are described as a series of acts, it will be appreciated that the order of the acts may be altered in other embodiments. While FIGS. 12A and 12B through FIGS. 22A and 22B illustrate and describe a specific set of acts, some acts that are illustrated and/or described may be omitted in other embodiments. Further, acts that are not illustrated and/or described may be included in other embodiments. While the method of FIGS. 12A and 12B through FIGS. 22A and 22B is described in terms of forming the first 3D memory array 100A, the method may be used to form other memory arrays.

As shown by the top view 1200A of FIG. 12A and the cross-sectional view 1200B of FIG. 12B, the method begins with forming a broad stack 1205 of alternating gate layers 1201 and dielectric layers 1203 over a dielectric layer 317. The dielectric layer 317 may be one or more layers formed over a metal interconnect layer 301C as shown in FIG. 3, but more generally could be the top layer of any suitable substrate. In the broad stack 1205, the top and bottom layers are gate layers 1201, but either could be a dielectric layer 1203.

The dielectric layers 1203 and the gate layers 1201 may be formed by any suitable process such as chemical vapor deposition (CVD), atomic layer deposition (ALD), or the like. In some embodiments, the gate layers 1201 are dummy layers that are later replaced by conductive material to provide conductive strips. In some embodiments, the gate layers 1201 have the composition of conductive strips. In some embodiments, the gate layers 1201 are metallic. In addition to the processes noted above, a metallic layer may be formed by electroplating, electroless plating, or the like.

As shown by the top view 1300A of FIG. 13A and the cross-sectional view 1300B of FIG. 13B, a mask 1301 may be formed and used to pattern trenches 1303 that divide the broad stack 1205 into a series of stacks 135A. The mask 1301 may be a hard mask of any suitable material. The mask 1301 may be formed by a CVD process, a spin-on process, the like, or any other suitable process. The mask 1301 may be patterned by etching through a photoresist mask (not shown). The photoresist mask may be pattern by photolithography.

The stacks 135A may include conductive strips 123A formed from the gate layers 1201 and dielectric strips 131A formed from the dielectric layers 1203. A ratio of a height $H_3$ to a width $D_2$ is an aspect ratio of the trenches 1303. In some embodiments, the aspect ratio is in a range from about 5 to about 15. Forming trenches 1303 with an aspect ratio of less than about 5 may compromise the cell density of the 3D memory array 100A. Forming trenches 1303 with an aspect ratio greater than about 15 may cause twisting or collapsing of the stacks 135A during processing.

Figure 14A:
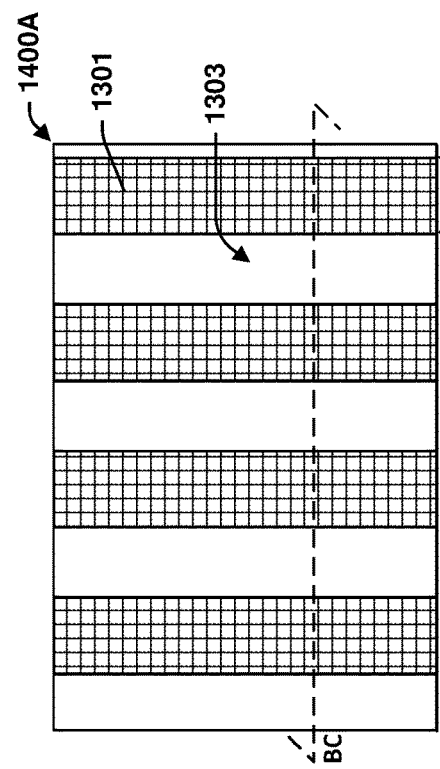
Figure 14B:
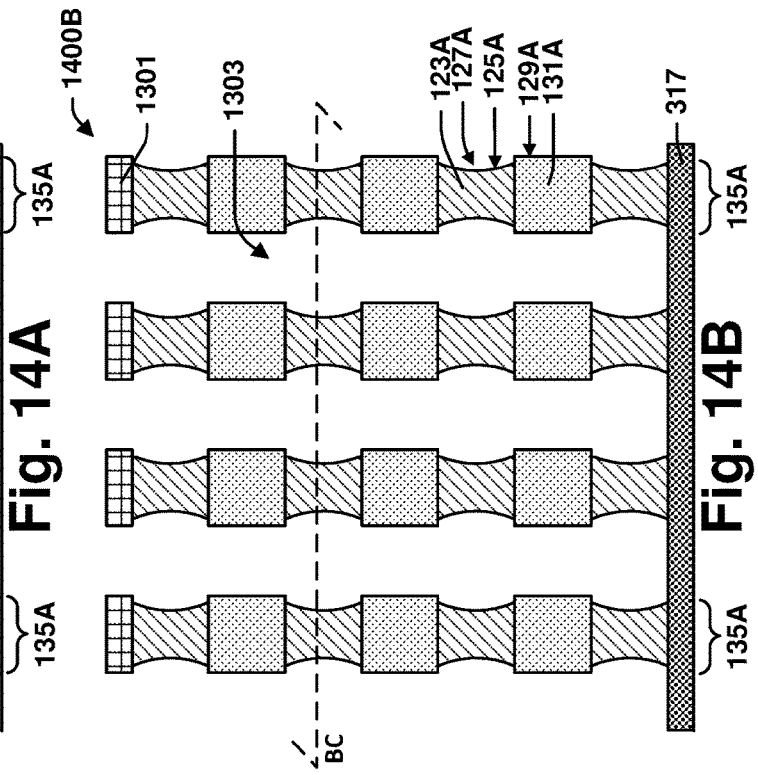

As shown by the top view 1400A of FIG. 14A and the cross-sectional view 1400B of FIG. 14B, the stacks 135A may be subject to a selective etch process that forms recesses 127A. The etch process is selective for removing the material of conductive strips 123A over the material of the dielectric strips 131A. The etch causes gate sidewalls 125A to be indented relative to dielectric sidewalls 129A. The etch may also cause gate sidewalls 125A to become concave as shown. In some embodiments, the etch is isotropic. In some embodiments, the etch is a wet etch. A suitable wet etch process may use phosphoric acid ($H_3PO_4$) or the like. Atomic layer etching with a suitable etch selectivity is another option.

Figure 15A:
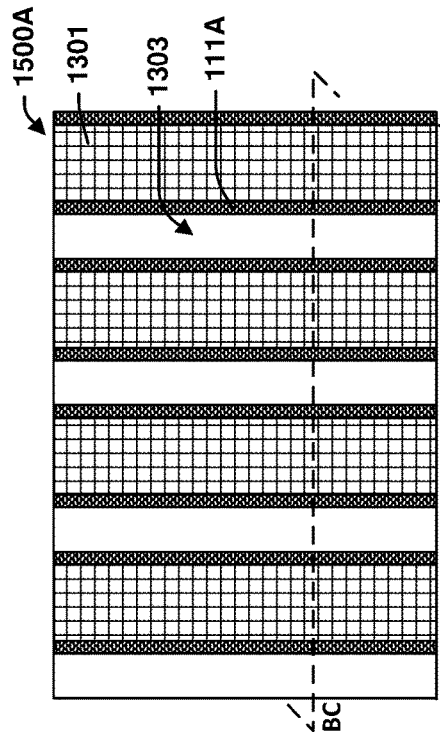
Figure 15B:
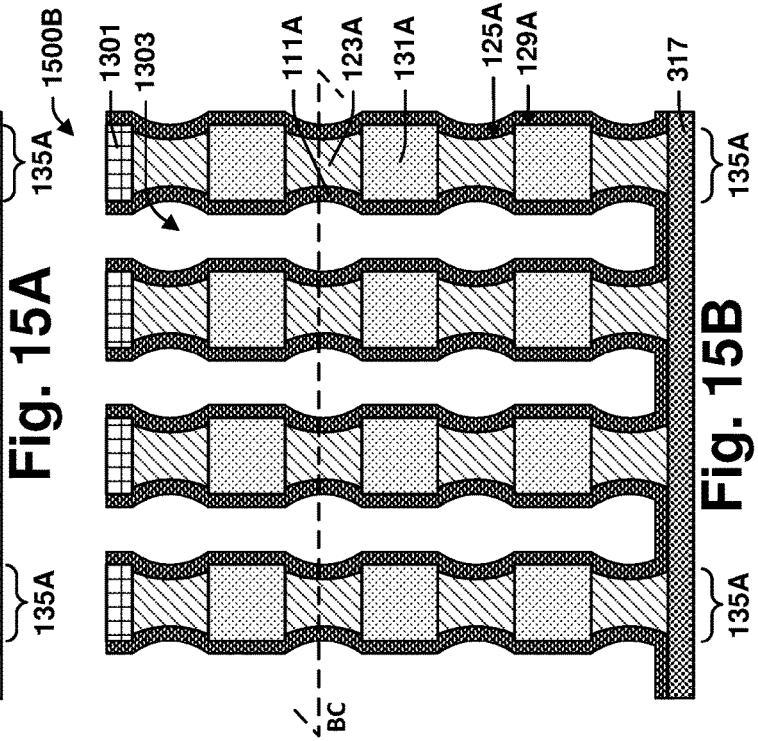

As shown by the top view 1500A of FIG. 15A and the cross-sectional view 1500B of FIG. 15B, a data storage film 111A is deposited on the sides of the stacks 135A including sides within the trenches 1303. The data storage film 111A may deposit conformally on the gate sidewalls 125A and the dielectric sidewalls 129A. The deposition process may be CVD, ALD, the like, or any other suitable process. The data storage film 111A may form continuous layers extending across the heights of the stacks 135A. Additional layers may be deposited before or after the data storage film 111A if desired for the data storage structures 108A.

As shown by the top view 1600A of FIG. 16A and the cross-sectional view 1600B of FIG. 16B, the data storage film 111A may be etched to remove portions of the data storage film 111A between the tiers 141A-141D. The removed portions include those that deposited on the dielectric sidewalls 129A. The remaining portions of the data storage film 111A are contained within the recesses 127A. The etch is anisotropic. The anisotropic etch may be a plasma etch or the like or any other suitable etch process. The plasma etch may be followed by a wet clean process. The wet clean process may use $NH_3$, HCl, $H_2O_2$, the like, or any other suitable agents. The mask 1301 may align the etch to the stacks 135A.

As shown by the top view 1700A of FIG. 17A and the cross-sectional view 1700B of FIG. 17B, channel layers 107A may be deposited on the sides of the stacks 135A. The channel layers 107A may deposit conformally on the data storage films 111A and the dielectric sidewalls 129A. The deposition process may be CVD, ALD, the like, or any other suitable process. The channel layers 107A may be continuous across the heights of the stacks 135A. One or more additional layers may be deposited before the channel layers 107A if desired to complete the formation of the data storage structures 108A. In some embodiments, the data storage structures 108A are completed by a dielectric layer that forms during deposition of the channel layers 107A.

As shown by the top view 1800A of FIG. 18A and the cross-sectional view 1800B of FIG. 18B, an intracell dielectric 115A may be deposited to fill the trenches 1303. The deposition process may be CVD, the like, or any other suitable process. In some embodiments, the deposition includes a flowable CVD process. Following deposition of the intracell dielectric 115A, a planarization process may be used to remove any intracell dielectric 115A or other material above the mask 1301.

As shown by the top view 1900A of FIG. 19A and the cross-sectional view 1900B of FIG. 19B, a mask 1903 may be formed and used to help define a pattern for selectively etching openings 1901 in intracell dielectric 115A. The stacks 135A may be covered by the mask 1301 during this etch process. The etch process may be an anisotropic etch such as a plasma etch. As shown by the top view 2000A of FIG. 20A and the cross-sectional view 2000B of FIG. 20B, the mask 1903 may be stripped and the openings 1901 filled with intercell dielectric to form intercell dielectric plugs 121A. The intercell dielectric plugs 121A are formed in the trenches 1303 (see FIG. 13B) between desired locations for memory cells 101A. The openings 1901 may be filled with intercell dielectric plugs 121A by a deposition process such as CVD. In some embodiments, the CVD process is a flowable CVD process. The flowable CVD process may provide good gap fill even if the openings 1901 have a high aspect ratio.

As shown by the top view 2100A of FIG. 21A and the cross-sectional view 2100B of FIG. 21B, a mask 2101 may be formed and used to help define a pattern for selectively etching openings 2103 in the intracell dielectric 115A. The mask 2101 may have openings 2105 that are large enough to span two of the openings 2103 and a plug of the intercell dielectric plugs 121A. The etch may be selective to have a much higher etch rate for the material of the intracell dielectric 115A as compared to the intercell dielectric plugs 121A, whereby the openings 2103 are bounded by the intercell dielectric plugs 121A. This approach may facilitate making the openings 2103 large without being too close together. The etch process may be an anisotropic etch such as a plasma etch.

Figure 22A:
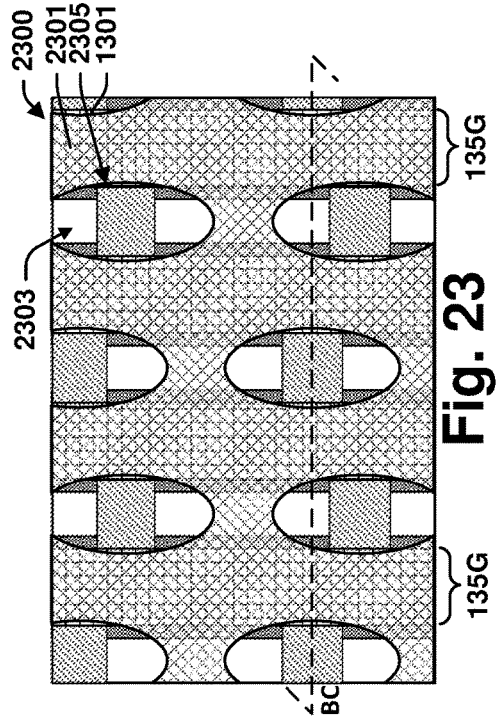
Figure 22B:
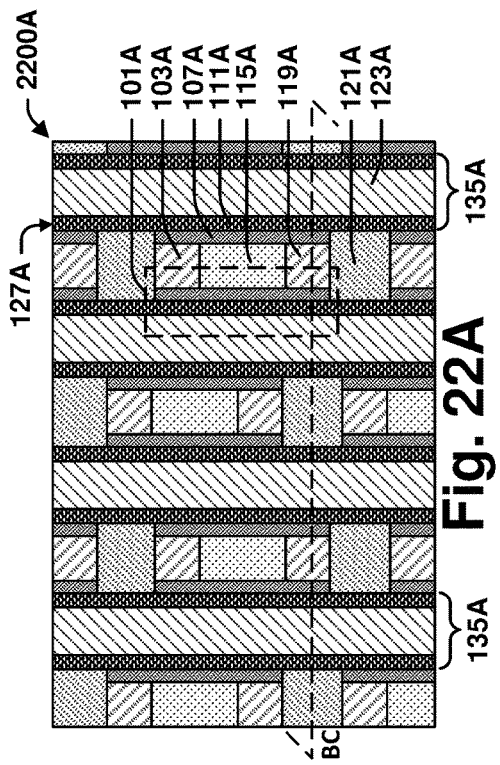

As shown by the top view 2200A of FIG. 22A and the cross-sectional view 2200B of FIG. 22B, the openings 2103 may be filled with conductive material to form the source lines 103A and the bit lines 119A. Filling the openings 2103 with conductive material may include CMP, electroplating, electroless plating, the like, or any other suitable process. Excess conductive material may be removed by a planarization process such as CMP or the like. The CMP process may also remove the mask 2101, the mask 1301, or both. The resulting structure may be the same as the one shown in FIG. 1A-1C.

Figure 23:
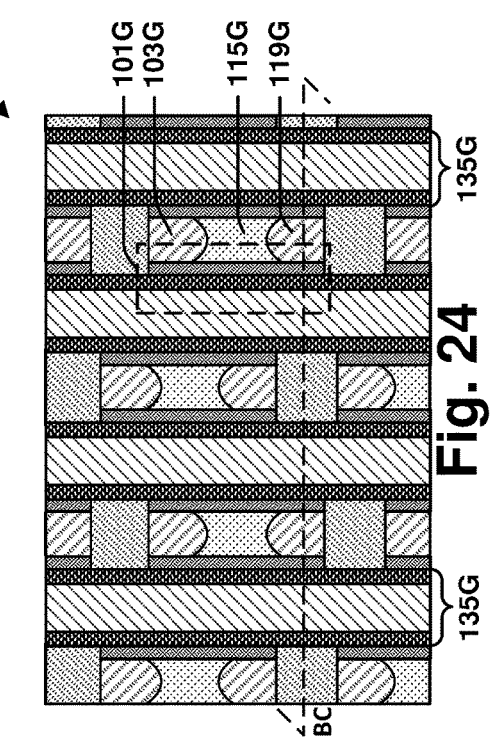
FIGS. 23 and 24 provide top view illustrations for a variation on the method of FIGS. 12A and 12B through FIGS. 22A and 22B that may be used to form a 3D memory array with features of the seventh 3D memory array.
Figure 24:
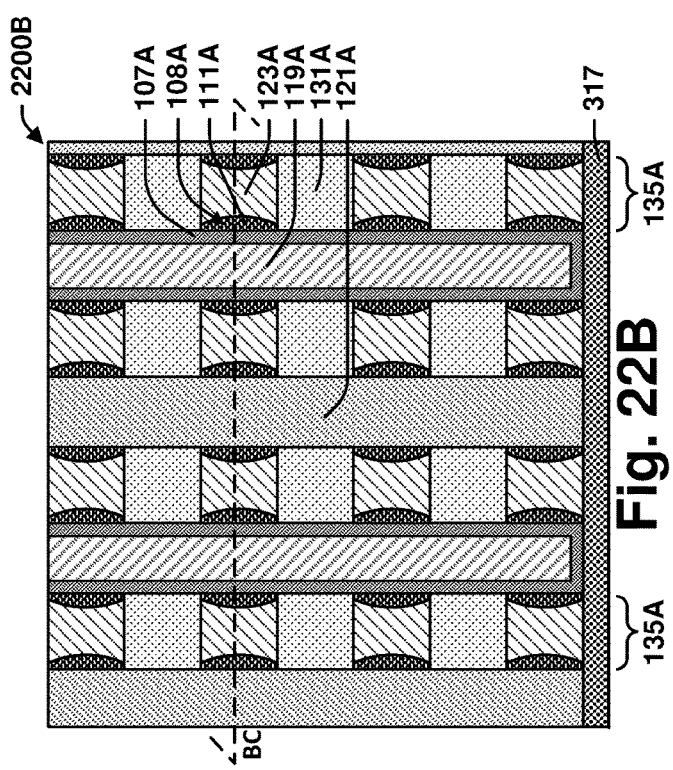

FIGS. 23 and 24 illustrate a variation on the method of FIGS. 12A through 22B that may be used to produce the seventh 3D memory array 100G shown in FIGS. 10A and 10B. As shown by the top view of FIG. 23, a mask 2301 having openings 2305 that are oval may be used in place of the mask 2101. The mask 2101 has openings 2105 that are rectangular (see FIG. 21A). Etching through the mask 2301 produces openings 2303 that are curved adjacent the intracell dielectric 115G. A shown by the top view of FIG. 24, filling the openings 2303 with conductive material may produce the structure exemplified by the seventh 3D memory array 100G shown in FIGS. 10A and 10B.

FIGS. 25 through 31 provide cross-sectional views illustrating a variation on the method of FIGS. 12A through 22B. This alternate method avoids a process stage at which the stacks 135A are left freestanding as shown the cross-sectional view 1300B of FIG. 13B. When left freestanding, the stacks 135A may have the potential to twist, collapse, or otherwise shift or deform. The method also provides an opportunity to initially form the gate layer with a dummy layer and subsequently replace that layer with the material of the conductive strips.

Figure 25:
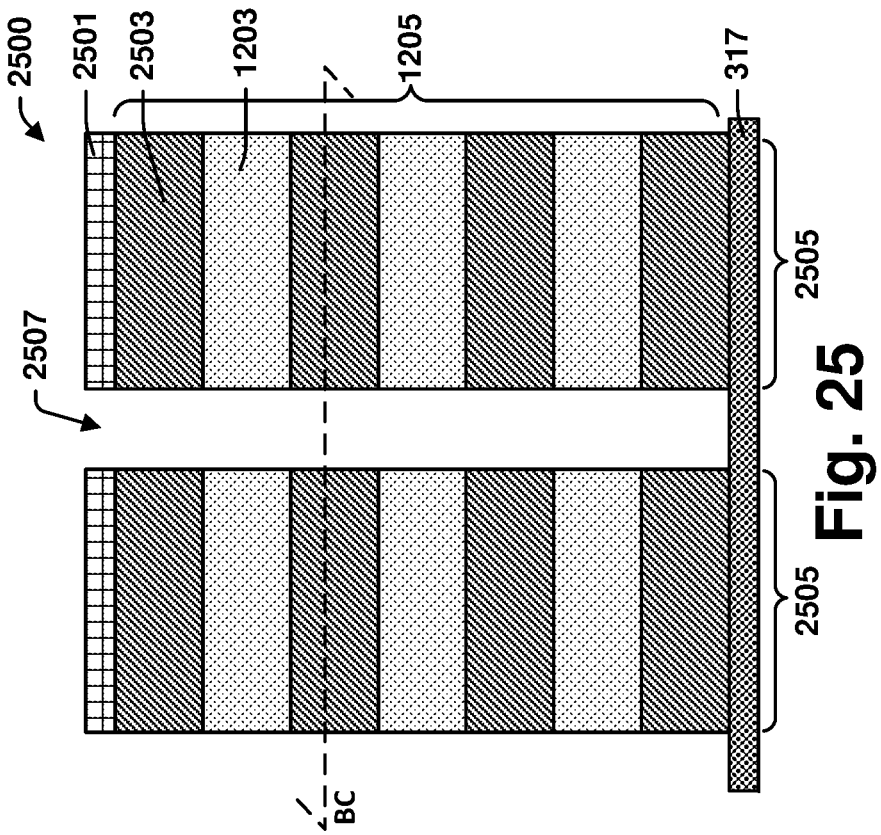

As shown be the cross-sectional view 2500 of FIG. 25, a mask 2501 is formed and used to etch trenches 2507 that divide a broad stack into smaller stacks 2505. The broad stack may be the same as the broad stack 1205 of FIG. 12B, or may have dummy gate layers 2503 in place of gate layers 1201. The dummy gate layers 2503 may be a dielectric with a different etch selectivity from the dielectric layers 1203. The dummy gate layers 2503 may alternatively be polysilicon, the like, or any other suitable material. The trenches 2507 may have the same dimensions as the trenches 1303 of FIG. 13B, but have half or less the number density.

Figure 26:
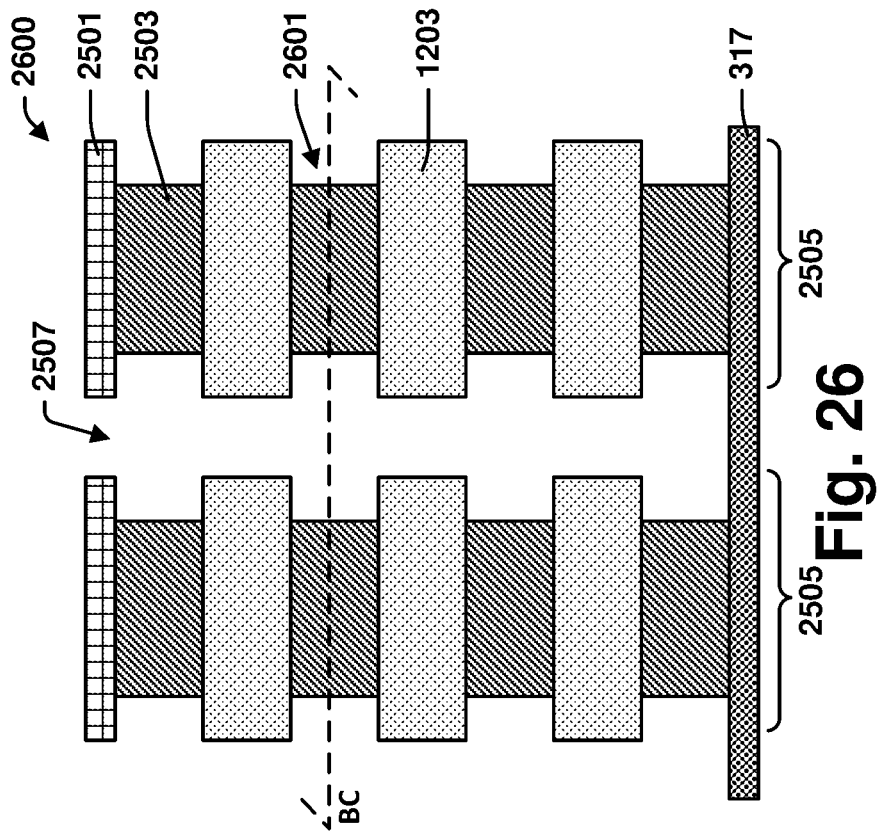

As shown by the cross-sectional view 2600 of FIG. 26, the dummy gate layers 2503 may be etched back from surfaces exposed adjacent the trenches 2507 to form recesses 2601. The etch process may remove approximately half the volume of the dummy gate layers 2503. The etch process may be an isotropic etch. For example, the dielectric layers 1203 may be silicon oxide, the dummy gate layers 2503 may be silicon nitride, and the recesses 2601 may be formed by wet etching with phosphoric acid ($H_3PO_4$).

Figure 27:
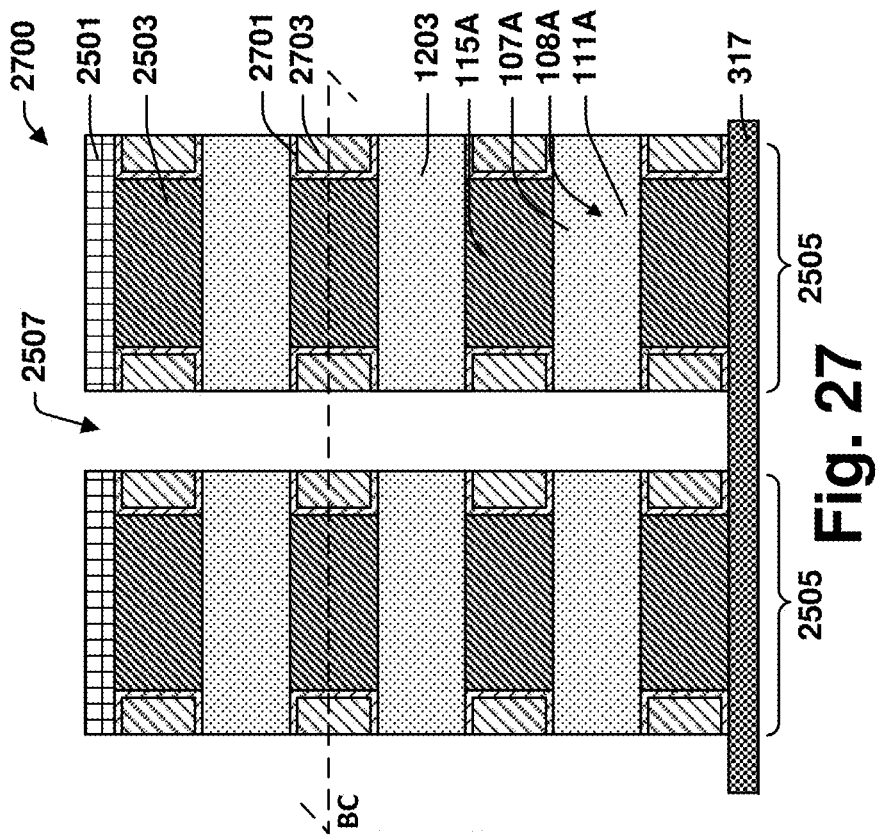

As shown by the cross-sectional view 2700 of FIG. 27, the recesses 2601 may be filled by depositing a barrier layer 2701 and a metal layer 2703. These layers may be deposited by CVD, ALD, electroplating, electroless plating, the like, or any other suitable process or combination of processes. After depositing the metal layer 2703 in an amount sufficient to complete the fill of the recesses 2601, excess material may be removed by an anisotropic etch process.

Figure 28:
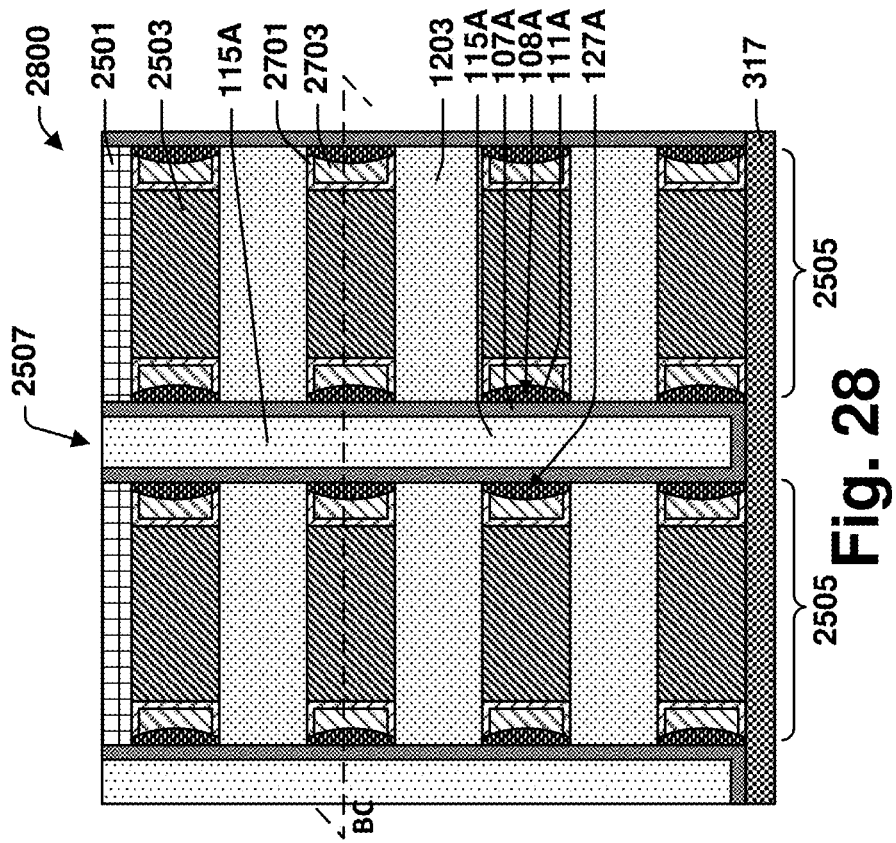

As shown by the cross-sectional 2800 of FIG. 28, the trenches 2507 are filled. In this example, the trenches are filled by the process steps shown in FIGS. 14A and 14B through 18A and 18B. These process steps form the recesses 127A, form the data storage structures 108A including the data storage film 111A, form the channel layer 107A, and complete the fill of the trenches 2507 with intracell dielectric 115A. In some other embodiments, the trenches 2507 are filled by intercell dielectric, the intercell dielectric plugs 121A, the intracell dielectric 115A, a combination thereof, or the like.

Figure 29:
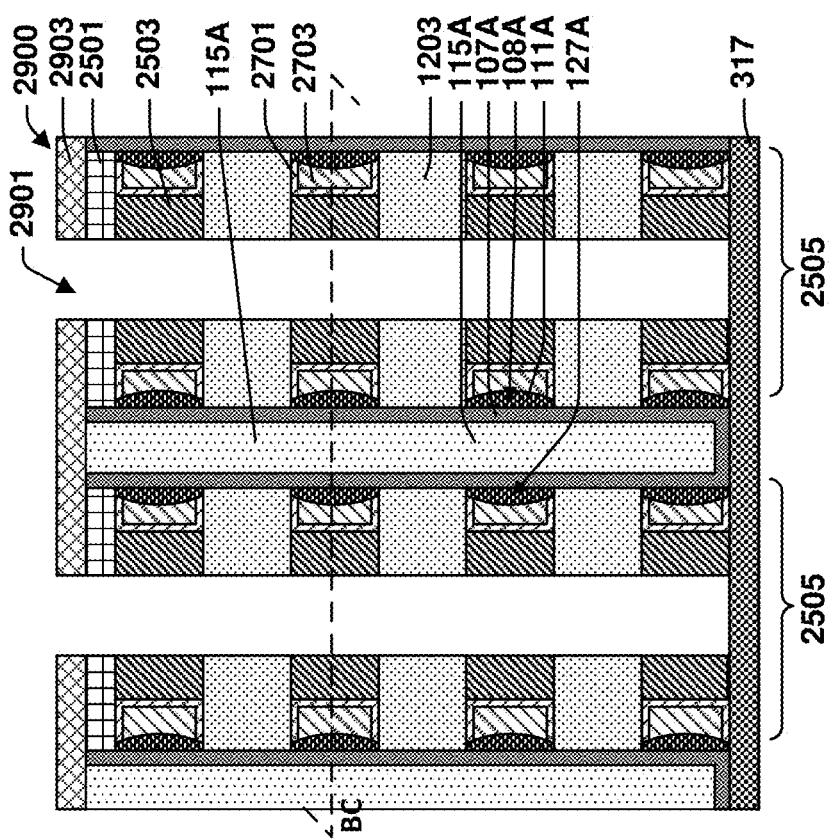

As shown by the cross-sectional view 2900 of FIG. 29, a mask 2903 may then be formed and used to etch trenches 2901 in the stacks 2505. As shown by the cross-sectional view 3000 of FIG. 30, remaining portions of the dummy gate layer 2503 may be removed by etching to form the recesses 3001. As shown by the cross-sectional view 3100 of FIG. 31, the recesses 3001 may be filled by depositing a second barrier layer 3101 and a second metal layer 3103 and the excess material may be removed by anisotropic etching. The process steps shown in FIGS. 14A and 14B through FIGS. 18A and 18B may then be repeated and the mask 2903 removed to provide a structure as shown in FIGS. 18A and 18B. The method of FIGS. 25 through 31, with or without the replacement gate process steps, may be used to form other structures in accordance with other embodiments and examples provided herein to provide the advantage of preventing twisting, collapsing or other deformation that may occur with narrow free standing stacks.

FIGS. 32 through 36 provide a series of cross-sectional views illustrating a variation on the method of FIGS. 12A-22B that may be used to form a memory array with features of the second 3D memory array 100B of FIGS. 5A-5B. The variation begins with a structure like the one shown by the cross-sectional view 3200 of FIG. 32, which is very similar to the cross-sectional view 1300B of FIG. 13B except that the mask 3201 has narrower openings than the mask 1301 and the stacks 135B have deeper recesses 127B. As shown by the cross-sectional view 3300 of FIG. 33, a data storage film 111B may be deposited on the sides of the stacks 135B.

Figure 34:
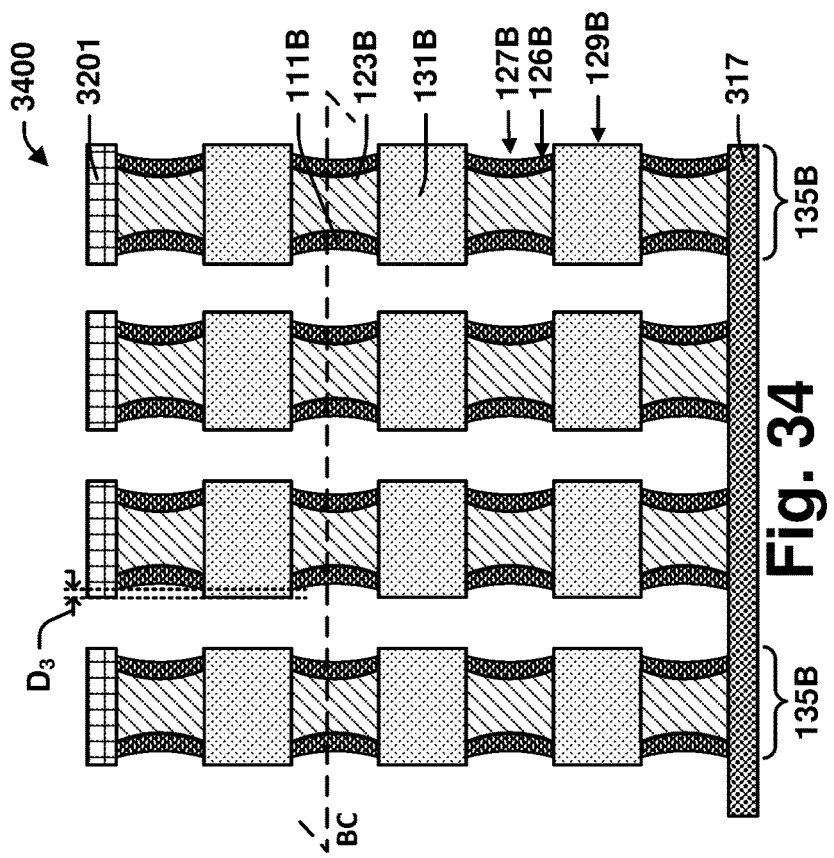

As shown by the cross-sectional view 3400 of FIG. 34 the data storage film 111B is etched by one or more etch processes that remove the data storage film 111B from the dielectric sidewalls 129B. The one or more etch processes also cause a sidewall 126B of the data storage film 111B to be indented relative to the dielectric sidewalls 129B by a distance $D_3$. A first etch process may be an anisotropic etch that selectively removes only that portion of the data storage film 111B that is outside the recesses 127B. A second etch process may be an isotropic etch that causes a remaining portion of the data storage film 111B to be indented relative to the dielectric sidewalls 129B.

As shown by the cross-sectional view 3500 of FIG. 35, a channel layer 107B may be deposited on the sides of the stacks 135B over the data storage film 111B. As shown by the cross-sectional view 3600 of FIG. 36, the channel layer 107B may be etched to remove the channel layer 107B from the dielectric sidewalls 129B. This etching leaves the channel layer 107B with vertical sidewalls. Vertical sidewalls may promote good contact between the channel layer 107B and the source lines 103B and the bit lines 119B (see FIGS. 5A-5B). Processing may continue as shown by FIGS. 18A and 18B through FIGS. 22A and 22B to produce a device structure as shown in FIGS. 5A-5B.

A memory array with features of the third 3D memory array 100C of FIGS. 6A-6B may be formed by depositing another layer of channel material over the structure shown by the cross-sectional view 3600 of FIG. 36 prior to continuing with the processing of FIGS. 18A and 18B through FIGS. 22A and 22B. For the second 3D memory array 100B, a thickness of the channel layer 107B is limited to the distance $D_3$ by which the data storage film 111B is indented relative to the dielectric sidewalls 129B. The additional channel layer deposition removes this limitation. Accordingly, when forming a structure like the third 3D memory array 100C of FIGS. 6A-6B, isotropic etching to recess the data storage film 111C relative to the dielectric sidewalls 129C is optional.

FIGS. 37A-37B provide a top view illustration and a cross-sectional view illustration exemplifying a variation on the method of FIGS. 12A-22B, which variation may be used to form a memory array with features of the fourth 3D memory array 100D shown in FIGS. 7A-7B. Beginning from the structure shown in the cross-sectional view 1300B of FIG. 13B, a data storage film 111D may be grown selectively on gate sidewalls 125D of conductive strips 123D as shown in FIGS. 37A-37B. The growth process is selective, wherein the data storage film 111D does not grow on the dielectric sidewalls 129D. Processing may continue as shown by FIGS. 17A and 17B through FIGS. 22A and 22B to produce the fourth 3D memory array 100D shown in FIGS. 7A-7B.

In some embodiments, the selective growth process includes forming a self-assembled monolayer (SAM) on the dielectric sidewalls 129D. An ALD process or the like may then be used to grow the data storage film 111D on the gate sidewalls 125D while the SAM blocks growth on the dielectric sidewalls 129D. The SAM may include molecules that have a head group that adsorbs preferentially on the dielectric sidewalls 129D and a tail group that resist the ALD process. The selective growth process may give the data storage films 111D a characteristic mushroom shape.

In some embodiments, the selective growth process includes forming a seed layer for the growth of the data storage film 111D on the gate sidewalls 125D. In some embodiments, forming the seed layer includes forming recesses in the gate stacks 135D like the recesses 127A, depositing the seed layer, and anisotropic etching to remove the seed layer from the dielectric sidewalls 129D.

FIGS. 38A and 38B through FIGS. 44A and 44B provide top view and cross-sectional view illustrations exemplifying a variation on the method of FIGS. 12A-22B. This variation may be used to form the fifth 3D memory array 100E shown in FIGS. 10A-10B. The method may begin with a structure like the one shown by the top view 1300A of FIG. 13A and the cross-sectional view 1300B of FIG. 13B. As shown by the top view 3800A of FIG. 38A and the cross-sectional view 3800B of FIG. 38B, the trenches 1303 are initially filled by depositing intercell dielectric 3801. Excess material may be removed by CMP.

Figure 39A:
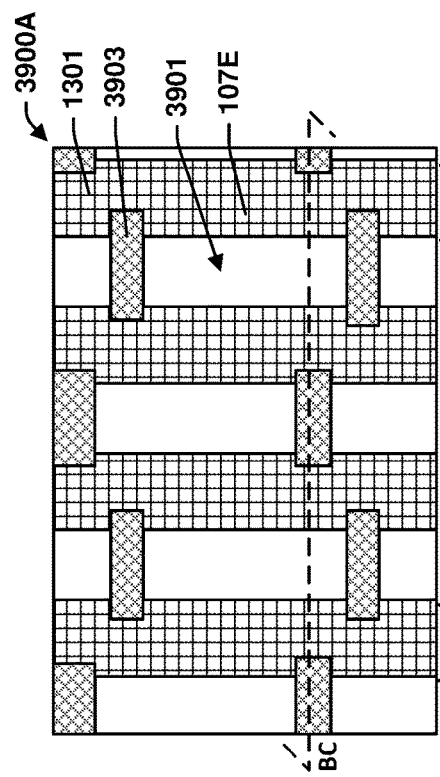
Figure 39B:
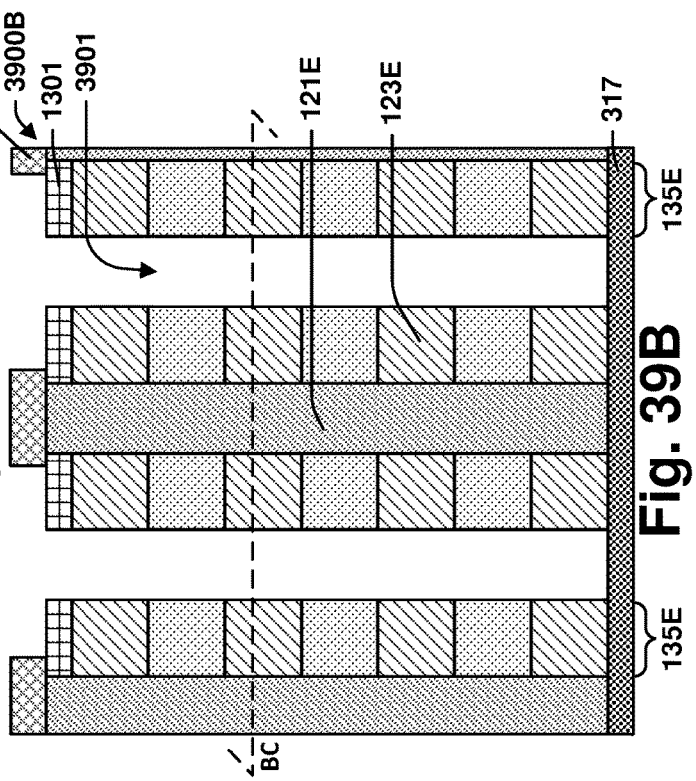

As shown by the top view 3900A of FIG. 39A and the cross-sectional view 3900B of FIG. 39B, a mask 3903 may be formed and used to etch openings 3901 in the intercell dielectric 3801. The remaining intercell dielectric 3801 forms intercell dielectric plugs 121E. The openings 3901 correspond to desired locations for memory cells 101E, one to be formed on each of two facing sides of each of the openings 3901.

Figure 40A:
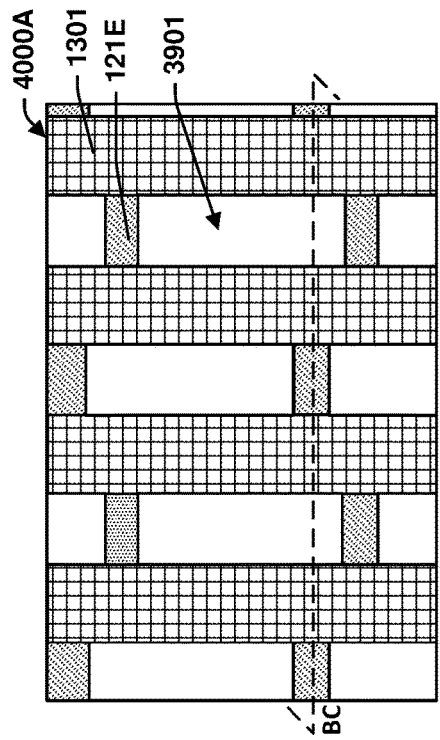
Figure 40B:
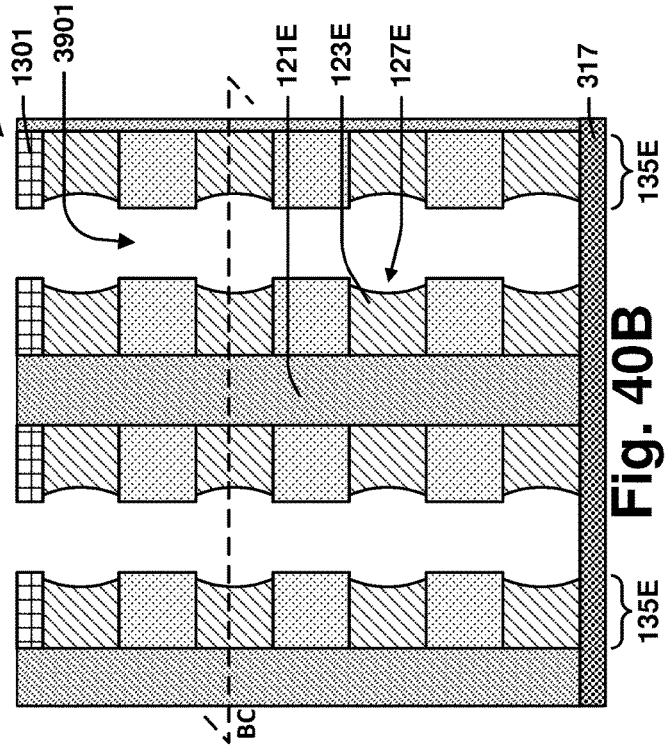

As shown by the top view 4000A of FIG. 40A and the cross-sectional view 4000B of FIG. 40B, etching may take place within the openings 3901 to form recesses 127E in the conductive strips 123E. The recesses 127E are bounded by the intercell dielectric plugs 121E, whereby one recess 127E is formed for each desired location for a memory cells 101E. Processing may continue as shown by FIGS. 15A-15B through FIGS. 18A and 18B and further as shown by FIGS. 21A-21B through FIGS. 22A and 22B or any variant thereof described herein.

Figure 41A:
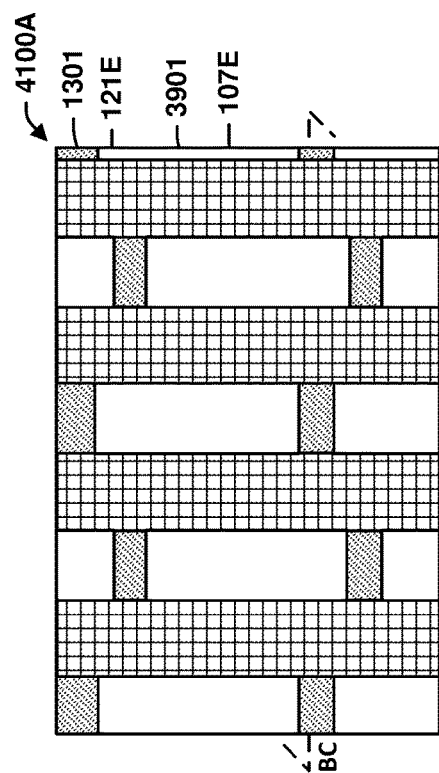
Figure 41B:
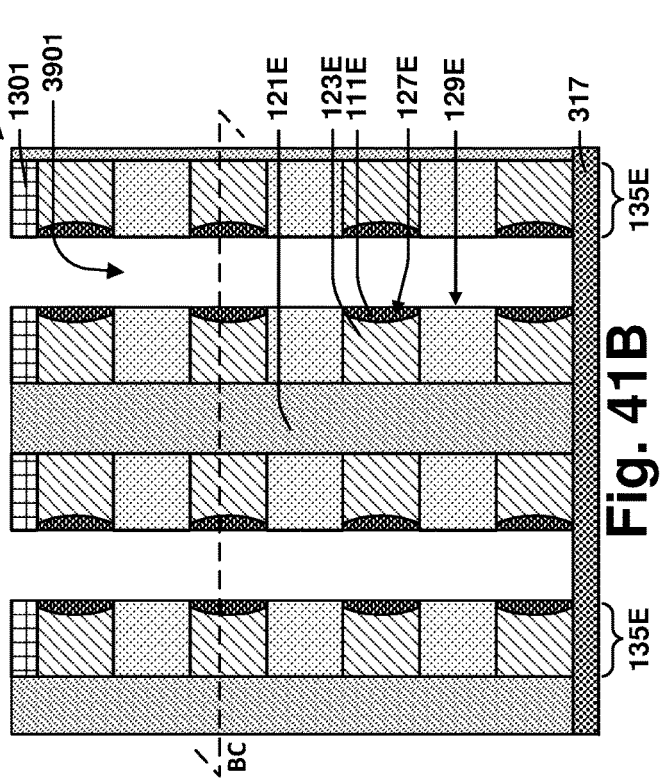

As shown by the top view 4100A of FIG. 41A and the cross-sectional view 4100B of FIG. 41B, a data storage film 111E may be deposited in the openings 3901 and then subject to anisotropic etching. Etching removes the data storage film 111E from dielectric sidewalls 129E. The remaining data storage film 111E is contained within and may fill the recesses 127E. The data storage films 111E are discontinuous both vertically and horizontally within the illustrated structure.

Figure 42A:
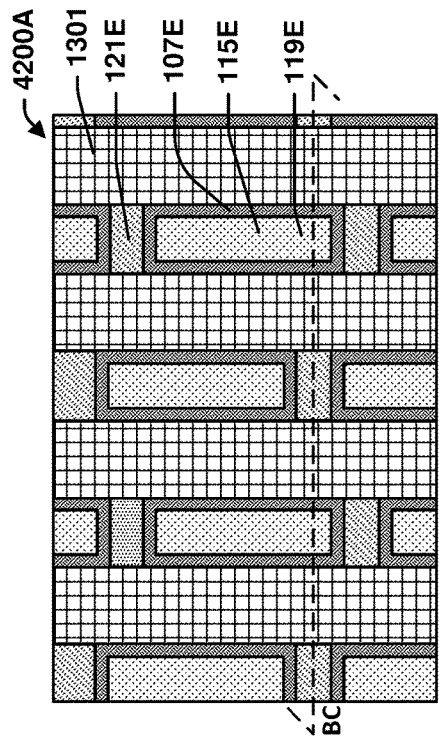
Figure 42B:
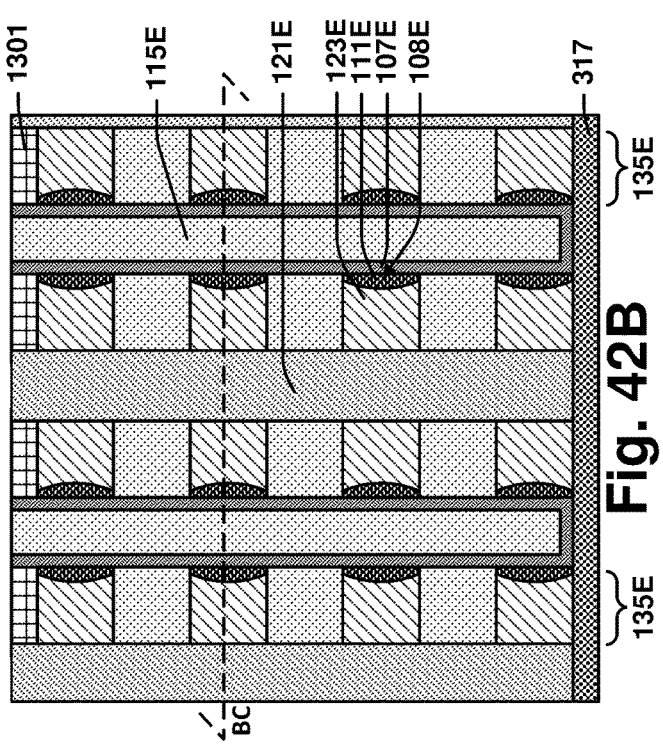

As shown by the top view 4200A of FIG. 42A and the cross-sectional view 4200B of FIG. 42B, the channel layer 107E may be within the openings 3901 and the openings 3901 may then be filled with intracell dielectric 115E. Because the intercell dielectric plugs 121E are formed before the channel layer 107E, the channel layer 107E deposits in sides on the intercell dielectric plugs 121E and encircles the intracell dielectric 115E within each of the openings 3901.

As shown by the top view 4300A of FIG. 43A and the cross-sectional view 4300B of FIG. 43B, a mask 4303 with opening 4305 may be formed and used to etch openings 4301 in intracell dielectric 115E. Instead of having rectangular openings 4305 as shown, in some embodiments the mask 4303 has oval openings like the openings 2305 of the mask 2301 illustrated in FIG. 23. The etch process may be selective to remove the material intracell dielectric 115E without removing the material of the channel layer 107E.

As shown by the top view 4400A of FIG. 44A and the cross-sectional view 4400B of FIG. 44B, the openings 4301 may be filled with conductive material to form the source lines 103E and the bit lines 119E. A CMP process may remove excess conductive material and the mask 1301, the mask 4303. The resulting structure may be the same as the one shown in FIGS. 8A and 8B.

Figure 45:
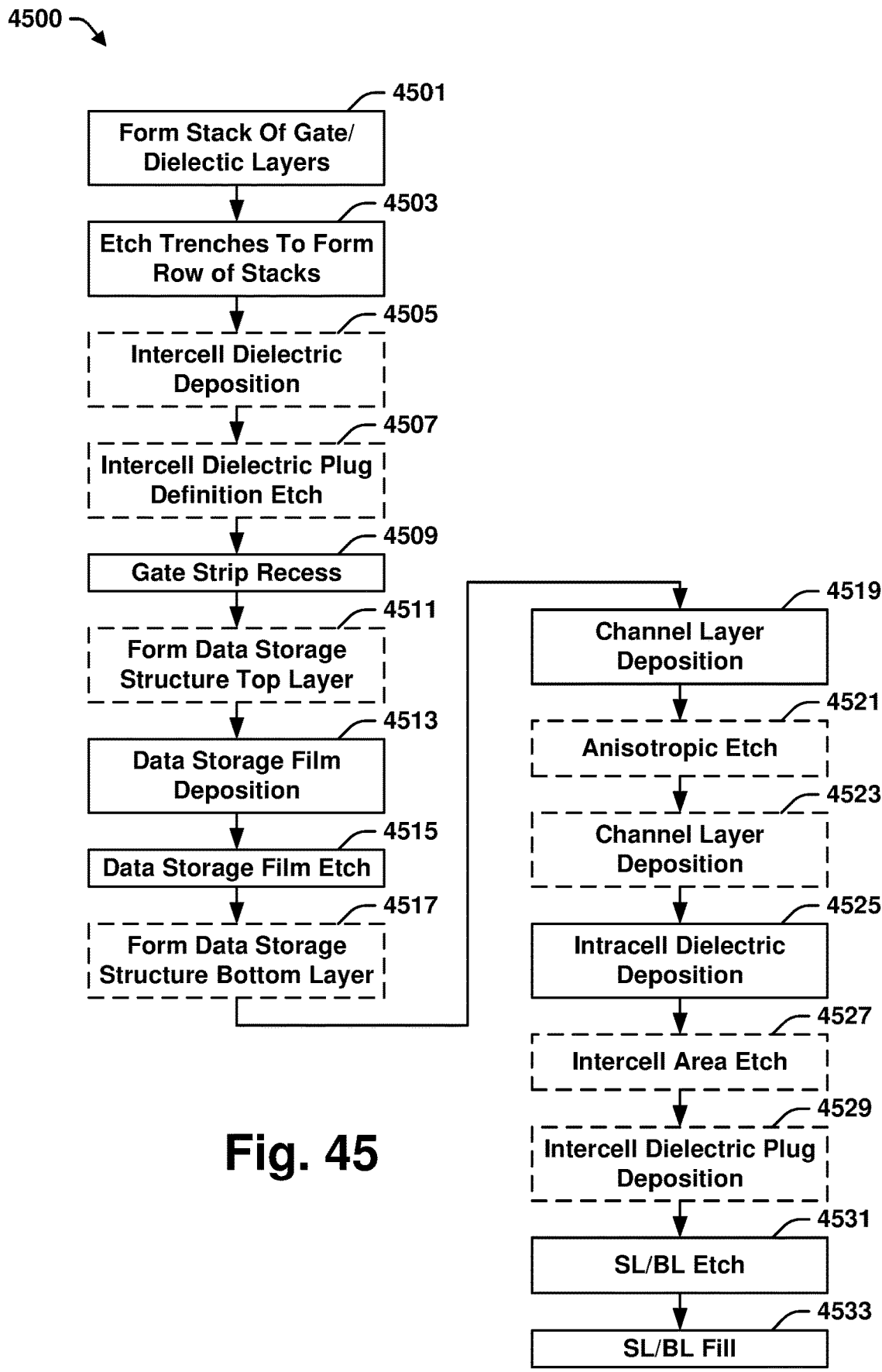
FIGS. 45-48 provide flow charts illustrating various method according to the present teachings that may be used to form 3D memory arrays.

FIG. 45 presents a flow chart for a method 4500 which may be used to form a 3D memory array according to the present disclosure. The method 4500 begins with act 4501, forming a broad stack of alternating gate layers and dielectric layers as shown by the cross-sectional view 1200B of FIG. 12B.

Act 4503 is etching trenches in the broad stack to form a row of narrow stacks of alternating conductive strips and dielectric strips as shown by the cross-sectional view 1300B of FIG. 13B.

Acts 4505 and 4507 are optional. Act 4505 is filling the trenches between the narrow stack with intercell dielectric as shown by the cross-sectional view 3800B of FIG. 38B. Act 4507 is patterning the intercell dielectric to form intercell dielectric plugs as shown by the cross-sectional view 3900B of FIG. 39B.

Act 4509 is etching the conductive strips to form recesses in the narrow stacks. The cross-sectional view 1400B of FIG. 14B, the cross-sectional view 3200 of FIG. 32, and the cross-sectional view 4000B of FIG. 40B provide various examples.

Act 4511 is an optional step of forming a top layer of a data storage structure. "Top" is used with reference to the ordering of layers seen in a horizontal memory cell. In particular, the top layer is one or more layers formed between the data storage film and the control gate. The dielectric layer 173 shown in FIG. 11A is an example.

Figure 33:
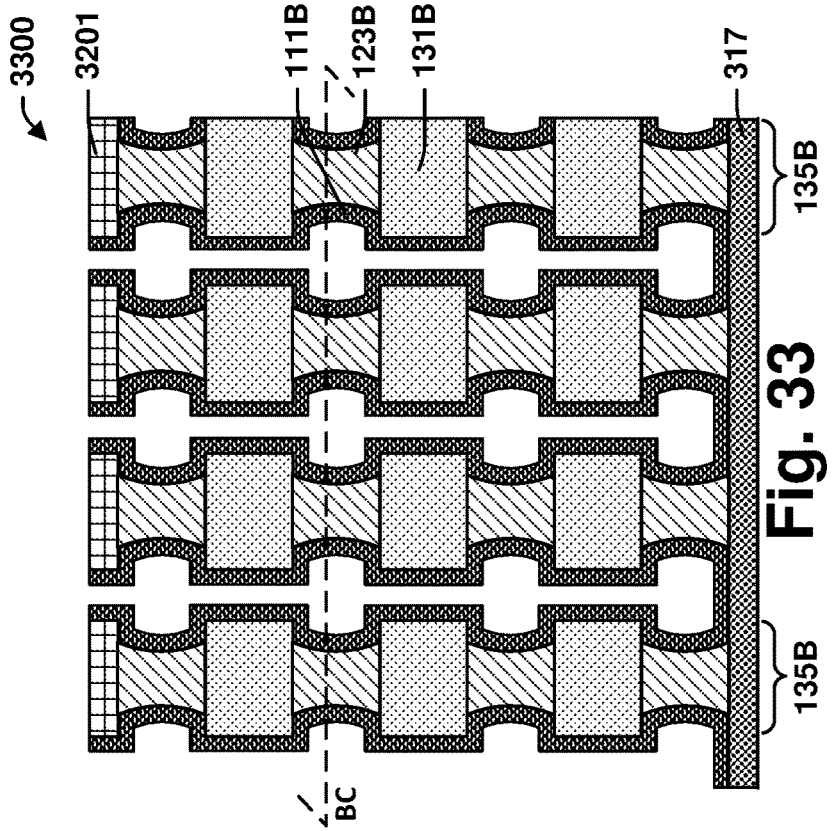

Act 4513 is depositing a data storage film. The cross-sectional view 1500B of FIG. 15B and the cross-sectional view 3300 of FIG. 33 provide examples.

Act 4515 is etching that remove the data storage film from dielectric sidewalls. The cross-sectional view 1600B of FIG. 16B, the cross-sectional view 3400 of FIG. 34, and the cross-sectional view 4100B of FIG. 41B provide various examples. The etching may include a directional or anisotropic etch that removes the data storage film from areas outside the recesses. The etching may also include an isotropic etch that cause the data storage film to be indented within the recesses as shown by the cross-sectional view 3400 of FIG. 34.

Act 4517 is an optional step of forming a bottom layer of the data storage structure. "Bottom" is used with reference to the ordering of layers seen in a horizontal memory cell. In particular, the bottom layer is one or more layers formed between the data storage film and the channel. The dielectric layer 171 shown in FIG. 11A is an example.

Act 4519 is depositing a channel layer. The cross-sectional view 1700B of FIG. 17B, the cross-sectional view 3500 of FIG. 35, and the cross-sectional view 4200B of FIG. 42B provide various examples.

Act 4521 is an optional step of anisotropic etching to remove a portion of the channel layer that is outside the recess. The cross-sectional view 3600 of FIG. 36 provides an example.

Act 4523 is an optional step of depositing another layer of the channel material. The cross-sectional view 3600 of FIG. 36 provides an example. This step may be used when act 4521 leaves the channel layer too thin. The channel layer 107C shown by the cross-sectional view in FIG. 6A provides an example of the channel structure produced after this step.

Act 4535 is depositing the intracell dielectric. The cross-sectional view 1800B of FIG. 18B, the cross-sectional view 3500 of FIG. 35 and the cross-sectional view 4200B of FIG. 42B provide examples.

Acts 4527 and 4529 are optional acts that may be used when the optional acts 4505 and 4507 are not used. Act 4527 is etching to remove the intracell dielectric from desired locations for intercell dielectric plugs. The cross-sectional view 1900B of FIG. 19B provides an example. Act 4529 is backfilling the resulting openings to form the intercell dielectric plugs. The cross-sectional view 2000B of FIG. 20B provides an example.

Act 4531 is etching to form openings for vertical connectors such as source lines and bit lines. This etch may be aligned in part by the intercell dielectric plugs. The top view 2100A of FIG. 21A, the top view 2300 of FIG. 23, and the top view 4300A of FIG. 43A provide various examples.

Act 4532 is filling the openings to provide vertical conductive structures such as source lines and bit lines. The top view 2200A of FIG. 22A, the top view 2400 of FIG. 24, and the top view 4400A of FIG. 44A provide various examples.

Figure 46:
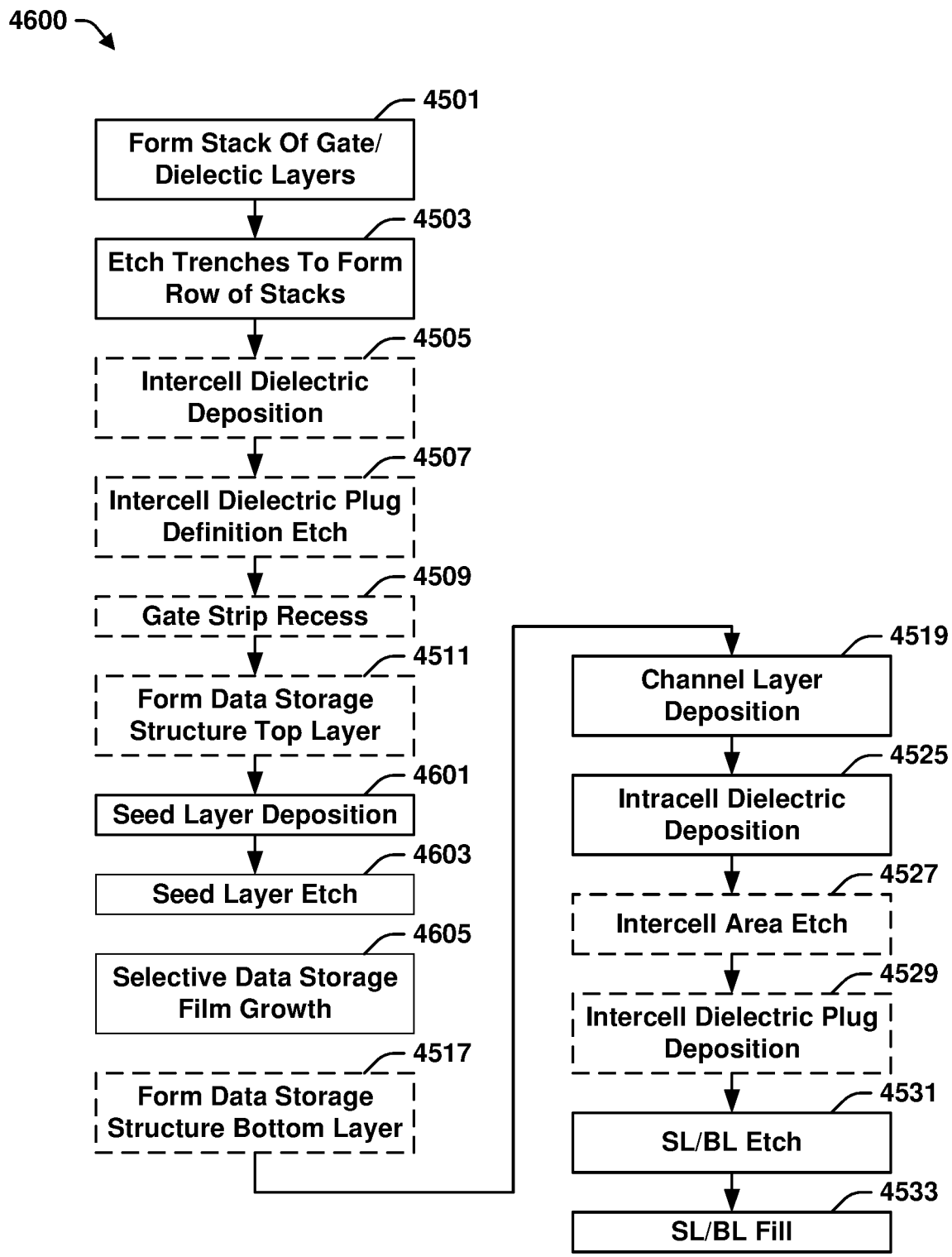

FIG. 46 presents a flow chart for a method 4600, which is another method that may be used to form a 3D memory array according to the present disclosure. The method 4600 include many of the same acts as the method 4500, but has differences as described below.

In the method 4600, the conductive strip recess of act 4509 is optional. When act 4509 is included, the method 4600 may use the optional acts 4601 and 4603. Act 4601 is depositing a seed layer. Act 4603 is etching to remove the seed layer from the dielectric sidewalls. Except for the difference in material, these acts are like act 4513, the data storage film deposition, and act 4515, the data storage film etch.

The method 4600 include act 4605, selective growth of a data storage film on the gate sidewalls. The cross-sectional view 3700B of FIG. 37B provides an example. If the optional acts 4527 and 4529 are used, completion of the method 4600 will produce a structure as exemplified by the fourth 3D memory array 100D of FIGS. 7A-7B. If the optional acts 4505 and 4507 are used instead, completion of the method 4600 will produce a structure as exemplified by the sixth 3D memory array 100F of FIGS. 9A-9B.

Figure 47:
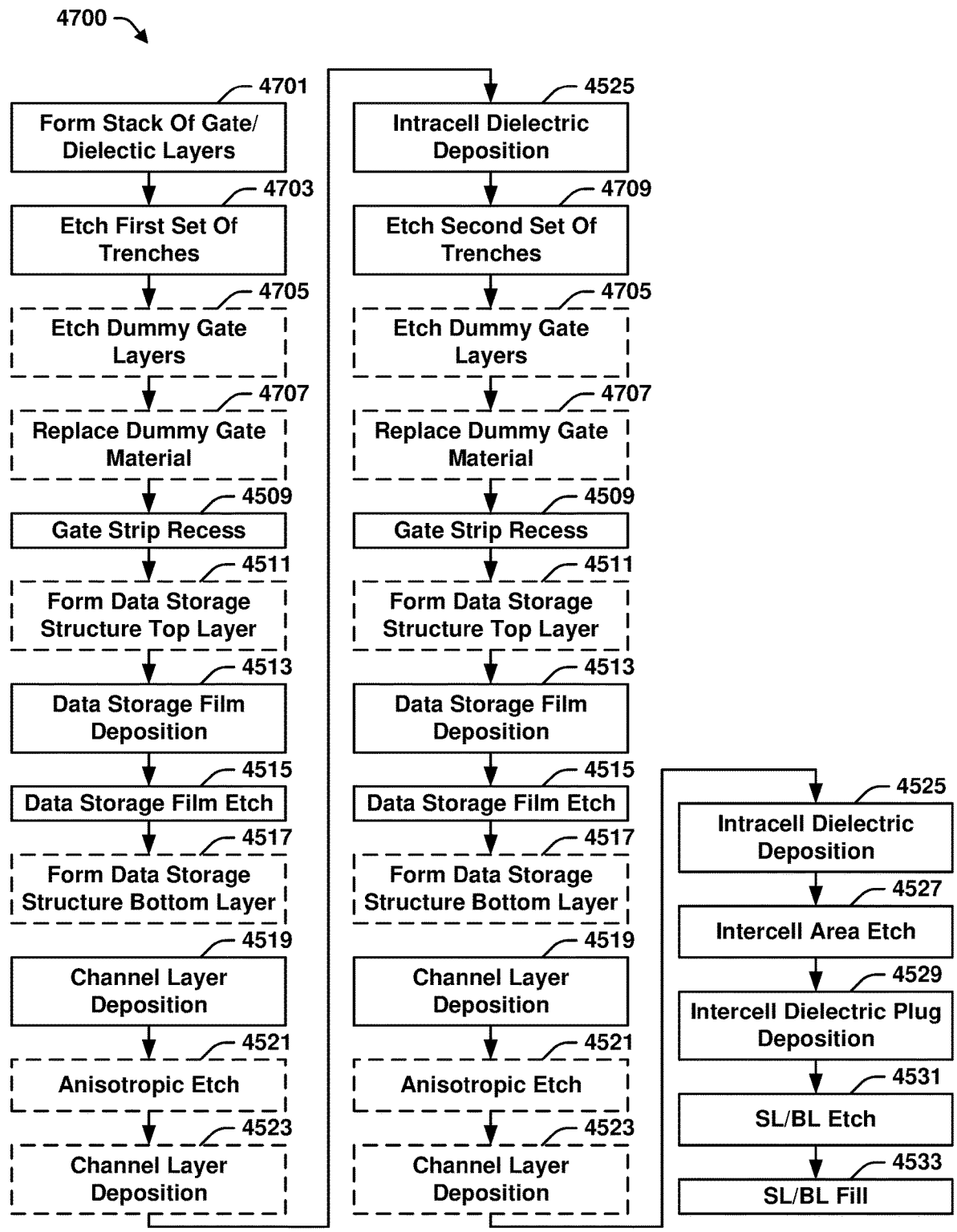

FIG. 47 presents a flow chart for a method 4700, which is another method that may be used to form a 3D memory array according to the present disclosure. The method 4700 include many of the same acts as the method 4500, but uses the type of processing illustrated by FIGS. 25-31.

The method 4700 includes act 4701, forming a broad stack of alternating gate layers and dielectric layers. This may be the same as act 4501 except that the gate layers may be dummy gate layers. The cross-sectional view 1200B of FIG. 12B provides an example.

Act 4703 is forming a first set of trenches. The cross-sectional view 2500 of FIG. 25 provides an example. These trenches are half or less in number compared to the trenches formed by act 4503 for which the cross-sectional view 1300B of FIG. 13B provides an example.

Acts 4705 and 4707 are optional steps that are used when the gate layer is a dummy layer. Act 4705 is etching away a first portion of the dummy layer. The cross-sectional view 2600 of FIG. 26 provides an example. Act 4707 is replacing the first portion of the dummy layer with conductive material. The cross-sectional view 2700 of FIG. 27 provides an example.

The method 4700 continues with act 4509 through act 4525 which may be the same as in the method 4500 except that they operate within only the first set of trenches. The cross-sectional view 2800 of FIG. 28 provides an example.

Figure 30:
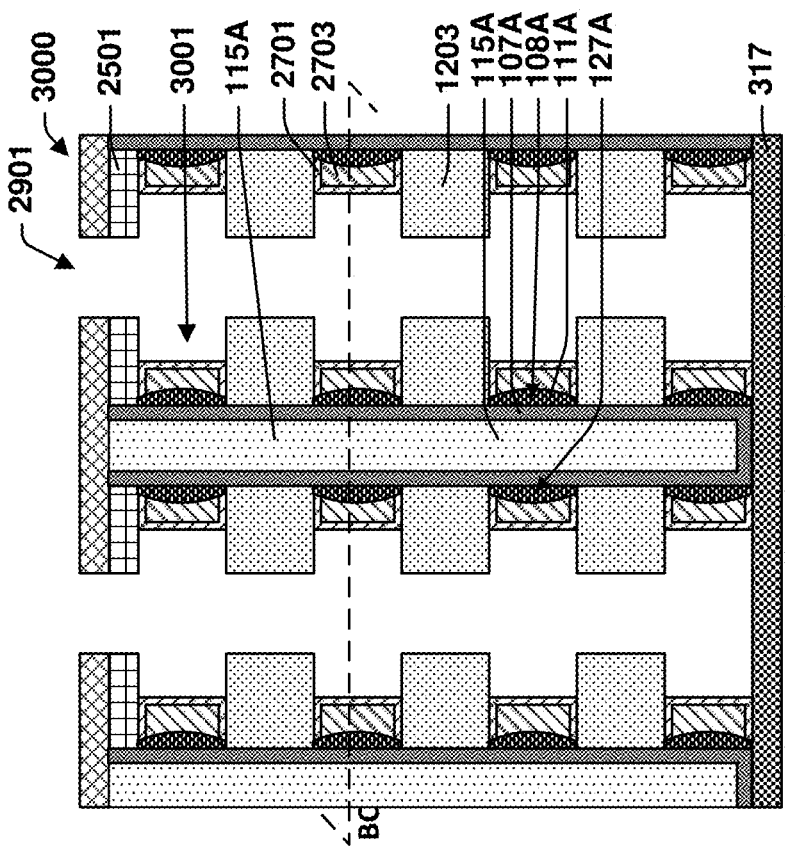

Act 4709 is forming a mask that covers the first set of trenches and etching to form a second set of trenches. The cross-sectional view 2900 of FIG. 29 provides an example. If the gate layer is a dummy gate layer, the method may continue with a repetition of act 4705 and act 4707 to complete the gate replacement process. The cross-sectional view 3000 of FIG. 30 provides an example.

The method 4700 continues with a repetition of act 4509 through act 4525. The cross-sectional view 3100 of FIG. 31 provides an example. Processing may continue with act 4527 through act 4533 as described in connection with the method 4500.

Figure 48:
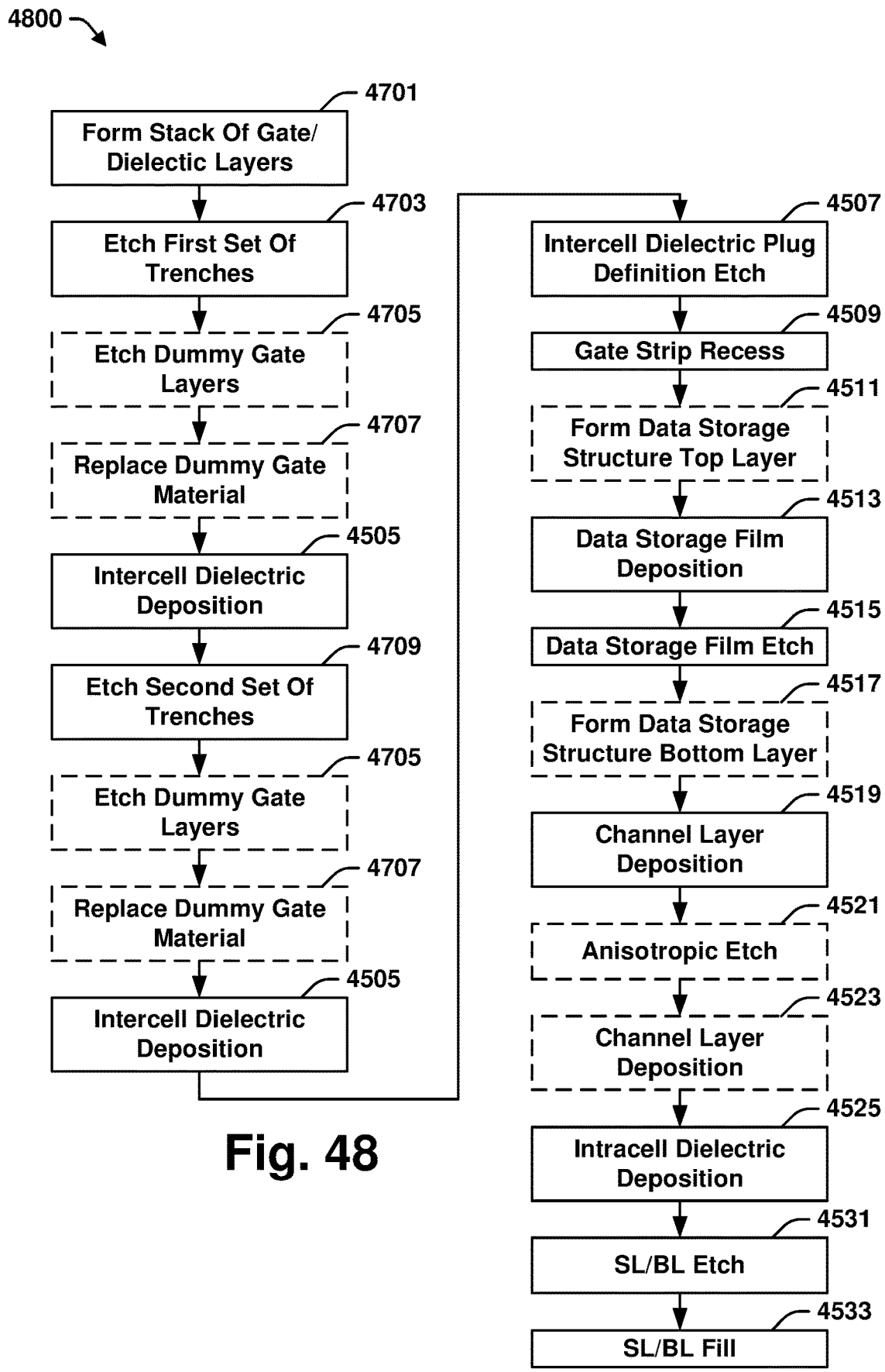

FIG. 48 presents a flow chart for a method 4800, which is another method that may be used to form a 3D memory array according to the present disclosure. Whereas the method 4700 uses act 4527 and act 4529 to form the intercell dielectric plugs after the channel layers are deposited, the method 4800 uses act 4505 and act 4507 to form the intercell dielectric plugs before the conductive strip recess. This allows narrow, free-standing stacks to be avoided while repeating fewer steps.

In the method 4800, act 4505 is used to fill the first set of trenches with intercell dielectric. This may take place immediately after the optional dummy gate replacement. The method 4800 may then proceed directly to 4709, forming the second set of trenches and completing the dummy gate replacement if dummy gate layers are used. The method 4800 may continue with act 4505 through act 4533 to complete the formation of a 3D memory array according to the present teachings.

While the methods 4500, 4600, 4700, and 4800 of FIGS. 45-48 are illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

Some aspects of the present teachings relate to a memory device having a plurality of stacks. Each stack has conductive strips and dielectric strips in alternating layers. The conductive strips each have a gate sidewalls. The dielectric strips each have dielectric sidewalls. The gate sidewalls are indented inward from the dielectric sidewalls to form recesses in the stacks. A data storage film disposed in the recesses. Source and bit lines extend along a stacking direction of the conductive strips and the dielectric strips. A channel layer is located between the data storage film and the source and bit lines.

Some aspects of the present teachings relate to a memory device that includes a three-dimensional array of memory cells disposed between two adjacent metal interconnect layers in a metal interconnect structure. Each of the memory cells has a source side, a drain side, a channel extending between the source side and the drain side, a control gate, and a data storage film between the control gate and the channel. Gate strips extend horizontally to connect a plurality of the control gates. The conductive strips are disposed in an array of stacks, each stack having a plurality of vertically stacked conductive strips separated by dielectric strips. Bit lines and source line extend vertically between the stacks. Each of the bit lines connects with a plurality of the drain sides. Each of the source lines connecting with a plurality of the source sides. The three-dimensional array of memory cells has a vertically repeating arrangement of memory cells, whereby some of the memory cells are vertically adjacent to other memory cells. The data storage films of the vertically adjacent memory cells are discontinuous.

Some aspects of the present teachings relate to a method of forming a memory device that includes depositing alternating gate layers and dielectric layers to form a primary stack, etching trenches in the primary stack to form a row of narrow stacks, selectively etching the gate layers to create recesses in the narrow stacks, depositing a data storage film so that a first portion of the data storage film deposits within the recesses in the narrow stacks, depositing a channel layer over the data storage film, filling the trenches with an intracell dielectric, etching opening through the intracell dielectric, and filling the openings with conductive material to form source lines and bit lines.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a memory device, the method comprising:
    forming a row of stacks, each stack comprising conductive strips separated by dielectric strips;
    selectively etching the conductive strips via trenches between the stacks to create recesses in the stacks;
    depositing a data storage film so that a first portion of the data storage film deposits within the recesses in the stacks;
    depositing a channel layer after the data storage film, wherein the channel layer deposits over the data storage film;
    filling the trenches with a second dielectric;
    etching opening through the second dielectric; and
    filling the openings with conductive material to form source lines and bit lines.

2. The method of claim 1, further comprising etching to remove a second portion of the data storage film that deposits in the trenches outside the recesses.

3. The method of claim 1, further comprising forming intercell dielectric plugs in the trenches before creating the recesses in the stacks.

4. The method of claim 1, further comprising etching to remove a portion of the channel layer that deposits in the trenches outside the recesses.

5. The method of claim 1, wherein depositing the channel layer comprises:
    depositing a first layer of channel material;
    etching to remove channel material that deposits in the trenches outside the recesses; and
    depositing a second layer of channel material.

6. A method of forming a memory device, the method comprising:
    forming a stack having a plurality of dielectric material layers interleaved with second material layers;
    etching a plurality of first trenches in the stack;
    forming a plurality of data storage structures in the first trenches, wherein the data storage structures are at levels of the stack corresponding to the second material layers and are separated between adjacent second material layers;
    depositing a layer of semiconductor material in the first trenches after forming the plurality of data storage structures; and
    forming vertical source lines and bit lines within the first trenches.

7. The method of claim 6, wherein forming the plurality of data storage structures comprises:
    etching to create recesses in sidewalls of the first trenches, wherein the recesses have heights corresponding to the second material layers;
    depositing a data storage film in the first trenches; and etching to separate the data storage film between adjacent second material layers.

8. The method of claim 6, wherein forming the plurality of data storage structures comprises:
    etching to create recesses in sidewalls of the first trenches, wherein the recesses have heights corresponding to the second material layers;
    depositing a data storage film in the first trenches; and
    etching to separate the data storage film between adjacent second material layers.

9. The method of claim 6, wherein forming the plurality of data storage structures comprises growing a data storage film by a selective growth process, whereby the data storage film grows from the second material layers but does not grow from the dielectric material layers.

10. The method of claim 6, further comprising:
    etching through the first trenches to remove first portions of the second material layers and create first voids;
    filling the first voids with conductive material;
    etching a plurality of second trenches in the stack;
    etching through the second trenches to remove remaining portions of the second material layers and create second voids; and
    filling the second voids with the conductive material.

11. The method of claim 6, wherein the second material layers comprise metal.

12. The method of claim 6, further comprising forming periodically spaced conductive plugs in the first trenches prior to forming the plurality of data storage structures.

13. The method of claim 6, further comprising forming periodically spaced conductive plugs in the first trenches after forming the plurality of data storage structures.

14. The method of claim 6, wherein forming vertical source lines and bit lines comprises:
    filling the trenches with a first dielectric;
    etching first holes in the first dielectric;
    filling the first holes with a second dielectric;
    forming a mask having openings;
    etching second holes in one of the first dielectric and the second dielectric through the openings; and
    filling the second holes with conductive material.

15. The method of claim 14, wherein etching the second holes comprises an etch process that is selective between the first dielectric and the second dielectric.

16. The method of claim 15, wherein two of the second holes are formed through one of the openings by the etch process that is selective.

17. A method of forming a memory device, the method comprising:
    forming a stack having dielectric layers interleaved with conductive layers;
    etching trenches in the stack;
    using a selective etch process to create recesses in sidewalls of the trenches corresponding to the conductive layers;
    depositing a data storage film so that a first portion of the data storage film deposits within the recesses;
    after depositing the data storage film, depositing a first semiconductor layer so as to line the trenches; and
    forming vertical source lines and bit lines within the trenches.

18. The method of claim 17, further comprising dry etching that removes the data storage film from sidewalls of the dielectric layers.

19. The method of claim 18, further comprising:
    dry etching that removes the first semiconductor layer from sidewalls of the dielectric layers; and
    depositing a second semiconductor layer so as to line the trenches.

20. The method of claim 17, further comprising:
    etching to create a staircase pattern on a side of the stack; and
    forming vias that land on the conductive layers in the staircase pattern.

* * * * *